(12) United States Patent
Okutani et al.

(10) Patent No.: US 10,249,487 B2
(45) Date of Patent: Apr. 2, 2019

(54) SUBSTRATE PROCESSING METHOD

(71) Applicant: SCREEN Holdings Co., Ltd., Kyoto (JP)

(72) Inventors: Manabu Okutani, Kyoto (JP); Kenji Kobayashi, Kyoto (JP); Naohiko Yoshihara, Kyoto (JP)

(73) Assignee: SCREEN Holdings Co., Ltd. (JP)

( * ) Notice: Subject to any disclaimer, the term of this patent is extended or adjusted under 35 U.S.C. 154(b) by 0 days.

(21) Appl. No.: 15/004,361

(22) Filed: Jan. 22, 2016

(65) Prior Publication Data
US 2016/0214148 A1    Jul. 28, 2016

(30) Foreign Application Priority Data

Jan. 23, 2015 (JP) ................................ 2015-011710
Feb. 27, 2015 (JP) ................................ 2015-039025

(51) Int. Cl.
*B08B 7/04* (2006.01)
*B08B 7/00* (2006.01)
(Continued)

(52) U.S. Cl.
CPC .... *H01L 21/02057* (2013.01); *H01L 21/6708* (2013.01); *H01L 21/67017* (2013.01);
(Continued)

(58) Field of Classification Search
CPC ......... H01L 21/02057; H01L 21/67017; H01L 21/6708; H01L 21/67051; H01L 21/68721; H01L 21/68742; H01L 21/6875
(Continued)

(56) References Cited

U.S. PATENT DOCUMENTS 6,106,634 A * 8/2000 Ghanayem ............. B08B 17/02
118/719
2006/0081269 A1* 4/2006 Kim ....................... B08B 3/024
134/2
(Continued)

FOREIGN PATENT DOCUMENTS

JP      09-038595       2/1997
JP      2001-506061 A   5/2001
(Continued)

*Primary Examiner* — Nadine G Norton
*Assistant Examiner* — Christopher Remavege
(74) *Attorney, Agent, or Firm* — Ostrolenk Faber LLP

(57) ABSTRACT

A substrate processing method includes a substrate holding step of holding a substrate in a horizontal orientation by means of a substrate holding unit, a liquid film forming step of supplying a processing liquid to an upper surface of the substrate held by the substrate holding unit to form a liquid film, an upper surface covering step of discharging, above the substrate held by the substrate holding unit, an inert gas radially and parallel to the upper surface of the substrate from a center toward a peripheral edge of the substrate to form an inert gas stream flowing parallel to the upper surface of the substrate and covering the upper surface of the substrate, and a liquid film removing step of discharging an inert gas toward the upper surface of the substrate to remove the liquid film, formed by the liquid film forming step, from the upper surface of the substrate.

24 Claims, 39 Drawing Sheets

(51) Int. Cl.
*H01L 21/02* (2006.01)
*H01L 21/67* (2006.01)
*H01L 21/687* (2006.01)

(52) U.S. Cl.
CPC .... *H01L 21/67051* (2013.01); *H01L 21/6875* (2013.01); *H01L 21/68721* (2013.01); *H01L 21/68742* (2013.01)

(58) Field of Classification Search
USPC .......... 134/19, 18, 1.2, 1.3; 118/52, 58, 600, 118/719; 156/345.13, 345.24, 45.29
See application file for complete search history.

(56) References Cited

U.S. PATENT DOCUMENTS

| | | | |
|---|---|---|---|
| 2010/0101497 A1* | 4/2010 | Izuta | H01L 21/67028 118/730 |
| 2010/0146813 A1* | 6/2010 | Jeong | H01L 21/02057 34/519 |
| 2012/0045581 A1 | 2/2012 | Kimura et al. | 427/248.1 |
| 2012/0103371 A1* | 5/2012 | Yun | H01L 21/67034 134/26 |
| 2012/0174429 A1 | 7/2012 | Izuta et al. | 34/443 |
| 2012/0187083 A1 | 7/2012 | Hashizume | 216/37 |
| 2013/0161287 A1 | 6/2013 | Ota et al. | 216/95 |
| 2013/0256267 A1 | 10/2013 | Ota et al. | 216/62 |
| 2014/0065295 A1 | 3/2014 | Emoto et al. | 427/8 |
| 2014/0093644 A1 | 4/2014 | Fujii | 427/240 |
| 2014/0127908 A1 | 5/2014 | Okutani | 438/694 |
| 2014/0259728 A1* | 9/2014 | Ishibashi | H01L 21/02074 34/381 |
| 2014/0261566 A1* | 9/2014 | Hayashi | B08B 3/10 134/26 |
| 2014/0283882 A1 | 9/2014 | Kimura et al. | 134/26 |
| 2014/0360536 A1* | 12/2014 | Kawabuchi | H01L 21/6715 134/33 |
| 2015/0020967 A1 | 1/2015 | Ota et al. | 156/345.15 |
| 2015/0179431 A1 | 6/2015 | Kimura et al. | 134/30 |
| 2015/0270146 A1* | 9/2015 | Yoshihara | H01L 21/67028 134/18 |
| 2016/0086864 A1* | 3/2016 | Fischer | H01L 22/26 134/18 |

FOREIGN PATENT DOCUMENTS

| | | |
|---|---|---|
| JP | 2003-031545 A | 1/2003 |
| JP | 2004-119717 A | 4/2004 |
| JP | 2007-329408 A | 12/2007 |
| JP | 2010-238758 * | 3/2009 |
| JP | 2009-111219 A | 5/2009 |
| JP | 2010-109087 A | 5/2010 |
| JP | 2010-238758 | 10/2010 |
| JP | 2011-071438 A | 4/2011 |
| JP | 2013-172080 A | 9/2013 |
| JP | 2013-201334 A | 10/2013 |
| JP | 2013-542607 A | 11/2013 |
| JP | 2014-072439 A | 4/2014 |
| JP | 2014-110404 A | 6/2014 |
| JP | 2014-112652 | 6/2014 |
| JP | 2014-112652 A | 6/2014 |
| JP | 2014-197571 A | 10/2014 |
| KR | 10-2010-0047803 | 5/2010 |
| KR | 10-2014-0143700 | 12/2014 |
| TW | 201214554 A1 | 4/2012 |
| TW | 201338033 A | 9/2013 |
| TW | 201344777 A | 11/2013 |
| WO | WO 99/16109 | 4/1999 |

* cited by examiner

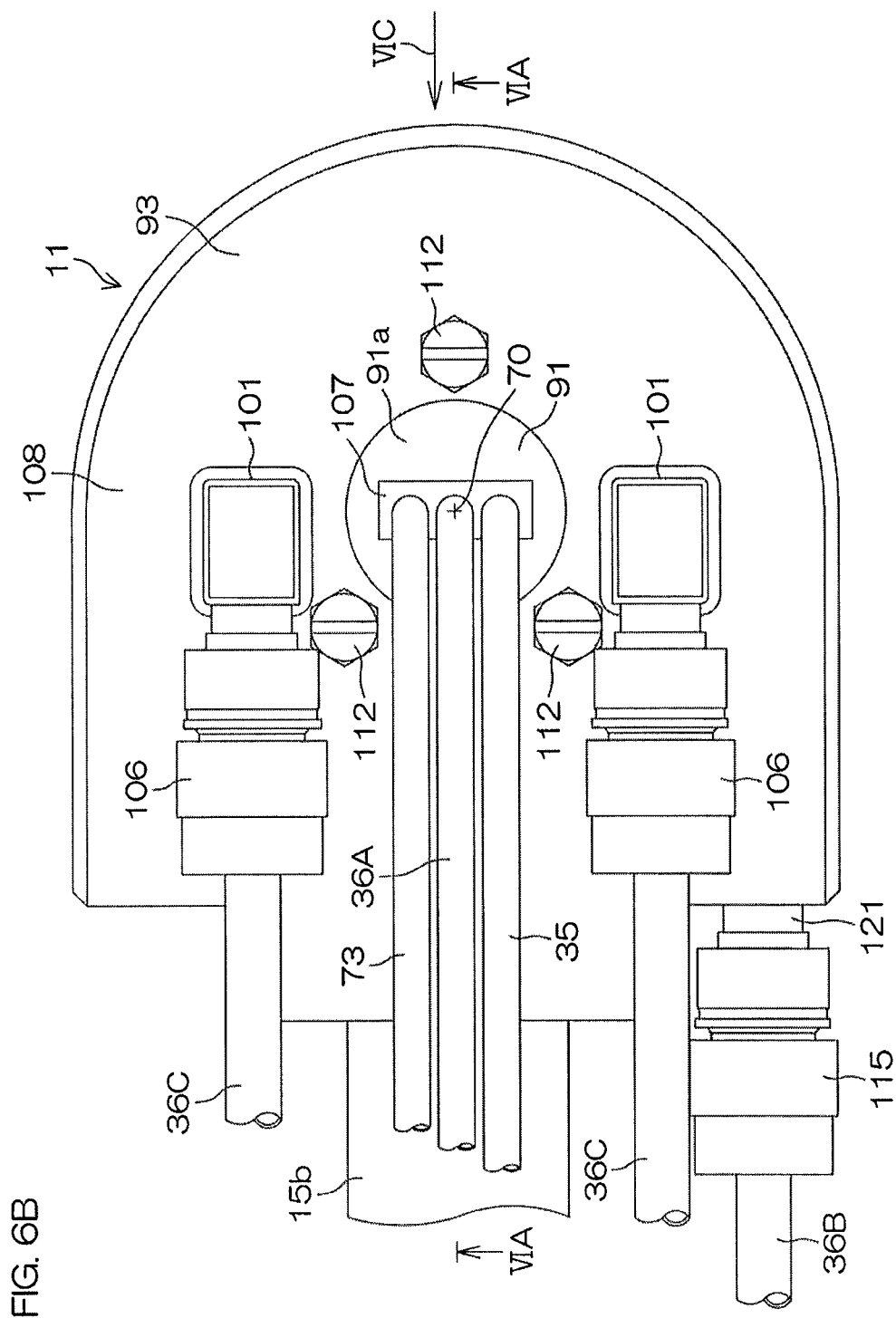

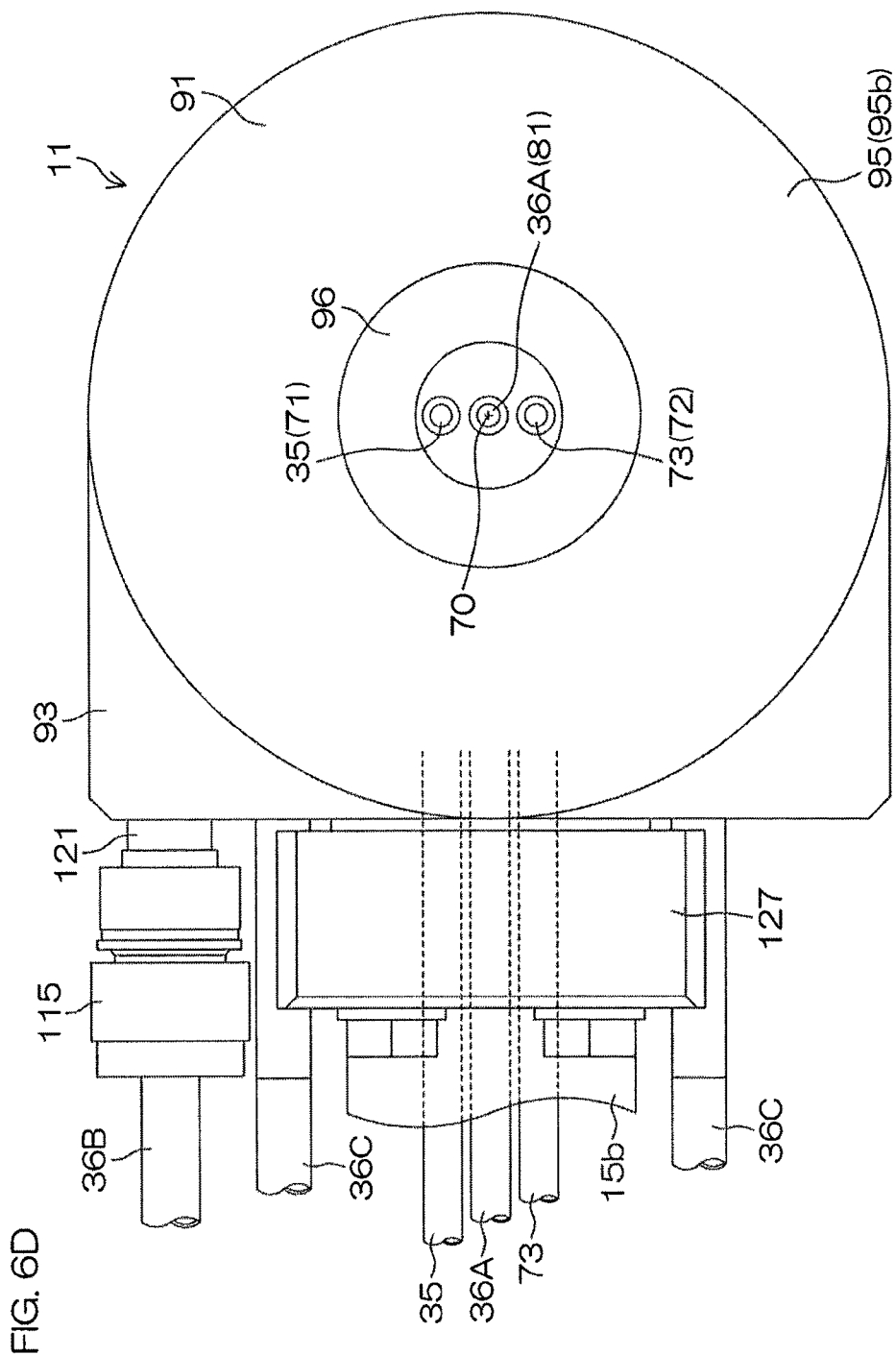

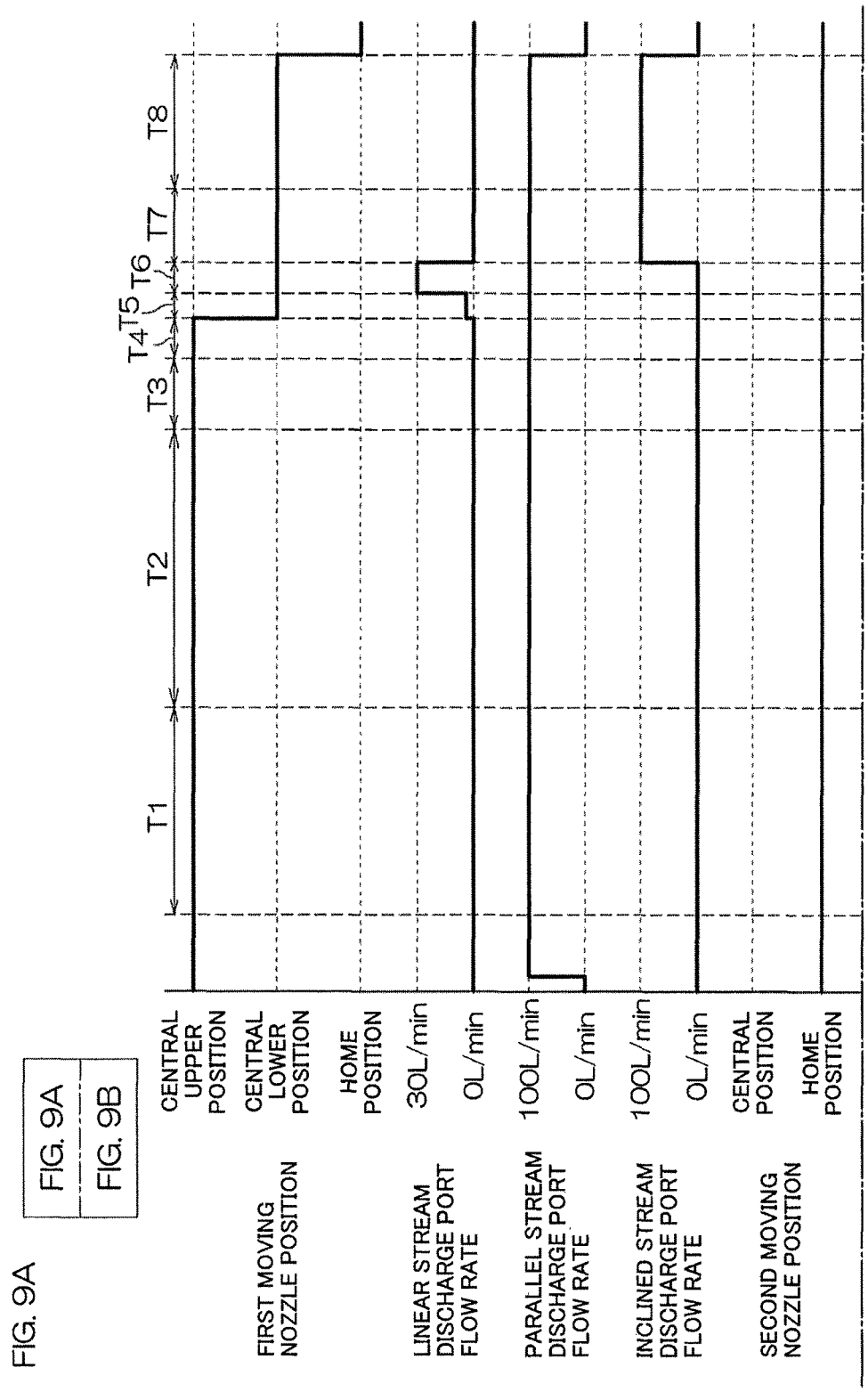

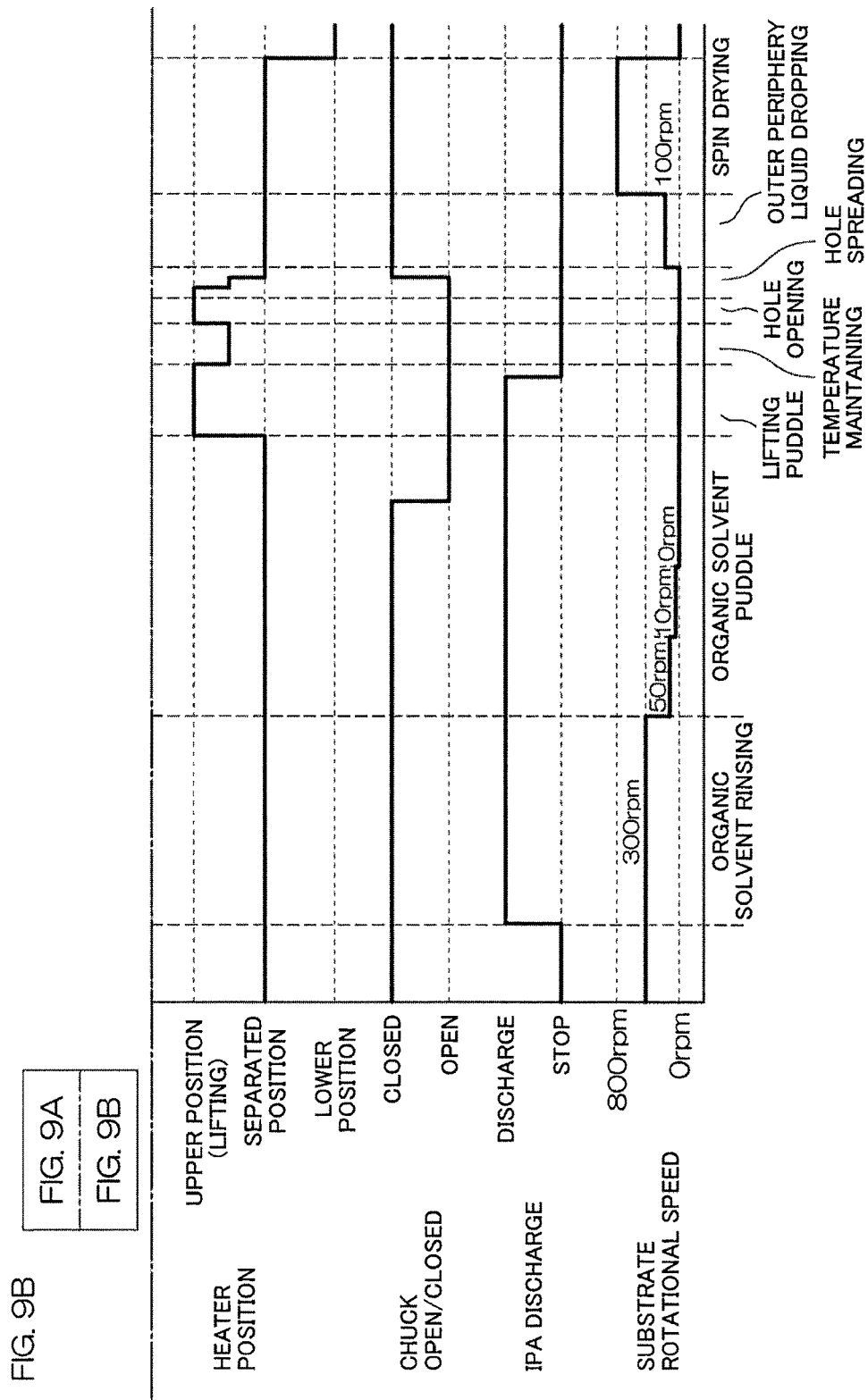

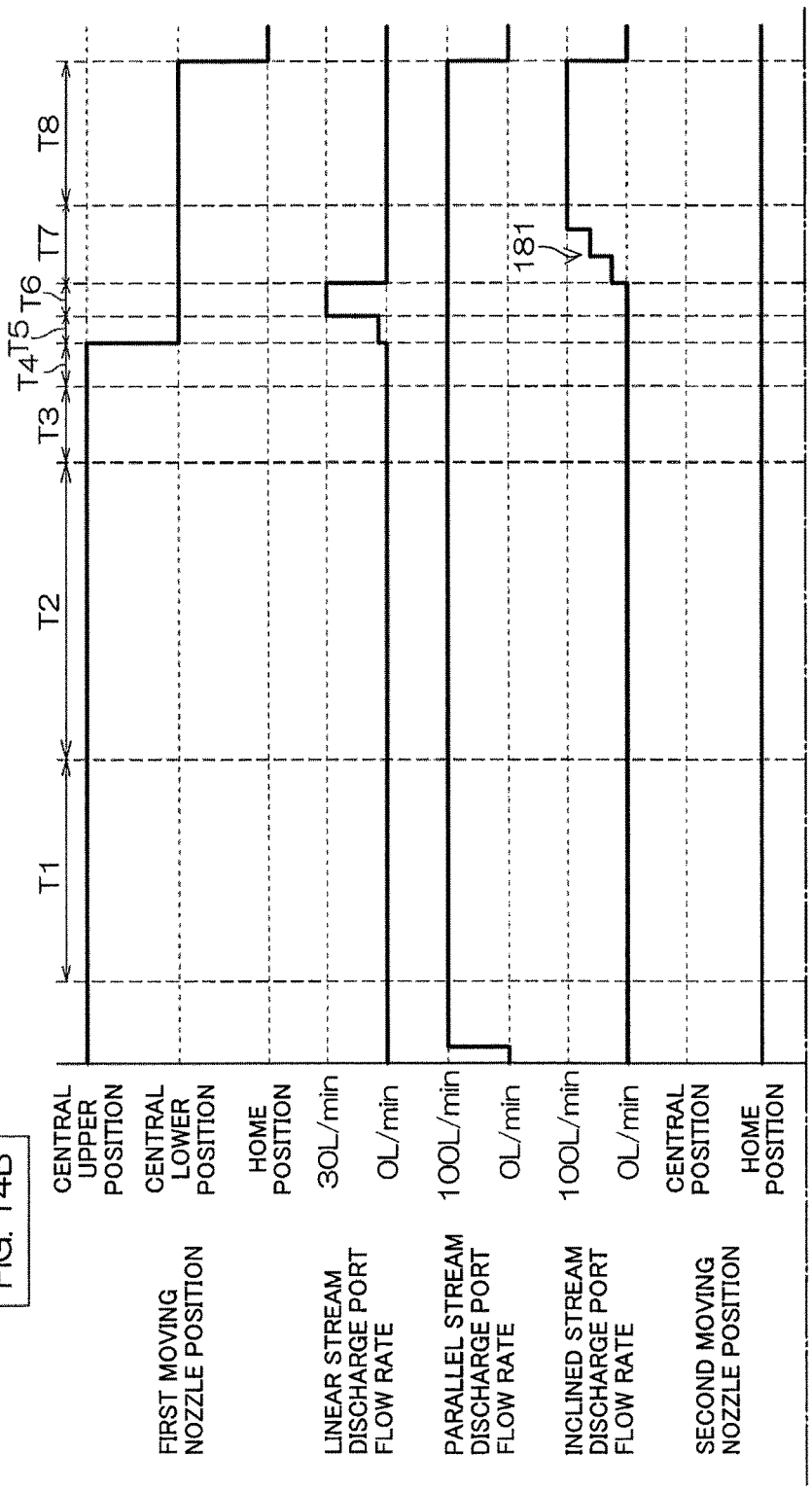

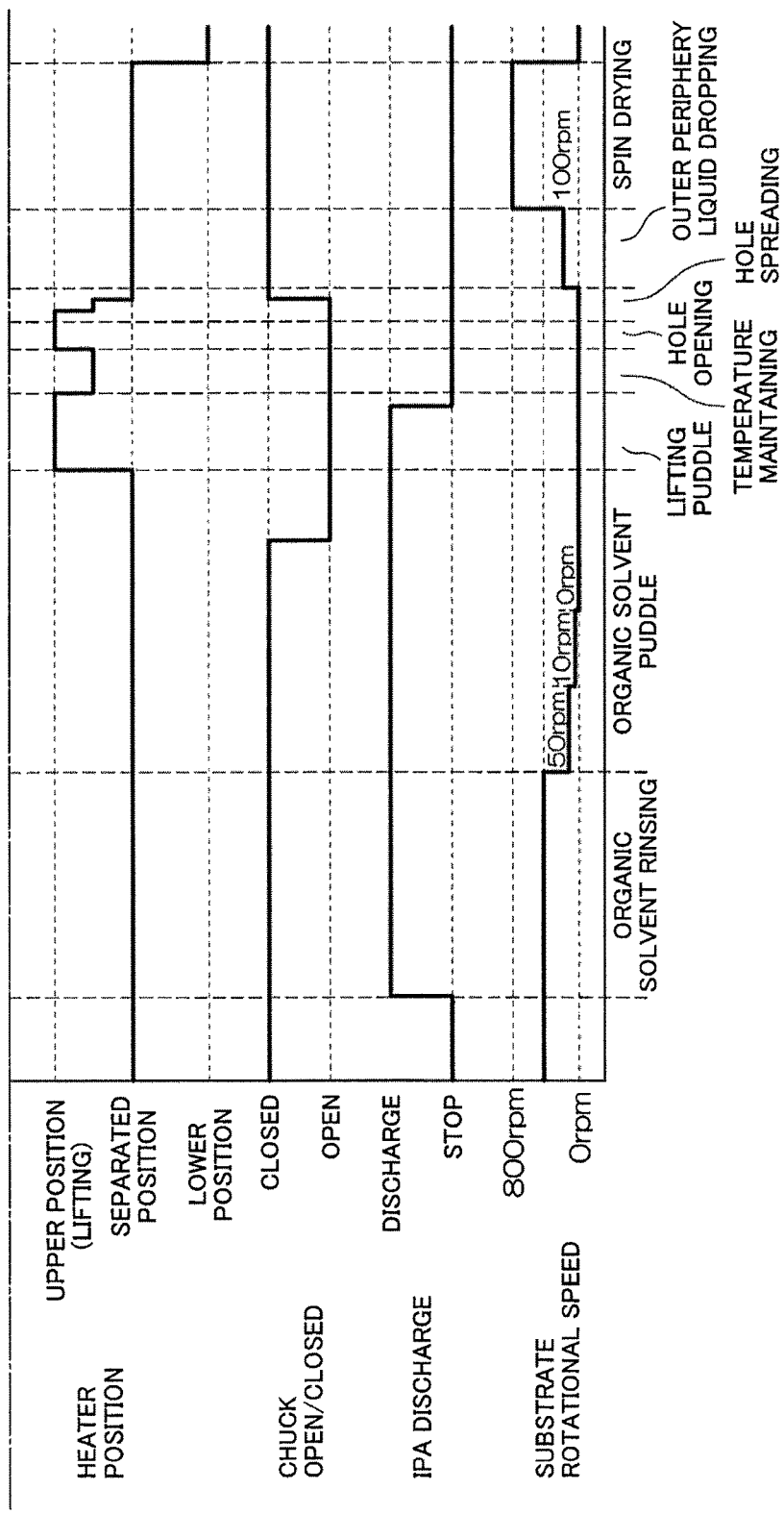

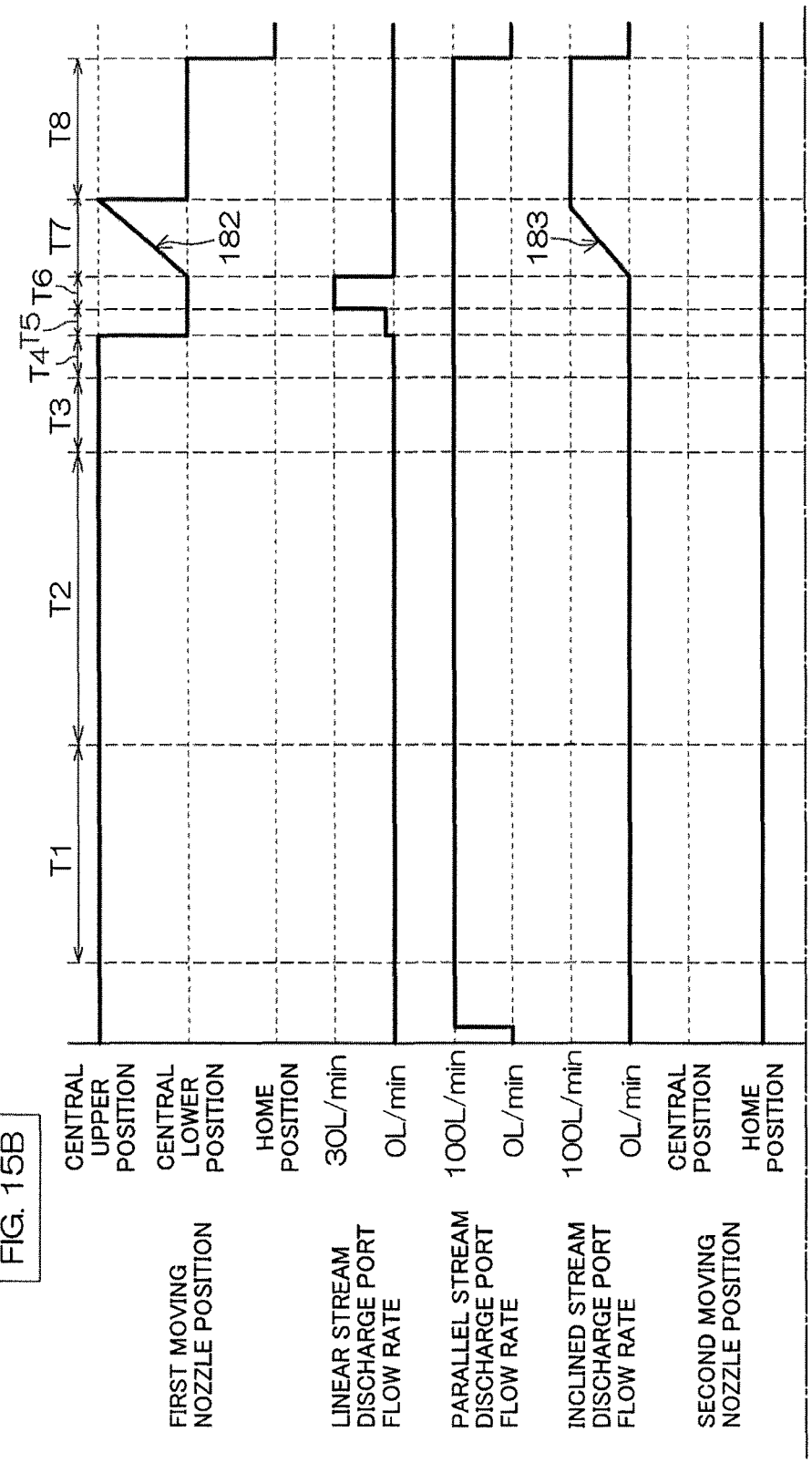

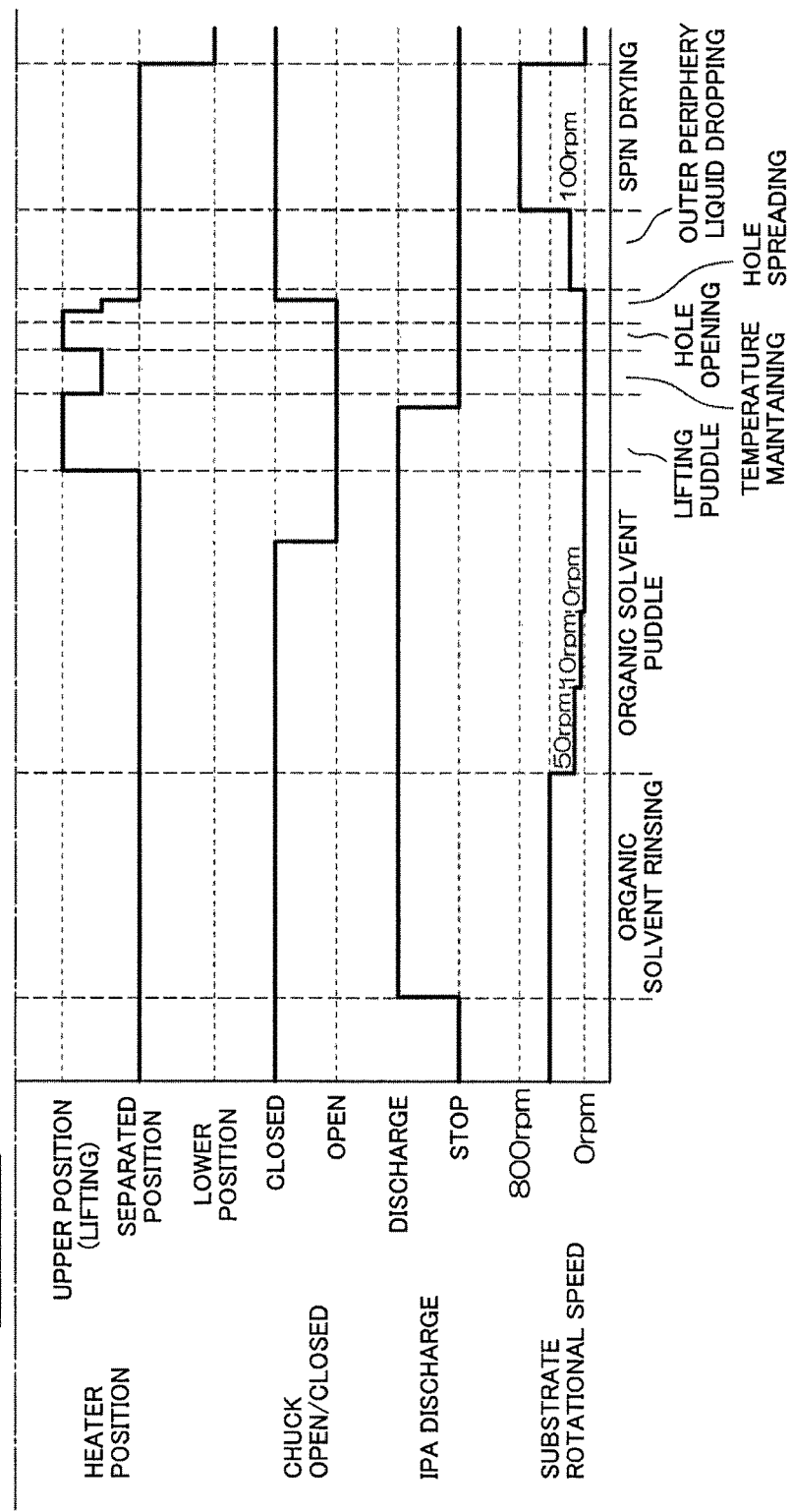

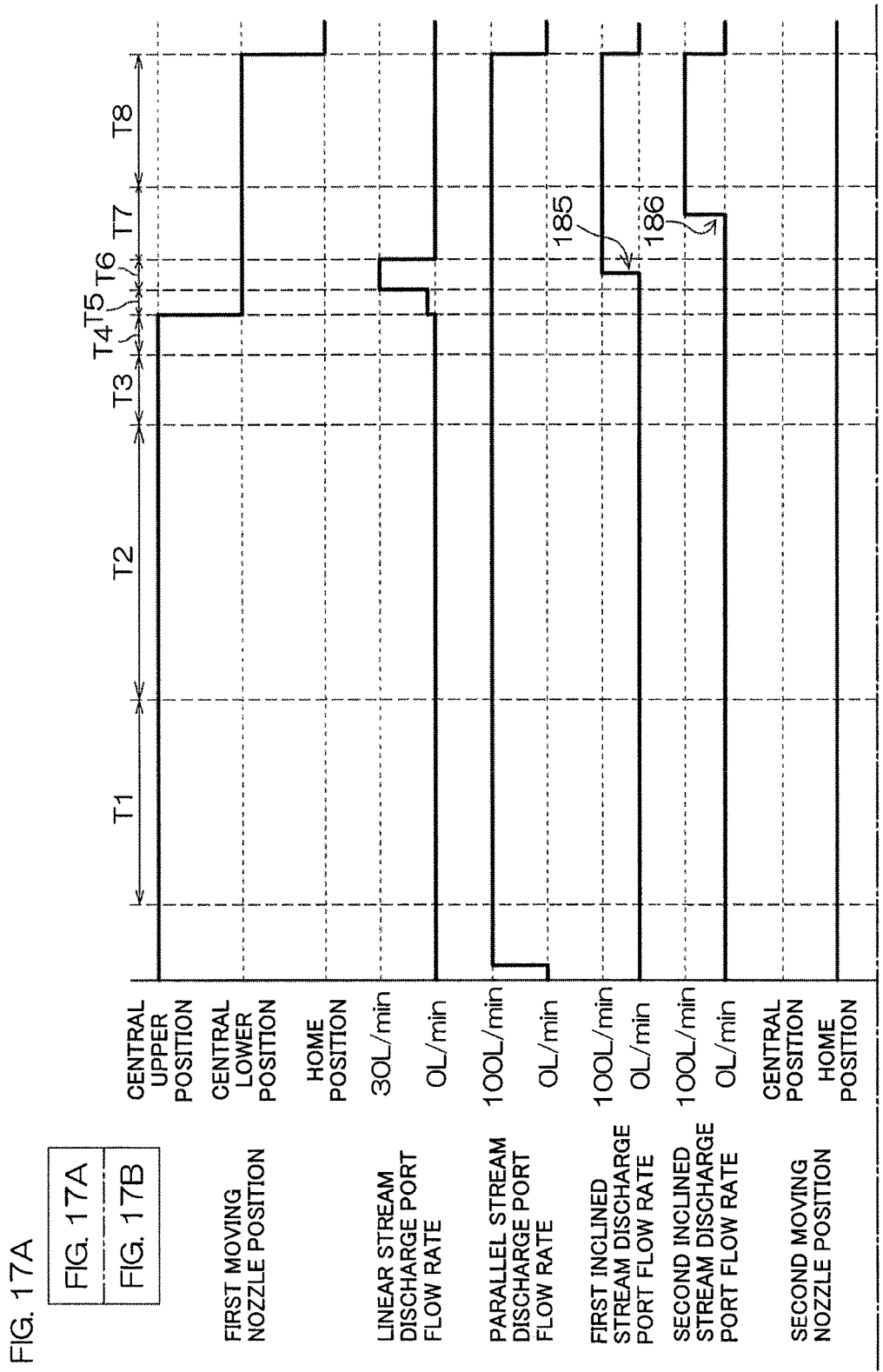

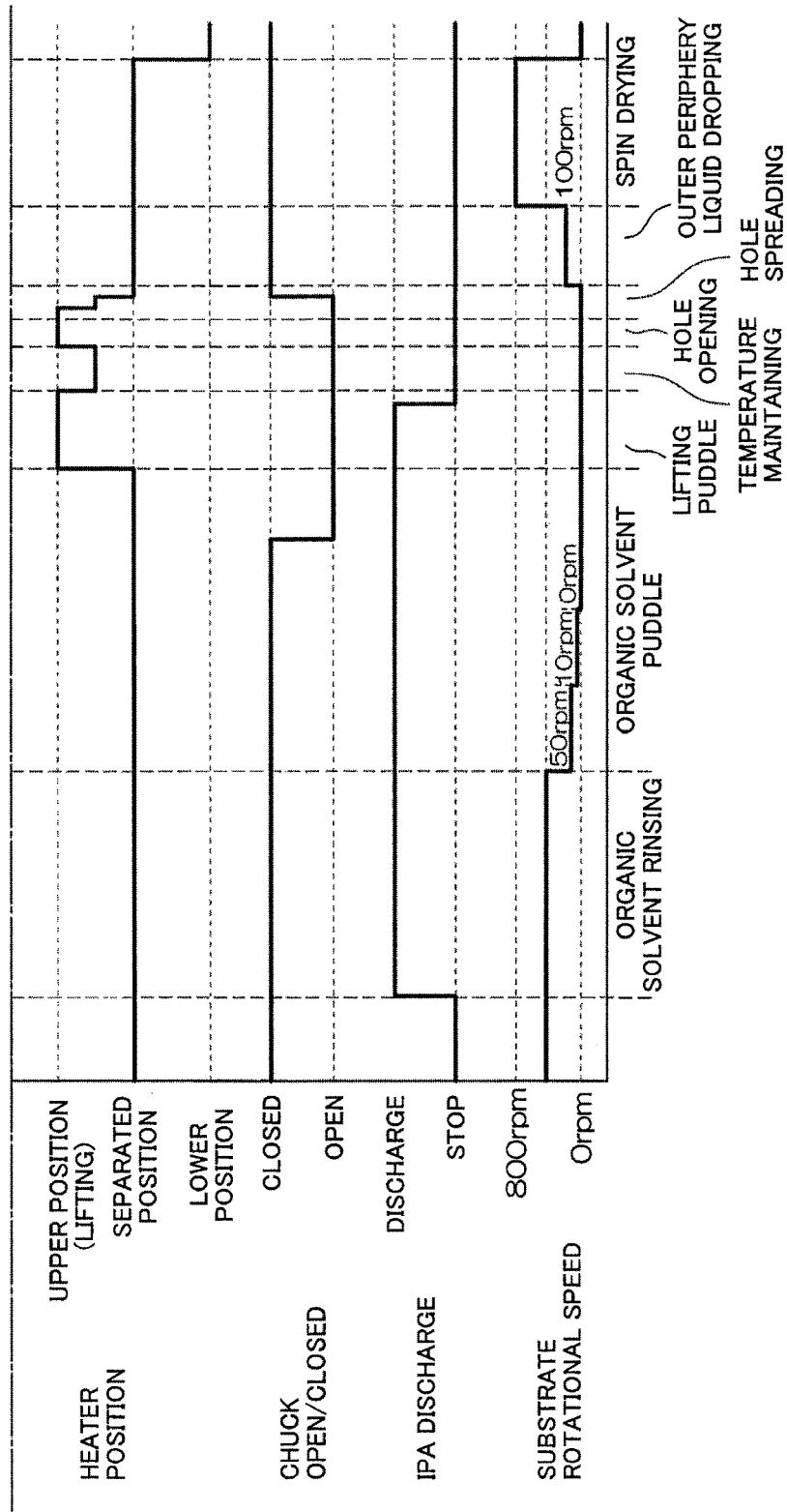

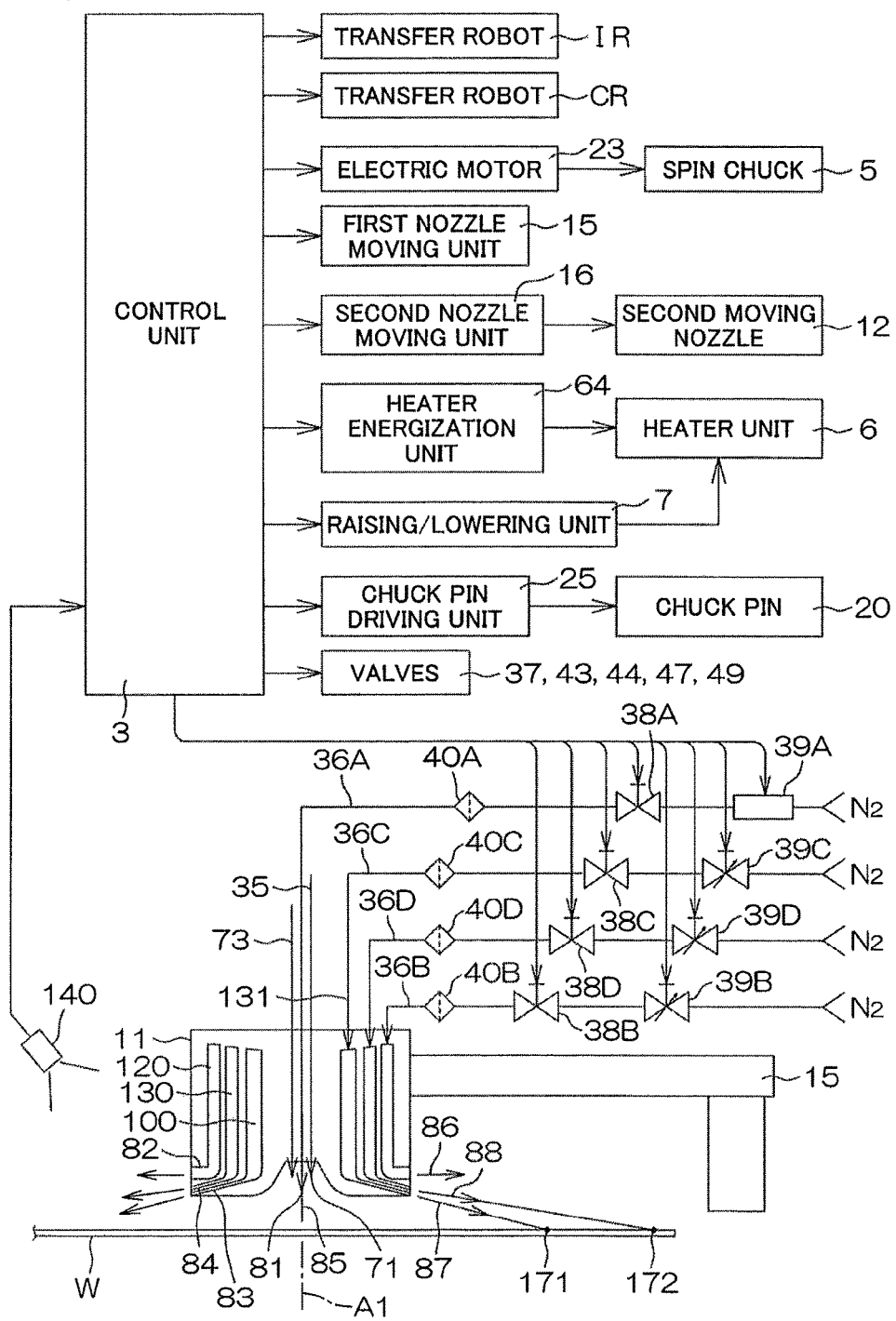

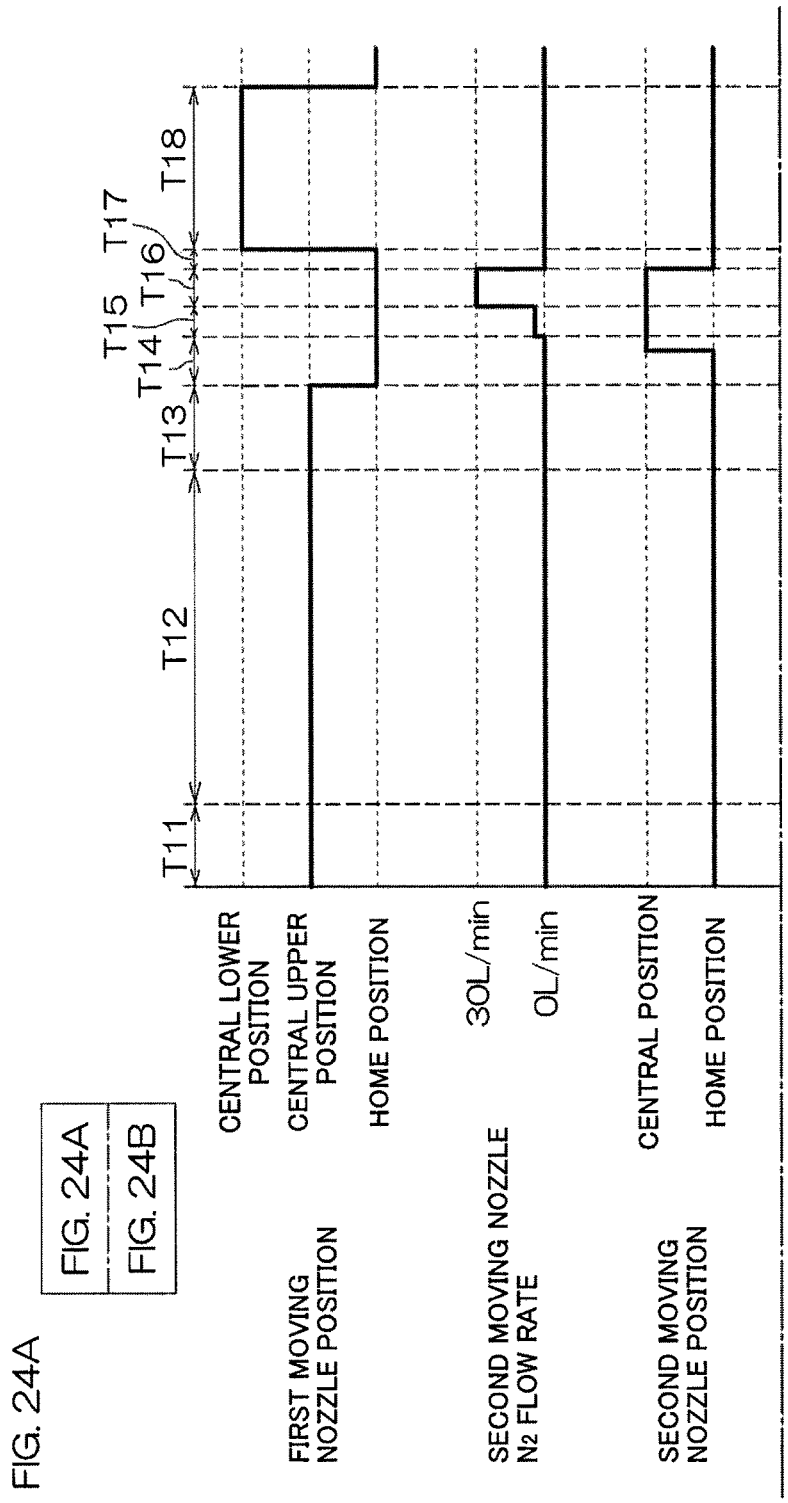

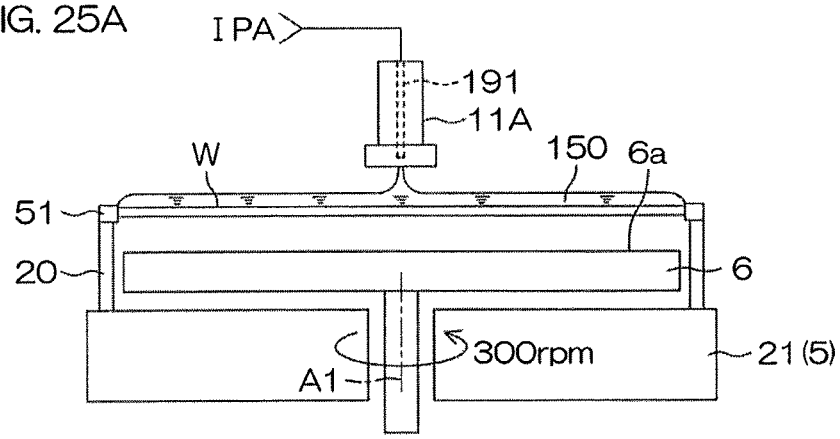
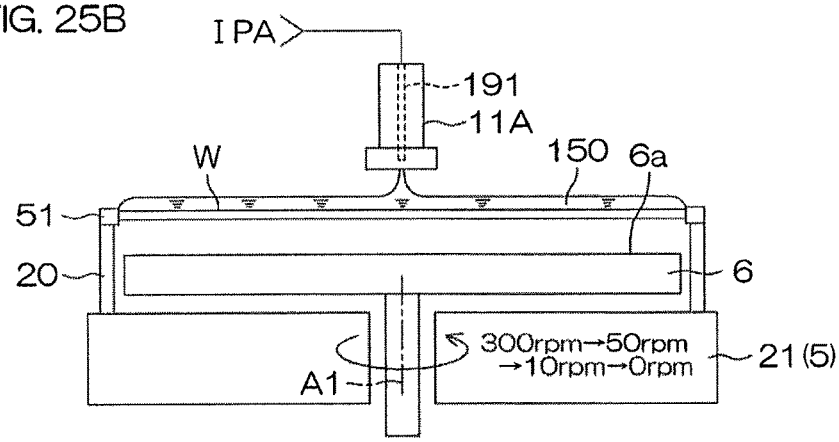
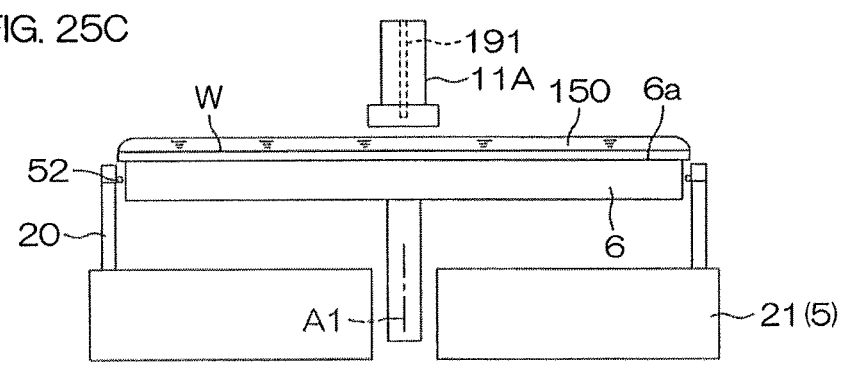

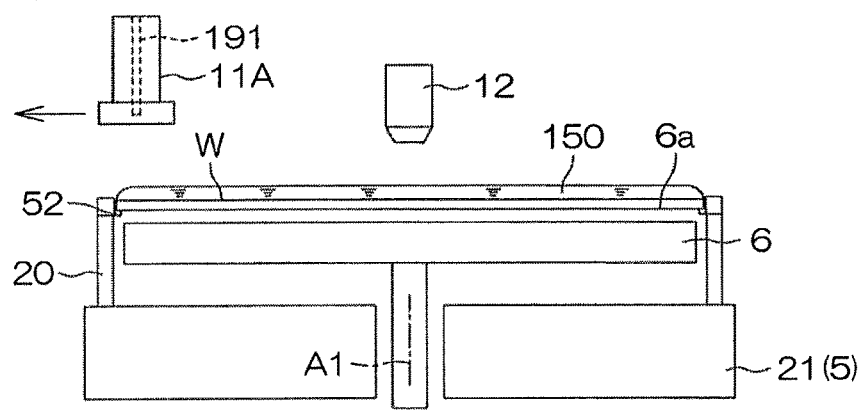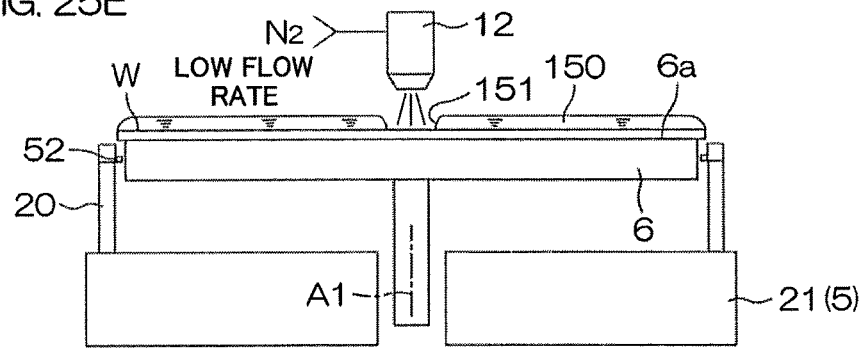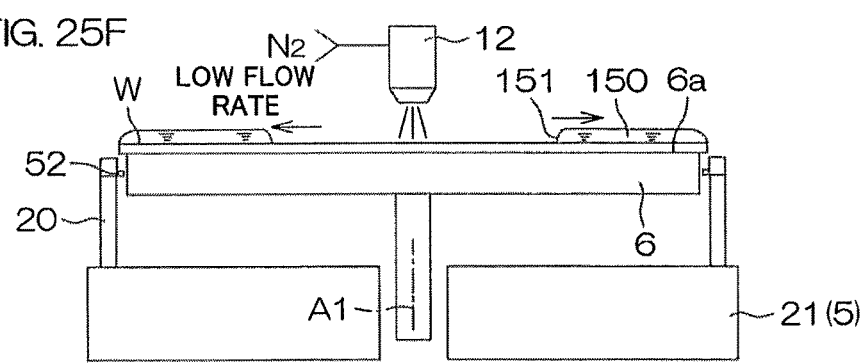

SUBSTRATE PROCESSING METHOD

BACKGROUND OF THE INVENTION

1. Field of the Invention

The present invention relates to a substrate processing method for processing a substrate by a liquid.

2. Description of the Related Art

In a manufacturing process for a semiconductor device or a liquid crystal display, a substrate processing apparatus is used to process a substrate, such as a semiconductor wafer or a glass substrate for liquid crystal display, etc. A single substrate processing type substrate processing apparatus that processes a substrate one by one includes, for example, a spin chuck that rotates the substrate while holding the substrate horizontally and a processing liquid nozzle that supplies a processing liquid to an upper surface of the substrate held by the spin chuck.

In the processing of the substrate by the substrate processing apparatus, for example, the processing liquid is discharged from the processing liquid nozzle toward an upper surface central portion of the substrate in the rotating state. The processing liquid discharged from the processing liquid nozzle lands on the upper surface central portion of the substrate and instantly spreads toward an upper surface peripheral edge portion of the substrate upon receiving a centrifugal force due to rotation of the substrate. The processing liquid is thereby supplied to an entire upper surface of the substrate and the processing by the processing liquid is performed on the upper surface of the substrate. After the processing by the processing liquid has been performed, a drying processing (spin drying) of drying the substrate by rotating the substrate at high speed by means of the spin chuck is performed.

A substrate processing apparatus described in Japanese Patent Application Publication No. 2010-238758 includes a gas discharge nozzle having an annular upper gas discharge port, an annular lower gas discharge port, and a central gas discharge port. Each of the upper gas discharge port and the lower gas discharge port discharges nitrogen gas radially along a major surface of the substrate. Nitrogen gas flow passages that respectively communicate with the upper gas discharge port and the lower gas discharge port are in communication with each other and the nitrogen gas is thus discharged at the same time from the upper gas discharge port and the lower gas discharge port. The central discharge port faces the major surface of the substrate and discharges a weak nitrogen gas stream. The nitrogen gas stream changes direction at the major surface of the substrate to form a nitrogen gas stream parallel to the major surface of the substrate. The nitrogen gas discharged from the upper gas discharge port, the lower gas discharge port, and the central discharge port thus forms three layers of nitrogen gas streams that are parallel to the major surface of the substrate. The three layers of nitrogen gas streams prevent splashed-back liquid droplets and mist from becoming attached to a front surface of the substrate.

According to the prior art of Japanese Patent Application Publication No. 2010-238758, the nitrogen gas streams parallel to the major surface of the substrate are formed in a spin drying process of rotating the spin chuck at high speed. The removal of a liquid on the front surface of the substrate is mainly dependent on the centrifugal force due to the rotation of the substrate and the nitrogen gas streams do not have a practical effect on the removal of liquid. Although the weak nitrogen gas stream is discharged from the central discharge port toward the major surface of the substrate, it is weakened sufficiently in pressure so that a liquid film on the substrate will not be removed (see paragraph 0068 of Japanese Patent Application Publication No. 2010-238758).

In a typical substrate processing process, a chemical liquid is supplied to the substrate held by the spin chuck. Thereafter, a rinse liquid is supplied to the substrate and the chemical liquid on the substrate is thereby replaced by the rinse liquid. Thereafter, the spin drying process is performed to remove the rinse liquid on the substrate. In the spin drying process, the substrate is rotated at high speed to spin off and eliminate (dry) the rinse liquid attached to the substrate. A typical rinse liquid is deionized water.

If a fine pattern is formed on the front surface of the substrate, it may not be possible to eliminate the rinse liquid, which has entered into an interior of the pattern, by the spin drying process and this may cause drying failure to occur. Thus as described in Japanese Patent Application Publication No. 9-38595, a method is proposed where an organic solvent liquid, such as an isopropyl alcohol (IPA) liquid, etc., is supplied to a front surface of a substrate after processing by a rinse liquid to replace the rinse liquid, which has entered into an interior of a pattern, with the organic solvent liquid and thereby dry the front surface of the substrate.

As shown in FIG. 28, in the spin drying process of drying the substrate by high-speed rotation of the substrate, a liquid surface (an interface of air and liquid) is formed inside the pattern. In this case, surface tension of the liquid acts at positions of contact of the liquid surface and the pattern. The surface tension is one cause of collapse of the pattern.

If, as in Japanese Patent Application Publication No. 9-38595, an organic solvent liquid is supplied to the substrate before the spin drying process, the organic solvent liquid enters in between the pattern. The surface tension of an organic solvent is lower than that of water, which is a typical rinse liquid. The problem of pattern collapse due to surface tension is thus alleviated.

However, recently, patterns (projecting patterns, line-shaped patterns, etc.) that are fine and high in aspect ratio are being formed on front surfaces of substrates to achieve higher integration of devices (for example, semiconductor devices) prepared using substrate processing. A pattern that is fine and high in aspect ratio is low in strength and therefore collapse may be caused even by the surface tension that acts on an organic solvent liquid surface.

To resolve this issue, in Japanese Patent Application Publication No. 2014-112652, after forming a liquid film of an organic solvent on a front surface of a substrate, the substrate is heated to form a gas phase film of the organic solvent on an entire upper surface of the substrate. The organic solvent liquid film supported by the gas phase film is then removed. By the gas phase film being formed in between and above a fine pattern, a state is attained where a liquid surface of the organic solvent hardly contacts the fine pattern. The organic solvent liquid thus does not dry in a state of contacting the fine pattern and therefore the surface tension acting on the fine pattern is lightened significantly to enable suppression of fine pattern collapse.

SUMMARY OF THE INVENTION

A preferred embodiment of the present invention provides a substrate processing method including a substrate holding step of holding a substrate in a horizontal orientation by means of a substrate holding unit, a liquid film forming step of supplying a processing liquid to an upper surface of the substrate held by the substrate holding unit to form a liquid film, an upper surface covering step of discharging, above the substrate held by the substrate holding unit, an inert gas radially and parallel to the upper surface of the substrate from a center toward a peripheral edge of the substrate to form an inert gas stream flowing parallel to the upper surface of the substrate and covering the upper surface of the substrate, and a liquid film removing step of discharging an inert gas toward the upper surface of the substrate to remove the liquid film, formed by the liquid film forming step, from the upper surface of the substrate.

The above and yet other objects, features, and effects of the present invention shall be made clear by the following description of the preferred embodiments in reference to the attached drawings.

BRIEF DESCRIPTION OF THE DRAWINGS

FIG. 6B is a plan view of the arrangement example of the first moving nozzle.

FIG. 6D is a bottom view of the arrangement example of the first moving nozzle.

FIGS. 9A and 9B show a time chart for describing details of an organic solvent processing (S4 of FIG. 8).

FIGS. 14A and 14B show a time chart for describing a modification example related to discharge of inert gas from an inclined stream discharge port included in the first moving nozzle.

FIGS. 15A and 15B show a time chart of a modification example where an up/down direction position of the first moving nozzle is varied in a period in which an inert gas is discharged from the inclined stream discharge port.

FIGS. 17A and 17B show a time chart, illustrated in the same manner as FIG. 9, for describing processing contents of the preferred embodiment of FIG. 16.

FIG. 18 is a block diagram for describing the arrangement related to control of a substrate processing apparatus according to yet another preferred embodiment of the present invention.

FIGS. 24A and 24B show a time chart for describing details of an organic solvent processing (S14 of FIG. 23) of the processing unit of FIG. 20.

FIG. 25A to FIG. 25H are illustrative sectional views for describing conditions of the respective steps of the organic solvent processing (S14 of FIG. 23) of the processing unit of FIG. 20.

DETAILED DESCRIPTION OF PREFERRED EMBODIMENTS

Figure 1:
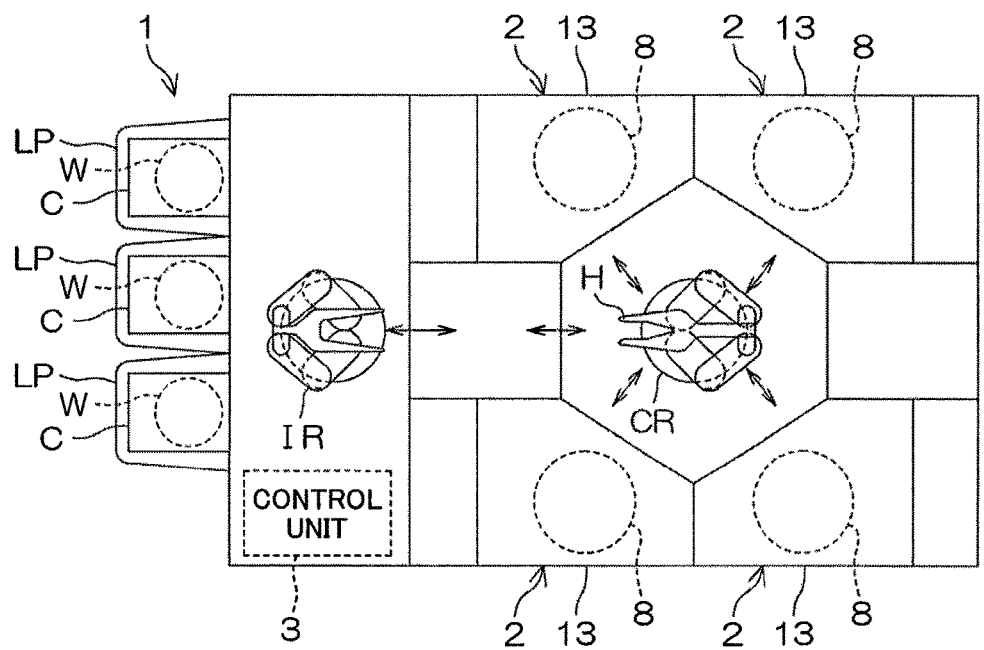
FIG. 1 is an illustrative plan view for describing a layout of an interior of a substrate processing apparatus according to a preferred embodiment of the present invention.

A preferred embodiment of the present invention provides a substrate processing method including a substrate holding step of holding a substrate in a horizontal orientation by means of a substrate holding unit, a liquid film forming step of supplying a processing liquid to an upper surface of the substrate held by the substrate holding unit to form a liquid film, an upper surface covering step of discharging, above the substrate held by the substrate holding unit, an inert gas radially and parallel to the upper surface of the substrate from a center toward a peripheral edge of the substrate to form an inert gas stream flowing parallel to the upper surface of the substrate and covering the upper surface of the substrate, and a liquid film removing step of discharging an inert gas toward the upper surface of the substrate to remove the liquid film, formed by the liquid film forming step, from the upper surface of the substrate.

With drying of a substrate by spin drying, liquid droplets may remain on the substrate. Specifically, when a liquid film on the substrate is split into minute liquid droplets by high-speed rotation of the substrate, it may be difficult to remove the liquid droplets off the substrate because a centrifugal force acting on the liquid droplets is weak. It is especially difficult to remove minute liquid droplets positioned near a rotation center of the substrate.

On the other hand, with the method according to the present preferred embodiment, the inert gas stream parallel to the upper surface of the substrate is formed from the center toward the peripheral edge of the substrate and the upper surface of the substrate can be covered by the inert gas stream. Splashed-back liquid droplets, mist, etc., can thereby be suppressed or prevented from becoming attached to the upper surface of the substrate to enable substrate processing of high quality. Further, with the present method, the liquid film on the upper surface of the substrate is removed by the inert gas discharged toward the upper surface of the substrate. The removal of the liquid film by the blowing on of the inert gas is not dependent on the centrifugal force arising from the rotation of the substrate. Removal of the liquid film that cannot be removed by use of centrifugal force is thus made possible. Also, the liquid film on the upper surface of the substrate can be removed even in a case where centrifugal force cannot be used (that is, in a case where the substrate is not rotated).

The upper surface covering step may be started at the same time as the liquid film forming step, or may be started before the liquid film forming step, or may be started after the liquid film forming step is started. Also, the upper surface covering step preferably includes a period during which it is performed in parallel with the liquid film forming step.

The liquid film removing step may be started at the same time as the upper surface covering step, or may be started before the upper surface covering step, or may be started after the upper surface covering step. Also preferably, over at least a portion (and preferably, an entirety) of its period, the liquid film removing step is performed in parallel with the upper surface covering step. The liquid film on the upper surface of the substrate can thereby be removed in a state where liquid droplets, mist, etc., flying in from the surroundings are suppressed or prevented from attaching to the upper surface of the substrate.

In the liquid film forming step, a liquid film covering an entirety of the upper surface of the substrate may be formed or a liquid film covering a portion of the upper surface of the substrate may be formed. A liquid film covering at least a central region of the upper surface of the substrate may be formed in the liquid film forming step.

In a preferred embodiment of the present invention, the liquid film removing step includes a perpendicular gas discharging step of rectilinearly discharging the inert gas perpendicular to the upper surface toward the center of the substrate.

With the present method, the inert gas is discharged rectilinearly toward the center of the substrate along a direction perpendicular to the upper surface of the substrate. The liquid film at the center of the substrate can thereby be removed reliably by the inert gas. The inert gas that is discharged rectilinearly forms a hole in the liquid film at the center of the substrate (liquid film opening step). That is, the rectilinear inert gas stream forms the hole that penetrates through the liquid film and exposes the upper surface of the substrate from the hole. Further, the inert gas stream that collides against the upper surface of the substrate changes in direction to form a flow that is parallel to the upper surface of the substrate and is directed from the center to the peripheral edge of the substrate. The hole is thereby pushed and spread and the liquid film is pushed away to the peripheral edge of the substrate. The liquid film on the upper surface of the substrate can thereby be removed off the substrate.

In a preferred embodiment of the present invention, the perpendicular gas discharging step includes a perpendicular gas flow rate increasing step of gradually increasing a flow rate of the inert gas that is discharged perpendicular to the upper surface toward the center of the substrate.

With the present method, the hole formed in the liquid film can be spread smoothly by gradually increasing the inert gas flow rate and the liquid film can thereby be pushed out toward the peripheral edge of the substrate. The liquid film on the upper surface of the substrate can thereby be removed efficiently. Also, in the case where the inert gas flow rate is increased gradually, the hole can be spread smoothly even if the flow rate is low when the hole is first formed in the liquid film. When the flow rate is made low when the hole is first formed in the liquid film, splashing of liquid can be prevented or suppressed when the hole is first formed in the liquid film.

In a preferred embodiment of the present invention, the liquid film removing step includes an oblique gas discharging step of radially discharging the inert gas in an outwardly-directed oblique direction with respect to the upper surface of the substrate with an intermediate position between the center and the peripheral edge of the substrate upper surface as a discharge target position.

With the present method, the liquid film on the upper surface of the substrate can be removed even more efficiently by the inert gas being discharged radially in the outwardly-directed oblique direction with respect to the upper surface of the substrate. That is, the inert gas stream of the outwardly-directed oblique direction has a vector directed toward the outside of the substrate from immediately after the discharge and can therefore push the liquid film powerfully toward an outer side.

In a preferred embodiment of the present invention, the oblique gas discharging step is started at a timing at which a peripheral edge of the hole formed at the center of the liquid film reaches the discharge target position.

With the present method, the inert gas stream is discharged in the outwardly-directed oblique direction toward the discharge target position at the timing at which the peripheral edge of the hole formed in the liquid film reaches the discharge target position. The oblique inert gas stream spreads the peripheral edge of the hole and pushes the liquid film to the outer side of the substrate. The liquid film can thereby be removed efficiently while suppressing or preventing the remaining of the liquid film on the substrate.

The forming of the hole may be performed by the perpendicular gas discharging step. In this case, the oblique gas discharging step is preferably started after the perpendicular gas discharging step. The perpendicular gas discharging step may be performed in parallel during the oblique gas discharging step.

The hole does not have to be formed by the perpendicular gas discharging step. For example, the hole in the liquid film may be formed by heating the substrate.

The hole may be spread by the inert gas discharged by the perpendicular gas discharging step. Also, when the substrate is heated, the substrate temperature becomes comparatively high at the portion of the hole in the liquid film and the substrate temperature becomes comparatively low below the liquid film. By the temperature difference, the liquid film moves from the high temperature side to the low temperature side. The hole may be spread using this phenomenon. Also, the hole may be spread by the liquid on the substrate being moved toward the outer side by being drawn by the liquid that flows down and off the substrate.

In a preferred embodiment of the present invention, the oblique gas discharging step includes an oblique gas flow rate increasing step of gradually increasing the flow rate of the inert gas discharged obliquely toward the discharge target position.

With the present method, the hole formed in the liquid film can be spread smoothly by gradually increasing the inert gas flow rate and the liquid film can thereby be pushed out toward the peripheral edge of the substrate. The liquid film on the upper surface of the substrate can thereby be removed efficiently.

In a preferred embodiment of the present invention, the oblique gas discharging step includes a discharge target position moving step of gradually moving the discharge target position to the peripheral edge of the upper surface of the substrate.

With the present method, the discharge target position of the outwardly-directed oblique inert gas stream is moved toward the peripheral edge of the substrate and therefore a momentum of the inert gas stream can be transmitted effectively to the liquid film and the liquid film can thereby be removed off the substrate efficiently.

In a preferred embodiment of the present invention, the discharge target position moving step includes a step of making an inclined stream discharge port, discharging the inert gas in an outwardly-directed oblique direction with respect to the upper surface of the substrate, rise with respect to the upper surface of the substrate.

With the present method, the discharge target position can be changed by raising the inclined stream discharge port and the liquid film on the substrate can thereby be removed off the substrate efficiently. In particular, by raising the inclined stream discharge port while discharging the inert gas from the inclined stream discharge port, the upper surface of the substrate can be scanned toward the outer side by the inclined flow of inert gas. The liquid film on the substrate can thereby be removed efficiently.

The inert gas flow rate may be increased in accompaniment with the raising of the inclined stream discharge port. Increase of distance from the inclined stream discharge port to the discharge target position can thereby be compensated for by the increase of the inert gas flow rate to enable a sufficient force, directed toward the outer side of the substrate, to act on the liquid film. The liquid film on the substrate can thereby be removed efficiently.

In a preferred embodiment of the present invention, the oblique gas discharging step includes a step of radially discharging the inert gas from a first inclined stream discharge port in an outwardly-directed oblique direction with respect to the upper surface of the substrate toward a first discharge target position between the center of the substrate and the peripheral edge of the upper surface of the substrate and a step of discharging the inert gas from a second inclined stream discharge port in an outwardly-directed oblique direction with respect to the upper surface of the substrate toward a second discharge target position between the first discharge target position and the peripheral edge.

With the present method, the inert gas is discharged from the first and second inclined stream discharge ports respectively to the first and second discharge target positions, which differ in distance from the center of the substrate, to enable the liquid film on the substrate to be removed even more efficiently.

For example, the hole in the liquid film may be spread by the inert gas stream from the first inclined stream discharge port and the inert gas discharge from the second inclined stream discharge port may be started at a timing at which the peripheral edge of the hole reaches the second discharge target position. The liquid film on the substrate can thereby be removed while suppressing or preventing the remaining of liquid. The discharge of inert gas from the first inclined stream discharge port may be stopped after the start of discharge of inert gas from the second inclined stream discharge port. In this case, the discharge target position is moved toward an outer periphery of the substrate by the switching from the first inclined stream discharge port to the second inclined stream discharge port. Also, the inert gas discharge from the first inclined stream discharge port may be sustained even after the start of discharge of inert gas from the second inclined stream discharge port. In this case, the liquid film on the substrate can be pushed out powerfully to the outer side of the substrate by the inert gas discharged from the first and second inclined stream discharge ports at the same time.

The oblique gas discharging step may further include a step of discharging the inert gas from a third inclined stream discharge port in an outwardly-directed oblique direction with respect to the upper surface of the substrate toward a third discharge target position between the second discharge target position and the peripheral edge.

A preferred embodiment of the present invention further includes a peripheral edge position detecting step of detecting a position of the peripheral edge of the hole formed at the center of the liquid film, and the liquid film removing step includes a step of controlling the discharge of inert gas in accordance with a result of detection by the peripheral edge detecting step.

With the present method, the position of the peripheral edge of the hole formed in the liquid film is detected and the discharge of inert gas is controlled in accordance with the detection result to enable the liquid film on the substrate to be removed even more efficiently.

For example, the discharge of inert gas in the outwardly-directed oblique direction toward the discharge target position may be started upon detecting that the peripheral edge of the hole in the liquid film has reached the discharge target position of the outwardly-directed oblique inert gas stream. Also, the discharge target position of the outwardly-directed oblique inert gas stream may be changed or the flow rate of the inert gas may be increased in accordance with the position of the peripheral edge of the hole. Also, the inert gas discharge from the first inclined stream discharge port may be started upon detecting that the hole in the liquid film has reached first discharge target position and the inert gas discharge from the second inclined stream discharge port may be started upon detecting that the peripheral edge of the hole in the liquid film has reached second discharge target position.

The peripheral edge position detecting step may be executed by an arrangement that includes an image taking unit taking an image of the upper surface of the substrate and a position specifying unit specifying the position of the peripheral edge of the hole in the liquid film by analyzing (image processing) the image taken by the image taking unit.

In a preferred embodiment of the present invention, the upper surface covering step is started before the start of the liquid film forming step.

With the present method, the liquid film can be formed in a state where the upper surface of the substrate is covered by the inert gas stream to enable the liquid film to be formed while suppressing or preventing splashed-back liquid droplets, mist in the atmosphere, etc., from becoming attached to the upper surface of the substrate. Substrate processing of high quality is thereby enabled. Also, by sustaining the upper surface covering step even during the liquid film removing step, substrate processing of higher quality can be realized.

A preferred embodiment of the present invention provides a fluid nozzle, disposed so as to face a major surface of a substrate, the fluid nozzle including a linear stream discharge port discharging a fluid in a straight line perpendicular to the major surface of the substrate along a central axis disposed perpendicular to the major surface of the substrate, a parallel stream discharge port radially discharging a fluid to a periphery of the central axis along a plane perpendicular to the central axis to form a parallel gas stream parallel to the major surface of the substrate and covering the major surface of the substrate, an inclined stream discharge port radially discharging a fluid to a periphery of the central axis along a conical surface inclined with respect to the central axis to form an inclined gas stream with a conical profile that is made incident obliquely on the major surface of the substrate, a first fluid inlet, a first fluid passage putting the first fluid inlet and the linear stream discharge port in communication, a second fluid inlet, a second fluid passage putting the second fluid inlet and the parallel stream discharge port in communication and being in non-communication with (being independent of) the first fluid passage, a third flow inlet, and a third fluid passage putting the third fluid inlet and the inclined stream discharge port in communication and being in non-communication with both of (being independent of both of) the first fluid passage and the second fluid passage.

By using the present fluid nozzle, a substrate processing method such as that described above can be executed. Specifically, by supplying an inert gas to the first fluid inlet, the inert gas can be rectilinearly discharged perpendicular to the major surface of the substrate from the linear stream discharge port. Also, by supplying an inert gas to the second fluid inlet, the inert gas can be discharged radially and parallel to the major surface of the substrate and the major surface of the substrate can be covered by the parallel gas stream (gas stream parallel to the substrate major surface) formed by the inert gas. Further, by supplying an inert gas to the third fluid inlet, the inert gas can be discharged in an outwardly-directed oblique direction with respect to the major surface of the substrate from the inclined stream discharge port.

The fluid passages leading to the linear stream discharge port, the parallel stream discharge port, and the inclined stream discharge port are independent inside the nozzle and the discharges of fluids from the respective discharge ports can thus be controlled individually. For example, the start of discharge, end of discharge, discharge flow rate, etc., of fluid from each discharge port can thereby be controlled independently of the other discharge ports and diverse processes can thus be realized without exchanging the nozzle.

In a preferred embodiment of the present invention, the inclined stream discharge port includes a first inclined stream discharge port and a second inclined stream discharge port that cause a fluid to be obliquely incident on the major surface of the substrate at different positions, the third fluid passage puts the third fluid inlet and the first inclined stream discharge port in communication, and the fluid nozzle further includes a fourth fluid inlet, and a fourth fluid passage putting the fourth fluid inlet and the second inclined stream discharge port in communication and being in non-communication with all of (being independent of all of) the first fluid passage, the second fluid passage, and the third fluid passage.

With the present arrangement, a fluid can be discharged from the first inclined stream discharge port and the second inclined stream discharge port with different positions on the major surface of the substrate as discharge target positions. Also, each of the fluid passages leading to the first inclined stream discharge port and the second inclined stream discharge port is independent of the other fluid passages and the discharges (start of discharge, end of discharge, discharge flow rate, etc.) of fluids from the first and second inclined stream discharge ports can thus be controlled individually. Even more diverse processes can thus be realized without exchanging the nozzle.

In a preferred embodiment of the present invention, the fluid nozzle further includes a central discharge port discharging a fluid toward the major surface of the substrate at a vicinity of the central axis, a fifth fluid inlet, and fifth fluid passage putting the fifth fluid inlet and the central discharge port in communication and being in non-communication with all of (being independent of all of) the first fluid passage, the second fluid passage, and the third fluid passage. Preferably, the fifth fluid passage is also in non-communication with the fourth fluid passage.

The central discharge port may, for example, be used to supply the processing liquid in the substrate processing method described above. The liquid film forming step, the upper surface covering step, and the liquid film removing step can thus be performed without exchanging the nozzle.

A preferred embodiment of the present invention provides a substrate processing apparatus including a substrate holding unit holding a substrate horizontally, a fluid nozzle having the features described above, a nozzle holding unit holding the fluid nozzle so as to face the substrate held by the substrate holding unit, a first inert gas supply pipe coupled to the first fluid inlet, a second inert gas supply pipe coupled to the second fluid inlet, a third inert gas supply pipe coupled to the third fluid inlet, a first inert gas valve opening and closing a flow passage of the first inert gas supply pipe, a second inert gas valve opening and closing a flow passage of the second inert gas supply pipe, a third inert gas valve opening and closing a flow passage of the third inert gas supply pipe, and a control unit controlling the first inert gas valve, the second inert gas valve, and the third inert gas valve.

The substrate processing method described above can be executed by using the present substrate processing apparatus. By controlling the first, second, and third inert gas valves, the discharge of inert gas from the linear stream discharge port, the discharge of inert gas from the parallel stream discharge port, and the discharge of inert gas from the inclined stream discharge port can be controlled individually.

In a preferred embodiment of the present invention, the substrate processing apparatus further includes a fourth inert gas supply pipe coupled to the fourth fluid inlet and a fourth inert gas valve opening and closing a flow passage of the fourth inert gas supply pipe, and the control unit further controls the fourth inert gas valve.

By using the present substrate processing apparatus, the discharges of inert gases toward different discharge target positions on the major surface (upper surface) of the substrate can be controlled individually.

In a preferred embodiment of the present invention, the substrate processing apparatus further includes a processing liquid supply pipe coupled to the fifth fluid inlet and a processing liquid valve opening and closing a flow passage of the processing liquid supply pipe, and the control unit further controls the processing liquid valve.

With the present arrangement, the supplying of the processing liquid can be controlled to enable execution of the liquid film forming step in the substrate processing method.

In a preferred embodiment of the present invention, the substrate processing apparatus further includes a first flow regulating unit regulating a flow rate of the inert gas flowing through the first inert gas supply pipe and the control unit further controls the first flow regulating unit.

With the present arrangement, the flow rate of the inert gas discharged from the linear stream discharge port can be controlled. For example, the flow rate of the inert gas discharged perpendicularly toward the major surface (upper surface) of the substrate from the linear stream discharge port can be increased gradually.

In a preferred embodiment of the present invention, the substrate processing apparatus further includes a second flow regulating unit regulating a flow rate of the inert gas flowing through the third inert gas supply pipe and the control unit further controls the second flow regulating unit.

With the present arrangement, the flow rate of the inert gas discharged from the inclined stream discharge port can be controlled. For example, the flow rate of the inert gas discharged obliquely outward toward the major surface (upper surface) of the substrate from the inclined stream discharge port can be increased gradually.

In a preferred embodiment of the present invention, the substrate processing apparatus further includes a distance adjusting unit adjusting a distance between the substrate holding unit and the fluid nozzle along the central axis, and the control unit further controls the distance adjusting unit.

With the present arrangement, a distance between the major surface (upper surface) of the substrate held by the substrate holding unit and the fluid nozzle can be changed. For example, by moving the fluid nozzle away from the substrate holding unit while discharging the inert gas from the inclined stream discharge port, the discharge target position of the inert gas discharged from the inclined stream discharge port is moved to the outer side of the substrate. For example, a liquid film on the major surface (upper surface) of the substrate can thereby be removed efficiently.

In a preferred embodiment of the present invention, the substrate processing apparatus further includes a liquid film position detecting unit detecting a position of a liquid film on the upper surface of the substrate held by the substrate holding unit and the control unit controls at least the third inert gas valve in accordance with a detection result of the liquid film position detecting unit.

With the present arrangement, the start and end of discharge of inert gas from at least the inclined stream discharge port can be controlled in accordance with the position of the liquid film. For example, the third inert gas valve can be opened at a timing at which a peripheral edge of a hole of the liquid film reaches the target discharge position from the inclined stream discharge port as the hole spreads from an inner side to the outer side of the substrate. The liquid film can thereby be pushed away from the inside toward the outside of the hole to enable the liquid film on the substrate to be removed off the substrate efficiently.

The control unit may further control the first flow regulating unit, the second flow regulating unit, the distance adjusting unit, etc., in accordance with the detection result of the liquid film position detecting unit. Also, if the substrate processing apparatus includes a substrate rotating unit that rotates the substrate held by the substrate holding unit, the control unit may further control the substrate rotating unit in accordance with the detection result of the liquid film position detecting unit.

In a preferred embodiment of the present invention, the control unit is programmed to execute the substrate processing method described above. With the present arrangement, a substrate processing apparatus that executes the substrate processing method described above can be provided.

Figure 13A:
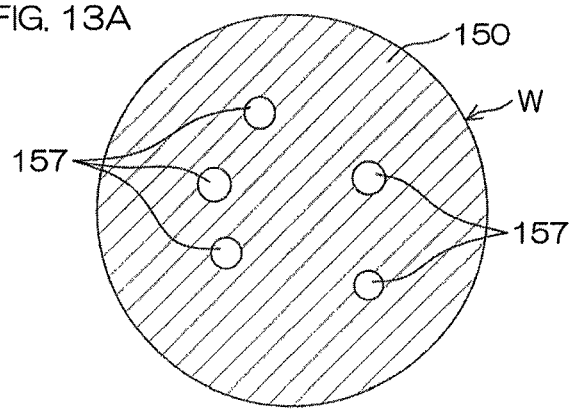
FIG. 13A, FIG. 13B, and FIG. 13C are illustrative plan views for describing an issue in a case (comparative example) where the hole opening step and a hole spreading step are omitted.

On the other hand, according to research by the inventor of the present application, when in the method of Japanese Patent Application Publication No. 2014-112652, the heating of the substrate is sustained to maintain the gas phase film during removal of the liquid film, holes are formed at an indeterminate plurality of positions in the organic solvent liquid film (see FIG. 13A). That is, the organic solvent liquid supported on the gas phase film evaporates completely so that a plurality of holes open at indeterminate positions to expose the front surface of the substrate. By the holes formed at the plurality of positions spreading respectively (see FIG. 13B), liquid droplets of the organic solvent may remain on the substrate (see FIG. 13C). When the remaining liquid droplets dry eventually, pattern collapse due to surface tension may occur. Also, the removal of the liquid film occurs non-uniformly within the plane of the substrate, causing an in-plane temperature of the substrate to become non-uniform and thereby causing warping to occur in the substrate and obstruct the removal of the organic solvent liquid film.

Japanese Patent Application Publication No. 2014-112652 discloses that nitrogen gas is blown onto the organic solvent liquid film to open a hole in the organic solvent liquid film and the hole is spread by a centrifugal force made to act on the liquid film by rotation of the substrate to remove the liquid film off the substrate. However, with this method, the liquid film may split due to the centrifugal force acting on the liquid film. The problems of remaining of the liquid droplets on the substrate and non-uniform removal of the liquid film therefore cannot be resolved.

A preferred embodiment of the present invention thus provides a substrate processing method and a substrate processing apparatus by which a liquid film on a substrate can be removed satisfactorily.

More specifically, a preferred embodiment of the present invention provides a substrate processing method including a liquid film forming step of supplying a processing liquid to an upper surface of a horizontally-held substrate to form a liquid film of the processing liquid covering an entire upper surface of the substrate, a gas phase layer forming step of heating the substrate to make the processing liquid in contact with the upper surface of the substrate evaporate to form a gas phase layer between the upper surface of the substrate and the processing liquid and maintain the liquid film on the gas phase layer, a hole opening step of blowing a gas at a first flow rate onto the liquid film on the substrate after the forming of the gas phase layer to partially remove the processing liquid to open a hole in the liquid film, a heating removing step of heating the substrate to spread the hole to an outer periphery of the substrate and move the liquid film on the gas phase layer to remove the processing liquid, constituting the liquid film, off the substrate, and a gas removing step of blowing a gas at a second flow rate greater than the first flow rate onto a region of a front surface of the substrate within the hole after the hole opening step to spread the hole to the outer periphery of the substrate and move the liquid film on the gas phase layer to remove the processing liquid, constituting the liquid film, off the substrate.

With the present method, the liquid film of the processing liquid that covers the entire upper surface of the substrate is formed and by heating the substrate, the gas phase layer, constituted of the gas resulting from evaporation of the processing liquid, is formed between the liquid film and the upper surface of the substrate. The liquid film of the processing liquid is formed on the gas phase layer. By completely removing the liquid film of the processing liquid in this state, collapsing of a pattern on the substrate front surface due to the surface tension of the processing liquid can be suppressed or prevented. The gas phase layer is preferably formed so that an interface with the processing liquid is positioned outside the pattern on the substrate front surface. The surface tension of the processing liquid can thereby be prevented from acting on the pattern on the substrate front surface and the liquid film of the processing liquid can be removed off the substrate in a state where the surface tension does not act.

To remove the liquid film of the processing liquid, a gas is blown onto the liquid film at the first flow rate. By the processing liquid at the region onto which the gas is blown being pushed by the gas, a hole is opened in the liquid film and the front surface of the substrate is exposed. When the substrate is heated in this state, the temperature of the substrate rises rapidly because the processing liquid is not present at the region in which the hole is opened. A temperature difference thereby arises between the inside and the outside of a peripheral edge of the hole. Specifically, the temperature of the substrate is high inside the hole and the temperature of the substrate is low outside the hole. The processing liquid moves to the low temperature side due to the temperature difference and therefore the hole spreads and the processing liquid is thereby removed off the substrate.

On the other hand, according to research by the inventor of the present application, with movement of the processing liquid by using temperature difference, although the hole can be spread to some degree, the movement of the processing liquid may stop when the peripheral edge of the hole reaches a peripheral edge portion of the substrate upper surface. More specifically, an equilibrium state is entered in which the processing liquid repeats movement toward the inner side and movement toward the outer side of the substrate. In this case, when the processing liquid returns toward the inner side of the substrate, the processing liquid may directly contact the substrate front surface that has lost the gas phase layer. Pattern collapse due to the surface tension of the processing liquid and formation of particles due to drying failure may thus occur.

Thus in the present preferred embodiment, after opening the hole in the liquid film of the processing liquid, a gas is blown onto the region inside the hole at the second flow rate that is greater than the first flow rate. The processing liquid can thereby be pushed to the outside of the substrate by the impetus of the gas to spread the hole. The processing liquid is thereby removed from the upper surface of the substrate without stopping and pattern collapse and particle formation can thus be suppressed or prevented.

The position at which the hole in the liquid film is opened by blowing on the gas is preferably a central region of the substrate and more preferably a center of the substrate. If the substrate is rotated in forming the liquid film of the processing liquid or in another step, it is preferable to open the hole in the liquid film at a rotation center of the substrate.

The increase of the gas flow rate from the first flow rate to the second flow rate may be a step-like increase or may be a gradual increase. The gradual increase may be a stepwise increase or a continuous increase.

The substrate may be rotated during the blowing on of the gas at the second flow rate (gas removing step). However, it is more preferable for the rotation of the substrate to be stopped because the splitting of the liquid film due to a centrifugal force can be avoided reliably.

In a preferred embodiment of the present invention, the substrate is put in a stationary state in the hole opening step. With the present method, a gas is blown onto the liquid film at the first flow rate with the substrate being in the stationary state (more specifically, a non-rotating state). Even if the substrate is in the non-rotating state, the hole formed in the liquid film spreads and movement of the processing liquid occurs due to the heating removing step. In this case, the processing liquid can be removed off the substrate while suppressing or preventing the processing liquid from splitting because the movement of the processing liquid occurs with the substrate being in the non-rotating state.

In a preferred embodiment of the present invention, the substrate processing method further includes a rotational spinning-off step of rotating the substrate at an outer periphery spinning-off speed around a rotational axis extending along a vertical direction after the heating removing step to spin the processing liquid at an outer peripheral portion of the substrate off the substrate.

With the present method, the substrate is rotated after the heating removing step to spin off the processing liquid at the outer peripheral portion (especially a peripheral end surface) of the substrate by a centrifugal force. The substrate is rotated after the processing liquid has moved to a peripheral edge region of the substrate due to movement of the processing liquid using the temperature difference and therefore splitting of the liquid film due to the centrifugal force hardly occurs. Also in most cases, a pattern effective for use in a product is not formed in the peripheral edge region of the substrate and therefore a problem will not occur even if splitting of the liquid film occurs.

The rotational spinning-off step of rotating the substrate may include a period of being executed in parallel with the gas removing step of blowing on a gas at the second flow rate or may be executed after the gas removing step.

In a preferred embodiment of the present invention, the substrate processing method further includes a high-speed rotation drying step of rotating the substrate around the rotational axis at a drying speed higher than the outer periphery spinning-off speed after the rotational spinning-off step.

With the present method, the substrate is dried by increasing a rotational speed of the substrate after the rotational spinning-off step. In other words, the rotational spinning-off step is comparatively low-speed substrate rotating step. A centrifugal force such that the liquid film will split is thus not generated, enabling the processing liquid to be spun off the substrate in a state of a liquid mass, and substrate drying by high-speed rotation can be performed thereafter.

In a preferred embodiment of the present invention, the liquid film forming step includes a liquid supplying speed rotating step of rotating the substrate at a liquid supplying speed around a rotational axis extending along a vertical direction, a processing liquid supplying step of starting the supplying of the processing liquid onto the upper surface of the substrate during the liquid supplying speed rotating step to form the liquid film that covers the entire upper surface of the substrate, a decelerating step of decelerating the rotation of the substrate, during execution of the processing liquid supplying step, from the liquid supplying speed to stoppage while maintaining the state where the liquid film covers the entire upper surface of the substrate, and a supply stopping step of stopping the supplying of the processing liquid to the upper surface of the substrate after the decelerating step.

With the present method, the processing liquid is supplied while rotating the substrate, enabling the liquid film, covering the entire upper surface of the substrate, to be formed quickly. Thereafter, the rotation of the substrate is decelerated and the rotation is stopped in a state where the supplying of the processing liquid is sustained. The state in which the liquid film of the processing liquid covers the entire upper surface of the substrate is maintained in the process of deceleration until attainment of stoppage of rotation. The processing liquid is thus not depleted at any portion of the upper surface of the substrate, enabling a circumstance where a liquid surface of the processing liquid is positioned inside a pattern to be avoided and thereby enabling pattern collapse due to surface tension to be avoided. The supplying of the processing liquid is stopped after the rotation of the substrate has stopped and therefore a thick liquid film can be formed on the upper surface of the substrate. The thick liquid film is unlikely to split, thus enabling pattern collapse to be suppressed or prevented reliably.

For example, consider a case where the rotation of the substrate is decelerated suddenly and stopped while supplying the processing liquid at a fixed flow rate. The processing liquid that reaches the upper surface of the substrate while the rotation of the substrate is fast receives a large centrifugal force and forms a fast liquid flow directed toward the outer side of the substrate. On the other hand, the centrifugal force received by the processing liquid that reaches the upper surface of the substrate when the rotation is slow is weak and the processing liquid does not receive a centrifugal force when the rotation is stopped. Therefore, when the rotation of the substrate is decelerated suddenly, whereas the processing liquid flows off the substrate quickly at a peripheral edge region of the substrate, the flow of processing liquid is slow at an inward portion (especially a portion near a processing liquid supplying position) of the substrate. The liquid film at the peripheral edge region of the substrate is thereby made thin so that lack of liquid may occur to cause a liquid surface of the processing liquid to enter into an inward portion of the pattern. Pattern collapse may thus occur at the peripheral edge region.

With the method described above, the rotation of the substrate is decelerated and stopped while avoiding such lack of liquid at the peripheral edge region and the rotation of the substrate can thus be stopped while avoiding pattern collapse due to the lack of liquid.

In a preferred embodiment of the present invention, the decelerating step includes a gradual decelerating step of gradually decreasing the rotational speed of the substrate. With the present method, the rotation of the substrate is decelerated gradually. It suffices to set the deceleration so that the state in which the entire upper surface of the substrate is covered by the liquid film can be maintained.

The gradual deceleration may be a stepwise deceleration or the gradual deceleration may be a continuous deceleration.

In a preferred embodiment of the present invention, the decelerating step includes a flow rate increased decelerating step of decelerating the rotational speed of the substrate in a state where a supply flow rate of the processing liquid is increased.

With the present method, the lack of liquid at the upper surface of the substrate is avoided by increasing the supply flow rate of the processing liquid during the deceleration. In this case, the substrate rotation can be decelerated and stopped quickly while avoiding pattern collapse due to the lack of liquid.

In a preferred embodiment of the present invention, the processing liquid supplying step is an organic solvent supplying step of supplying an organic solvent as the processing liquid and further includes a step of supplying a processing liquid other than the organic solvent to the upper surface of the substrate before the organic solvent supplying step, and the decelerating step is started after all of the other processing liquid on the substrate is replaced by the organic solvent.

With the present method, after the upper surface of the substrate has been processed with the processing liquid other than the organic solvent, the processing liquid is replaced by the organic solvent. When the processing liquid on the substrate upper surface is completely replaced, the decelerating step is started. Entering of the liquid surface of the processing liquid other than the organic solvent into a pattern can thus be suppressed. The organic solvent is low in surface tension and is thus effective for suppressing or preventing pattern collapse.

In a preferred embodiment of the present invention, the gas phase layer forming step includes a heat amount increasing step of increasing a heat amount applied to the substrate and the liquid film forming step includes a processing liquid supplying step of supplying a processing liquid to the upper surface of the substrate and a supply stopping step of stopping the supplying of the processing liquid after the start of the heat amount increasing step.

With the present method, the heat amount applied to the substrate is increased to make the processing liquid in contact with the substrate evaporate to form the gas phase layer. The supplying of the processing liquid to the substrate upper surface is stopped after the increase of heat amount is started. Rapid depletion of the processing liquid in accompaniment with the increase of heat amount can thereby be avoided to enable the gas phase layer to be formed while maintaining the state where the upper surface of the substrate is covered by the liquid film of the processing liquid. Pattern collapse can thereby be avoided.

In a preferred embodiment of the present invention, a substrate preheating step of preheating the substrate at a heat amount less than that of the gas phase layer forming step is performed during the liquid film forming step, and the heat amount increasing step is a step of increasing the heat amount applied to the substrate to be more than that in the substrate preheating step.

With the present method, the substrate is preheated during the liquid film forming step and therefore the gas phase layer can be formed quickly when the heat amount applied to the substrate is increased. Productivity can thereby be improved. Also, the heat amount applied to the substrate during the liquid film forming step is low and therefore the liquid film can be formed without drying the upper surface of the substrate.

In a preferred embodiment of the present invention, the substrate preheating step includes a step of disposing a heater unit at a separated position separated by a predetermined distance from a lower surface of the substrate and heating the substrate by radiant heat from the heater unit, and the heat amount increasing step includes a step of bringing the heater unit closer to the lower surface of the substrate than the separated position in the substrate pre-heating step.

With the present method, the substrate is preheated by the radiant heat from the heater unit and thereafter, the heater unit is brought close to the lower surface of the substrate to increase the heat amount applied to the substrate to form the gas phase layer on the upper surface of the substrate. By bringing the heater unit close to the substrate, the substrate is quickly raised in temperature. By the supplying of the processing liquid being sustained in this process, the liquid film can be maintained and drying of the substrate surface can be avoided.

The heater unit may be put in contact with the lower surface of the substrate. The substrate can thereby be raised in temperature quickly by heat conduction from the heater unit to form the gas phase layer. When the heater unit is put in contact with the lower surface of the substrate, the supplying of the processing liquid is sustained so that the state where the liquid film covers the entirety of the substrate upper surface can be maintained and drying of the substrate front surface can be avoided.

The heating removing step may include a step of bringing the heater unit close to or into contact with the lower surface of the substrate. The heater unit is preferably brought into contact with the lower surface of the substrate to make the movement of the processing liquid due to temperature difference occur effectively. It is also preferable to bring the heater unit into contact with the lower surface of the substrate to reliably maintain the gas phase layer. By putting the heater unit in contact with the lower surface of the substrate, the movement of the processing liquid can be made to occur reliably by the temperature difference without using a centrifugal force. To use a centrifugal force, the substrate must be rotated and therefore the heater unit cannot be brought into contact with the substrate. In this case, it may not be possible to reliably maintain the gas phase layer on the substrate upper surface. This is because, with heating by radiant heat, the heat amount may be insufficient and the substrate temperature may become non-uniform.

In a preferred embodiment of the present invention, the hole opening step is executed after the supplying of the processing liquid to the upper surface of the substrate is stopped.

With the present method, the gas phase layer, interposed between the substrate upper surface and the processing liquid, is formed at the processing liquid supplying position as well by stopping the supplying of the processing liquid. By the hole opening step being performed thereafter, the processing liquid can be pushed toward the outer side by the blowing-on of gas to open the hole in the state where the processing liquid is supported on the gas phase layer.

In a preferred embodiment of the present invention, the gas phase layer forming step includes a heat amount increasing step of increasing the heat amount applied to the substrate and a heat amount decreasing step of decreasing the heat amount applied to the substrate after the heat amount increasing step, and the heating removing step includes a heat amount re-increasing step of increasing the heat amount applied to the substrate again after the heat amount decreasing step and the hole opening step is started in a state where the heat amount applied to the substrate has been decreased by the heat amount decreasing step.

With the present method, the hole opening step is performed in the state where the heat amount applied to the substrate has been decreased. If the temperature of the gas that is blown on differs from the temperature of the substrate, the temperature of the substrate changes at the position at which the gas is blown on. If, at this time, a large heat amount is applied from the lower surface of the substrate, the temperature difference between the upper surface and the lower surface of the substrate becomes large and warping of the substrate may occur. In particular, if the temperature of the gas is lower than the temperature of the substrate, warping such that the upper surface of the substrate is made concave will occur, making the removal of the liquid film difficult. Thus with the present method, the gas is blown on in the state where the heat amount applied to the substrate has been decreased. The temperature difference between the upper surface and the lower surface of the substrate is thereby lessened to suppress or prevent warping of the substrate. Removal of the liquid film is thereby performed efficiently. After the hole opening step, the substrate is heated by a large heat amount again so that the gas phase layer can be maintained.

In a preferred embodiment of the present invention, the start of the hole opening step and the start of the heat amount re-increasing step are substantially simultaneous.

With the present method, the heat amount applied to the substrate is increased substantially simultaneously with the blowing on of gas. In particular, if the gas that is blown on is lower in temperature than the substrate temperature, the substrate temperature decreases at the position at which the gas is blown on. Therefore, if the increase of heat amount is awaited for some time, the movement of the processing liquid using the temperature difference of the substrate may stop. That is, an equilibrium state in which an edge portion of the hole opened in the liquid film moves toward the inner side and moves toward the outer side is entered. If, in this state, the processing liquid flows into a pattern formed on the front surface of the substrate and circumstances become such that the liquid surface of the liquid film becomes present within the pattern, pattern collapse may occur due to surface tension. Thus with the present method, the heat amount is increased again substantially simultaneously with the blowing on of gas to avoid the stopping of flow of the processing liquid. Pattern collapse can thereby be suppressed or prevented.

In a preferred embodiment of the present invention, the hole opening step includes a step of blowing on a gas of higher temperature than room temperature. With the present method, the hole opening step is performed using a high-temperature gas and therefore the warping of the substrate accompanying the blowing on of gas can be alleviated. The liquid film on the substrate can thereby be removed efficiently.

In a preferred embodiment of the present invention, the processing liquid is an organic solvent. The organic solvent is low in surface tension and therefore collapse of a pattern on the substrate can be suppressed or prevented even more reliably.

A preferred embodiment of the present invention provides a substrate processing apparatus including a substrate holding unit holding a substrate horizontally, a processing liquid supplying unit supplying a processing liquid to an upper surface of the substrate held by the substrate holding unit to form a liquid film of the processing liquid that covers an entire upper surface of the substrate, a heating unit heating the substrate, held by the substrate holding unit, at a temperature not less than a boiling point of the processing liquid in a state where the entire upper surface of the substrate is covered by the liquid film of the processing liquid to make the processing liquid evaporate and form a gas phase layer between the liquid film of the processing liquid and the upper surface of the substrate, a gas blowing-on unit blowing a gas onto the processing liquid on the substrate, and a control unit. The control unit executes a hole opening step of blowing the gas at a first flow rate from the gas blowing-on unit onto the liquid film of the processing liquid supported by the gas phase layer on the substrate to open a hole in the liquid film, a heating removing step of heating the substrate by means of the heating unit to spread the hole to an outer periphery of the substrate to move the liquid film on the gas phase layer and remove the processing liquid off the substrate, and a gas removing step of blowing the gas at a second flow rate, greater than the first flow rate, from the gas blowing-on unit onto a region inside the hole to spread the hole to the outer periphery of the substrate and thereby remove the processing liquid off the substrate.

In a preferred embodiment of the present invention, the substrate processing apparatus further includes a substrate rotating unit rotating the substrate, held by the substrate holding unit, around a rotational axis extending along a vertical direction, and the control unit further executes a rotational spinning-off step of rotating the substrate at an outer periphery spinning-off speed by means of the substrate rotating unit after the heating removing step to spin the processing liquid at an outer peripheral portion of the substrate off the substrate.

Besides the above, the control unit may be programmed to execute the substrate processing method described above.

Preferred embodiments of the present invention are described hereinafter in further detail with reference to the attached drawings.

FIG. 1 is an illustrative plan view for describing a layout of an interior of a substrate processing apparatus according to a preferred embodiment of the present invention. The substrate processing apparatus 1 is a single substrate processing type apparatus that processes a substrate W, such as a silicon wafer, etc., one by one. In the present preferred embodiment, the substrate W is a disk-shaped substrate. The substrate processing apparatus 1 includes a plurality of processing units 2, each processing the substrate W using a processing liquid, load ports LP, on each of which is placed a carrier C housing a plurality of substrates W to be processed by the processing units 2, substrate transfer robots IR and CR transferring the substrates W between the load ports LP and the processing units 2, and a control unit 3 controlling the substrate processing apparatus 1. The transfer robot IR transfers the substrates W between the carriers C and the transfer robot CR. The transfer robot CR transfers the substrates W between the transfer robot IR and the processing units 2. The processing units 2 have, for example, the same arrangement.

Figure 2:
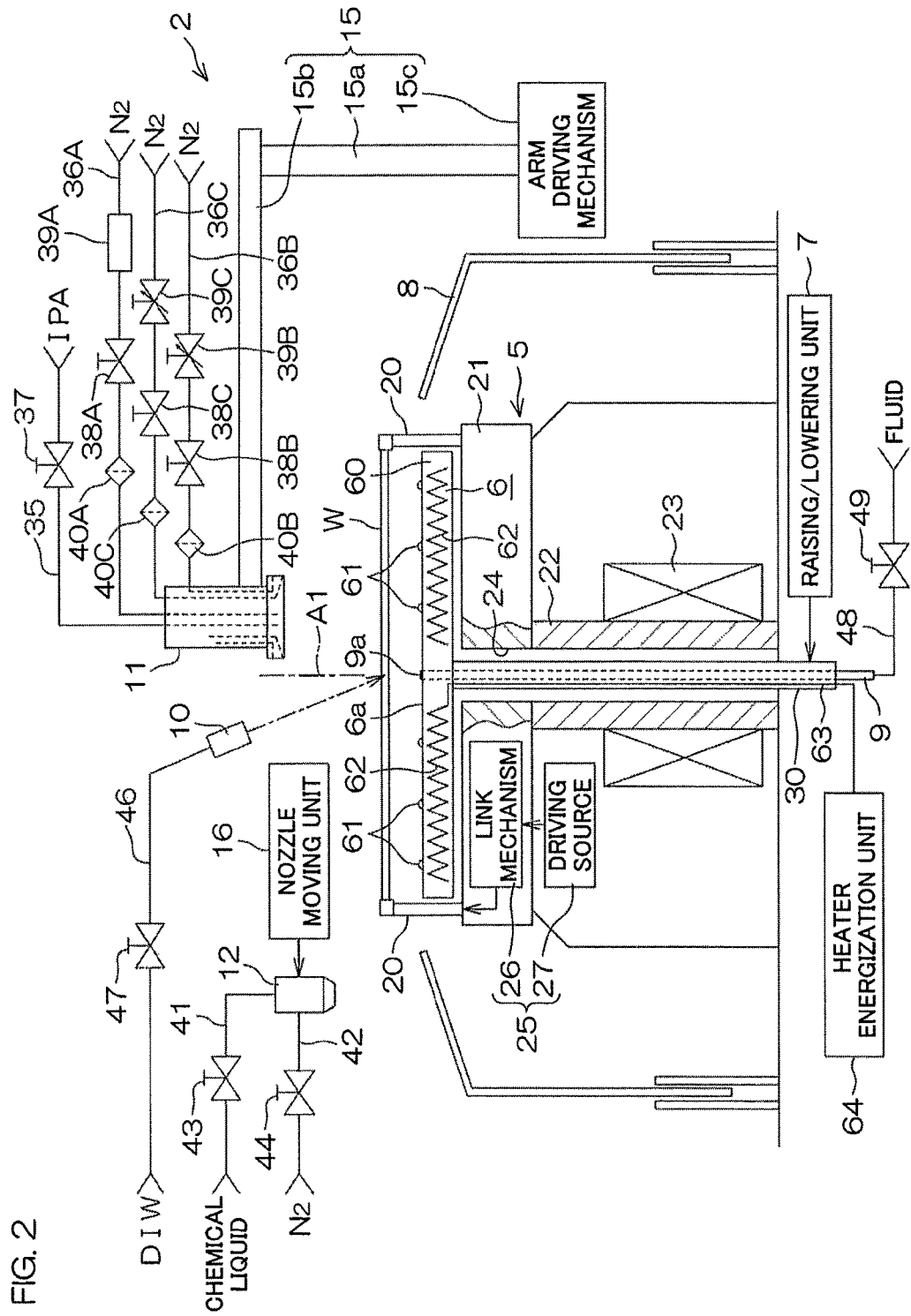
FIG. 2 is an illustrative sectional view for describing an arrangement example of a processing unit included in the substrate processing apparatus.

FIG. 2 is an illustrative sectional view for describing an arrangement example of a processing unit 2. The processing unit 2 includes a spin chuck 5 rotating a single substrate W around a vertical rotational axis A1 passing through a central portion of the substrate W while holding the substrate W in a horizontal orientation, a heater unit 6 heating the substrate W from a lower surface (lower side major surface) side, a raising/lowering unit 7 that moves the heater unit 6 up and down below the substrate W, a tubular cup 8 surrounding the spin chuck 5, a lower surface nozzle 9 supplying a processing fluid to a lower surface of the substrate W, a DIW nozzle 10 supplying deionized water (DIW) as a rinse liquid to an upper surface (upper side major surface) of the substrate W, a first moving nozzle 11 capable of moving above the substrate W, and a second moving nozzle 12 capable of moving above the substrate W. The processing unit 2 further includes a chamber 13 (see FIG. 1) that houses the cup 8. Although unillustrated, the chamber 13 has formed therein a carry-in/carry-out port for carrying in and carrying out of the substrate W and includes a shutter unit that opens and closes the carry-in/carry-out port.

The spin chuck 5 is a substrate holding unit that holds the substrate W and is a substrate rotating unit that rotates the substrate W. Specifically, the spin chuck 5 includes chuck pins 20 (chuck members), a spin base 21, a rotating shaft 22 coupled to a lower surface center of the spin base 21, and an electric motor 23 applying a rotational force to the rotating shaft 22. The rotating shaft 22 extends in a vertical direction along the rotational axis A1 and is a hollow shaft in the present preferred embodiment. The spin base 21 is coupled to an upper end of the rotating shaft 22. The spin base 21 has a disk shape along a horizontal direction. The plurality of chuck pins 20 are disposed at intervals in a circumferential direction at a peripheral edge portion of an upper surface of the spin base 21. The plurality of chuck pins 20 are capable of being opened and closed between a closed state of contacting a peripheral end of the substrate W and gripping the substrate W and an open state of being retracted from the peripheral end of the substrate W. In the open state, the plurality of chuck pins 20 contact a lower surface of a peripheral edge portion of the substrate W and can thereby support the substrate W from below.

A chuck pin driving unit 25 is included to drive the chuck pins 20 to open and close. The chuck pin driving unit 25 includes, for example, a link mechanism 26 incorporated in the spin base 21 and a driving source 27 disposed at an outer side of the spin base 21. The driving source 27 includes, for example, a ball screw mechanism and an electric motor that applies a driving force thereto. A specific arrangement example of the chuck pin driving unit 25 is described in Japanese Patent Application Publication No. 2008-034553, etc., and the entire description of this document is incorporated herein by reference.

The heater unit 6 is disposed above the spin base 21. A raising/lowering shaft 30, extending in the vertical direction along the rotational axis A1, is coupled to a lower surface of the heater unit 6. The raising/lowering shaft 30 is inserted through a penetrating hole 24 formed in a central portion of the spin base 21 and the hollow rotating shaft 22. A lower end of the raising/lowering shaft 30 extends further lower than a lower end of the rotating shaft 22. A raising/lowering unit 7 is coupled to the lower end of the raising/lowering shaft 30. By actuation of the raising/lowering unit 7, the heater unit 6 is moved up and down between a lower position close to the upper surface of the spin base 21 and an upper position of supporting and lifting the lower surface of the substrate W from the chuck pins 20.

The raising/lowering unit 7 includes, for example, a ball screw mechanism and an electric motor that applies a driving force thereto. The raising/lowering unit 7 can thereby dispose the heater unit 6 at any intermediate position between the lower position and the upper position. For example, in a state of being disposed at a separated position, at which there is a predetermined interval between a heating surface 6a that is an upper surface of the heater unit 6 and the lower surface of the substrate W, the substrate W can be heated by radiant heat from the heating surface 6a. Also, by lifting the substrate W by means of the heater unit 6, the substrate W can be heated with a greater heat amount by heat conduction from the heating surface 6a in a contacting state where the heating surface 6a is put in contact with the lower surface of the substrate W.

The first moving nozzle 11 is moved in the horizontal direction and the vertical direction by means of a first nozzle moving unit 15. The first moving nozzle 11 can be moved, by movement in the horizontal direction, between a processing position of facing a rotation center of an upper surface of the substrate W and a home position (retracted position) of not facing the upper surface of the substrate W. The rotation center of the upper surface of the substrate W is a position of the upper surface of the substrate W that intersects the rotational axis A1. The home position of not facing the upper surface of the substrate W is a position which, in a plan view, is at the outer side of the spin base 21 and, more specifically, may be a position at an outer side of the cup 8. By movement in the vertical direction, the first moving nozzle 11 can be brought close to the upper surface of the substrate W or can be retracted upward from the upper surface of the substrate W. The first nozzle moving unit 15 includes, for example, a pivoting shaft 15a extending along the vertical direction, an arm 15b coupled to the pivoting shaft 15a and extending horizontally, and an arm driving mechanism 15c driving the arm 15b. The arm driving mechanism 15c makes the arm 15b swing by making the pivoting shaft 15a pivot around a vertical pivoting axis and moves the arm 15b up and down by raising and lowering the pivoting shaft 15a along the vertical direction. The first moving nozzle 11 is fixed to the arm. 15b. The first moving nozzle 11 moves in the horizontal direction and a perpendicular direction in accordance with the swinging and raising/lowering of the arm 15b.

The first nozzle moving unit 15 thus has a function of a nozzle holding unit that holds the first moving nozzle 11 so as to face the upper surface of the substrate W held by the spin chuck 5. Further, the first nozzle moving unit 15 has a function of a distance adjusting unit that adjusts a distance in the up/down direction between the substrate W, held by the spin chuck 5, and the first moving nozzle 11.

The second moving nozzle 12 is moved in the horizontal direction and the vertical direction by a second nozzle moving unit 16. The second moving nozzle 12 can be moved, by movement in the horizontal direction, between a position of facing the rotation center of the upper surface of the substrate W and a home position (retracted position) of not facing the upper surface of the substrate W. The home position is a position which, in a plan view, is at the outer side of the spin base 21 and, more specifically, may be a position at the outer side of the cup 8. By movement in the vertical direction, the second moving nozzle 12 can be brought close to the upper surface of the substrate W or can be retracted upward from the upper surface of the substrate W. The second nozzle moving unit 16 includes, for example, a pivoting shaft extending along the vertical direction, an arm coupled to the pivoting shaft and extending horizontally, and an arm driving mechanism driving the arm. The arm driving mechanism makes the arm swing by making the pivoting shaft pivot around a vertical pivoting axis and moves the arm up and down by raising and lowering the pivoting shaft along the vertical direction. The second moving nozzle 12 is fixed to the arm. The second moving nozzle 12 moves in the horizontal direction and the perpendicular direction in accordance with the swinging and raising/lowering of the arm.

In the present preferred embodiment, the first moving nozzle 11 has a function of an organic solvent nozzle that discharges an organic solvent and a function of a gas nozzle that discharges an inert gas, such as nitrogen gas, etc. An organic solvent supply pipe 35 (processing liquid supply pipe) and first to third inert gas supply pipes 36A, 36B, and 36C are coupled to the first moving nozzle 11. The organic solvent supply pipe 35 has interposed therein an organic solvent valve 37 (processing liquid valve) that opens and closes a flow passage thereof. The inert gas supply pipes 36A, 36B, and 36C respectively have interposed therein first to third inert gas valves 38A, 38B, and 38C that open and close respective flow passages thereof. Also, the inert gas supply pipe 36A has interposed therein a mass flow controller 39A (first flow regulating unit) arranged to accurately adjust a flow rate of an inert gas flowing through the flow passage thereof. Also, the inert gas supply pipe 36B has interposed therein a variable flow valve 39B arranged to adjust a flow rate of an inert gas flowing through the flow passage thereof, and the inert gas supply pipe 36C has interposed therein a variable flow valve 39C (second flow regulating unit) arranged to adjust a flow rate of an inert gas flowing through the flow passage thereof. Further, the inert gas supply pipes 36A, 36B, and 36C respectively have interposed therein filters 40A, 40B, and 40C arranged to remove foreign matter.

An organic solvent, such as isopropyl alcohol (IPA), etc., from an organic solvent supply source is supplied to the organic solvent supply pipe 35. Inert gases, such as nitrogen gas ($N_2$), etc., are respectively supplied from inert gas supply sources to the inert gas supply pipes 36A, 36B, and 36C.

In the present preferred embodiment, the second moving nozzle 12 has a function of a chemical liquid nozzle supplying a chemical liquid, such as an acid, alkali, etc. More specifically, the second moving nozzle 12 may have a form of a double-fluid nozzle capable of mixingly discharging a liquid and a gas. The double-fluid nozzle may be used as a straight nozzle when it is made to discharge the liquid with the supply of the gas being stopped. A chemical liquid supply pipe 41 and an inert gas supply pipe 42 are coupled to the second moving nozzle 12. The chemical liquid supply pipe 41 has interposed therein a chemical liquid valve 43 that opens and closes a flow passage thereof. The inert gas supply pipe 42 has interposed therein an inert gas valve 44 that opens and closes a flow passage thereof. A chemical liquid, such as an acid, alkali, etc., from a chemical liquid supply source is supplied to the chemical liquid supply pipe 41. An inert gas, such as nitrogen gas ($N_2$), etc., from an inert gas supply source is supplied to the inert gas supply pipe 42.

An etching liquid and a cleaning liquid are specific examples of the chemical liquid. More specifically, the chemical liquid may be hydrofluoric acid, SC1 (ammonia-hydrogen peroxide mixture), SC2 (hydrochloric acid-hydrogen peroxide mixture), buffered hydrofluoric acid (mixed liquid of hydrofluoric acid and ammonium fluoride), etc.

In the present preferred embodiment, the DIW nozzle 10 is a fixed nozzle disposed to discharge DIW toward the rotation center of the upper surface of the substrate W. DIW from a DIW supply source is supplied via a DIW supply pipe 46 to the DIW nozzle 10. The DIW supply pipe 46 has interposed therein a DIW valve 47 arranged to open and close a flow passage thereof. The DIW nozzle 10 is not required to be a fixed nozzle and may be a moving nozzle that moves at least in the horizontal direction.

The lower surface nozzle 9 is inserted through the hollow raising/lowering shaft 30 and further penetrates through the heater unit 6. The lower surface nozzle 9 has at its upper end, a discharge port 9a facing a lower surface center of the substrate W. A processing fluid from a fluid supply source is supplied via a fluid supply pipe 48 to the lower surface nozzle 9. The processing fluid that is supplied may be a liquid or may be a gas. The fluid supply pipe 48 has interposed therein a fluid valve 49 arranged to open and close a flow passage thereof.

Figure 3:
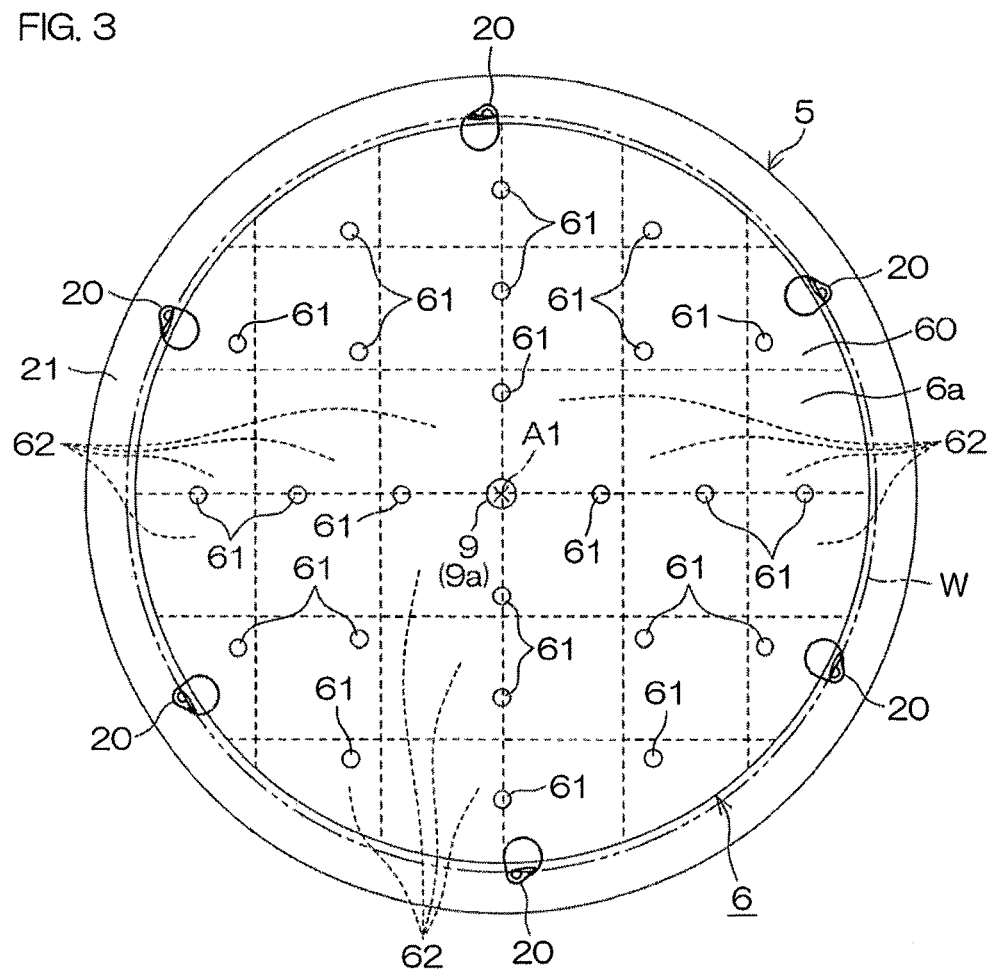
FIG. 3 is a plan view of a spin chuck and a heater unit included in the processing unit.

FIG. 3 is a plan view of the spin chuck 5 and the heater unit 6. The spin base 21 of the spin chuck 5 is, in a plan view, a circle centered at the rotational axis A1 and a diameter thereof is greater than a diameter of the substrate W. The plurality (six, in the present preferred embodiment) of chuck pins 20 are disposed at intervals at the peripheral edge portion of the spin base 21.

The heater unit 6 has a form of a disk-shaped hot plate and includes a main plate body 60, supporting pins 61, and a heater 62. The main plate body 60 is arranged, in a plan view, as a circle centered at the rotational axis A1 and having substantially the same shape and size as the outer shape of the substrate W. More accurately, the main plate body 60 has a circular planar shape with a diameter slightly smaller than the diameter of the substrate W. For example, if the diameter of the substrate W is 300 mm, the diameter of the main plate body 60 (in particular, a diameter of a heating surface 6a) may 6 mm smaller, that is, 294 mm. In this case, a radius of the main plate body 60 is 3 mm smaller than a radius of the substrate W.

An upper surface of the main plate body 60 is a flat surface oriented along a horizontal plane. The plurality of supporting pins 61 (see also FIG. 2) project from the upper surface of the main plate body 60. Each supporting pin 61 is, for example, hemispherical and projects by a minute height (for example, of 0.1 mm) from the upper surface of the main plate body 60. Therefore, when the substrate W is contactingly supported by the supporting pins 61, the lower surface of the substrate W faces the upper surface of the main plate body 60 across a minute interval of, for example, 0.1 mm. The substrate W can thereby be heated efficiently and uniformly.

The upper surface of the main plate body 60 does not have to have the supporting pins 60. If the supporting pins 61 are not provided, the substrate W may be put in contact with the upper surface of the main plate body 60. If the supporting pins 61 are provided, the heating surface 6a of the heater unit 6 includes the upper surface of the main plate body 60 and front surfaces of the supporting pins 61. Also, if the supporting pins 61 are not provided, the upper surface of the main plate body 60 corresponds to being the heating surface 6a. In the description that follows, a state where the supporting pins 61 are in contact with the lower surface of the substrate W may be referred to as the heating surface 6a being in contact with the lower surface of the substrate W, etc.

The heater 62 may be a resistor body incorporated in the main plate body 60. FIG. 3 shows a heater 62 that is partitioned into a plurality of regions. By energizing the heater 62, the heating surface 6a is heated to a temperature higher than room temperature (for example, 20 to 30° C., for example, 25° C.). Specifically, by energizing the heater 62, the heating surface 62a can be heated to a temperature higher than a boiling point of the organic solvent supplied from the first moving nozzle 11. As shown in FIG. 2, a feeder 63 to the heater 62 is passed inside the raising/lowering shaft 30. A heater energization unit 64, which supplies electric power to the heater 62, is connected to the feeder 63. The heater energization unit 64 may be energized constantly during operation of the substrate processing apparatus 1.

The supporting pins 61 are disposed substantially uniformly on the upper surface of the main plate body 60. The chuck pins 20 are disposed further to the outer side than an outer peripheral end of the main plate body 60. The entirety of each chuck pin 20 does not have to be disposed further to the outer side than the outer peripheral end of the main plate body 60 and it suffices that a portion facing an up/down movement range of the heater unit 6 be positioned further to the outer side than the outer peripheral end of the main plate body 60.

Figure 4:
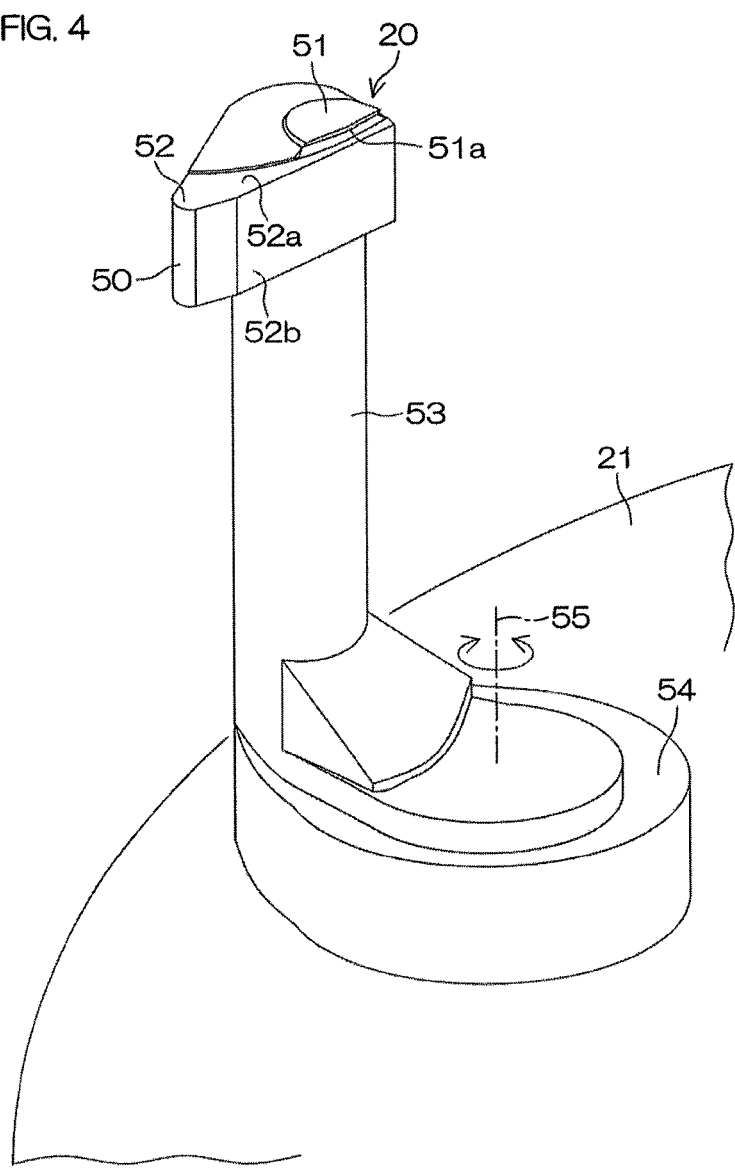
FIG. 4 is a perspective view for describing a structural example of a chuck pin included in the spin chuck.
Figure 5A:
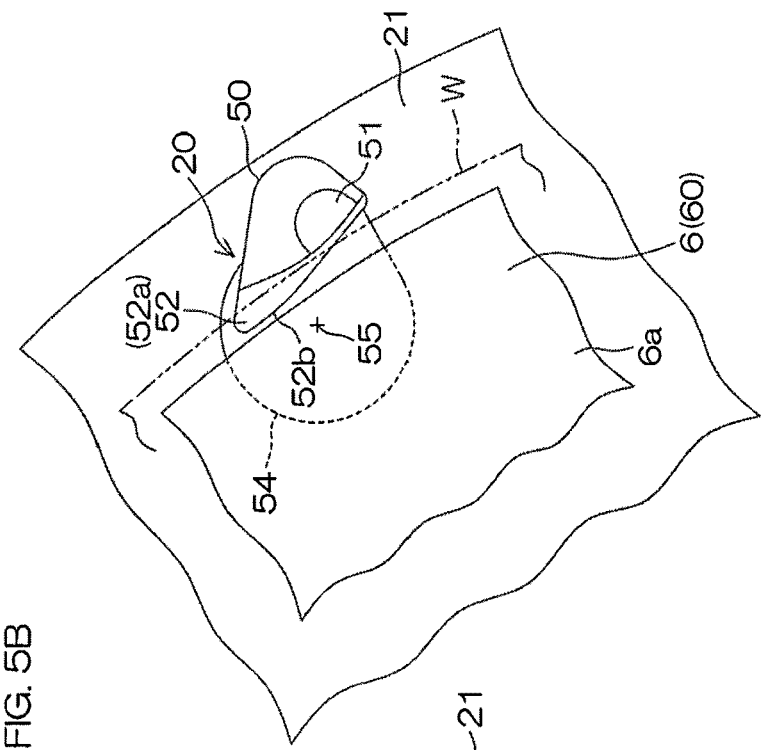
FIGS. 5A and 5B are plan views of the chuck pin with FIG. 5A showing a closed state and FIG. 5B showing an open state.
Figure 5B:
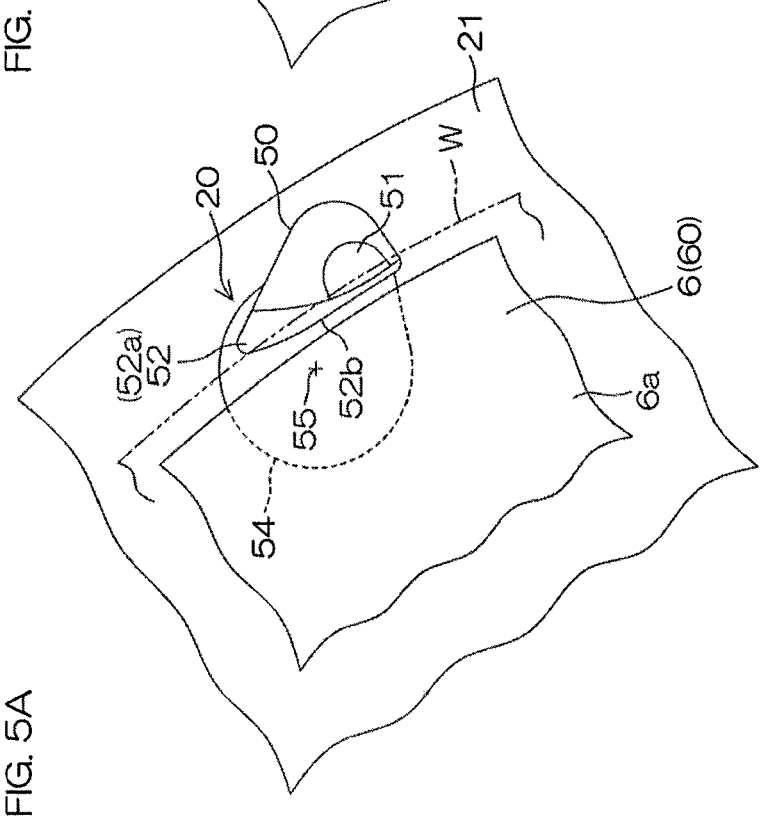

FIG. 4 is a perspective view for describing a structural example of a chuck pin 20. FIGS. 5A and 5B are plan views of the chuck pin 20 with FIG. 5A showing a closed state and FIG. 5B showing an open state.

The chuck pin 20 includes a shaft portion 53 extending in the vertical direction, a base portion 50 disposed at an upper end of the shaft portion 53, and a pivoting supporting portion 54 disposed at a lower end of the shaft portion 53. The base portion 40 includes a gripping portion 51 and a supporting portion 52. The pivoting supporting portion 54 is coupled to the spin base 21 in a manner enabling pivoting around a chuck pivoting axis 55 extending along the vertical direction. The shaft portion 53 is coupled to pivoting supporting portion 54 while being offset at a separated position from the chuck pivoting axis 55. More specifically, the shaft portion 53 is disposed at a position further separated from the rotational axis A1 than the chuck pivoting axis 55. Therefore, when the chuck pin 20 is pivoted around the chuck pivoting axis 55, the base portion 50 pivots around the chuck pivoting axis 55 while its entirety moves along a peripheral end surface of the substrate W. The pivoting supporting portion 54 is coupled to the link mechanism 26 (see FIG. 2) disposed in the interior of the spin base 21. By a driving force from the link mechanism 26, the pivoting supporting portion 54 is pivoted reciprocally within a predetermined angular range around the chuck pivoting axis 55.

The base portion 50 is formed to a wedge shape in a plan view. A supporting surface 52a, which contacts a peripheral edge portion lower surface of the substrate W when the chuck pin 20 is in the open state to support the substrate W from below, is disposed on an upper surface of the base portion 50. In other words, the base portion 50 has the supporting portion 52 having the supporting surface 52a as an upper surface. The gripping portion 51 projects upward at a position separate from the supporting portion 52 on the upper surface of the base portion 50. The gripping portion 51 has a holding groove 51a opening in a V-shape so as to face the peripheral end surface of the substrate W.

When the pivoting supporting portion 54 is pivoted in a clockwise direction around the chuck pivoting axis 55 from the open state shown in FIG. 5B, the gripping portion 51 approaches the peripheral end surface of the substrate W and the supporting portion 52 separates from the rotation center of the substrate W. Also, when the pivoting supporting portion 54 is pivoted in a counterclockwise direction around the chuck pivoting axis 55 from the closed state shown in FIG. 5A, the gripping portion 51 separates from the peripheral end surface of the substrate W and the supporting portion 52 approaches the rotation center of the substrate W.

In the closed state of the chuck pin 20 shown in FIG. 5A, the peripheral end surface of the substrate W enters into the holding groove 51a. In this state, the lower surface of the substrate W is positioned at a height separated upward by a minute distance from the supporting surface 52a. In the open state of the chuck pin 20 shown in FIG. 5B, the peripheral end surface of the substrate W is removed from the holding groove 51a and, in a plan view, the gripping portion 51 is positioned further to the outer side than the peripheral end surface of the substrate W. In both the open state and the closed state of the chuck pin 20, the supporting surface 52a is at least partially positioned below the peripheral edge portion lower surface of the substrate W.

When the chuck pin 20 is in the open state, the substrate W can be supported by the supporting portion 52. When the chuck pin 20 is switched from the open state to the closed state, the peripheral end surface of the substrate W is guided into the holding groove 51a of V-shaped cross section while being guided by and rising against the holding groove 51a and a state is entered where the substrate W is clamped by the upper and lower inclined surfaces of the holding groove 51a. When the chuck pin 20 is switched from that state to the open state, the peripheral end surface of the substrate W slips downward while being guided by the lower inclined surface of the holding groove 51a and the peripheral edge portion lower surface of the substrate W contacts the supporting surface 52a.

As shown in FIG. 5A and FIG. 5B, an edge portion of the base portion 50 that faces the main plate body 60 of the heater unit 6 in a plan view follows the shape of the peripheral edge of the main plate body 60. That is, the supporting portion 52 has a side surface 52b, which, in a plan view, is positioned further to the outer side than the main plate body 60 with respect to the rotation center. The main plate body 60 having the heating surface 6a of circular shape slightly smaller than the substrate W thus does not interfere with the chuck pins 20 when the heater unit 6 moves up and down. The non-interfering positional relationship is maintained in both the closed state and the open state of the chuck pins 20. That is, in both the closed state and the open state of the chuck pins 20, the side surface 52b of each supporting portion 52 is, in a plan view, separated toward the outer side from the heating surface 6a of the heater unit 6. Thus regardless of whether the chuck pins 20 are in the closed state or the open state, the heater unit 6 can be raised or lowered while making the heating surface 6a pass along the inside of the side surfaces 52b.

The diameter of the substrate W is, for example, 300 mm and the diameter of the upper surface of the main plate body 60 is, for example, 294 mm. Therefore, the heating surface 6a faces substantially the entirety of the lower surface of the substrate W, including a central region and a peripheral edge region. In both the closed state and the open state of the chuck pins 20, the supporting portions 52 are disposed in a state of securing an interval not less than a predetermined minute interval (for example, of 2 mm) outside the outer peripheral edge of the heating surface 6a.

The gripping portion 51 is arranged so that, in the closed state of the chuck pin 20, an inner edge thereof is positioned in a state of securing an interval not less than a predetermined minute interval (for example, of 2 mm) outside the outer peripheral edge of the main plate body 60. Therefore with the heater unit 60, the heating surface 6a can be raised and lowered at the inner side of the gripping portions 51 and be raised until the lower surface of the substrate W is contacted in both the closed state and the open state of the chuck pins 20.

The chuck pivoting axes 55 are positioned, in a plan view, along a circumference centered at the rotation axis A1 (see FIG. 2 and FIG. 3) and having a smaller radius than the radius of the heating surface 6a.

Figure 6A:
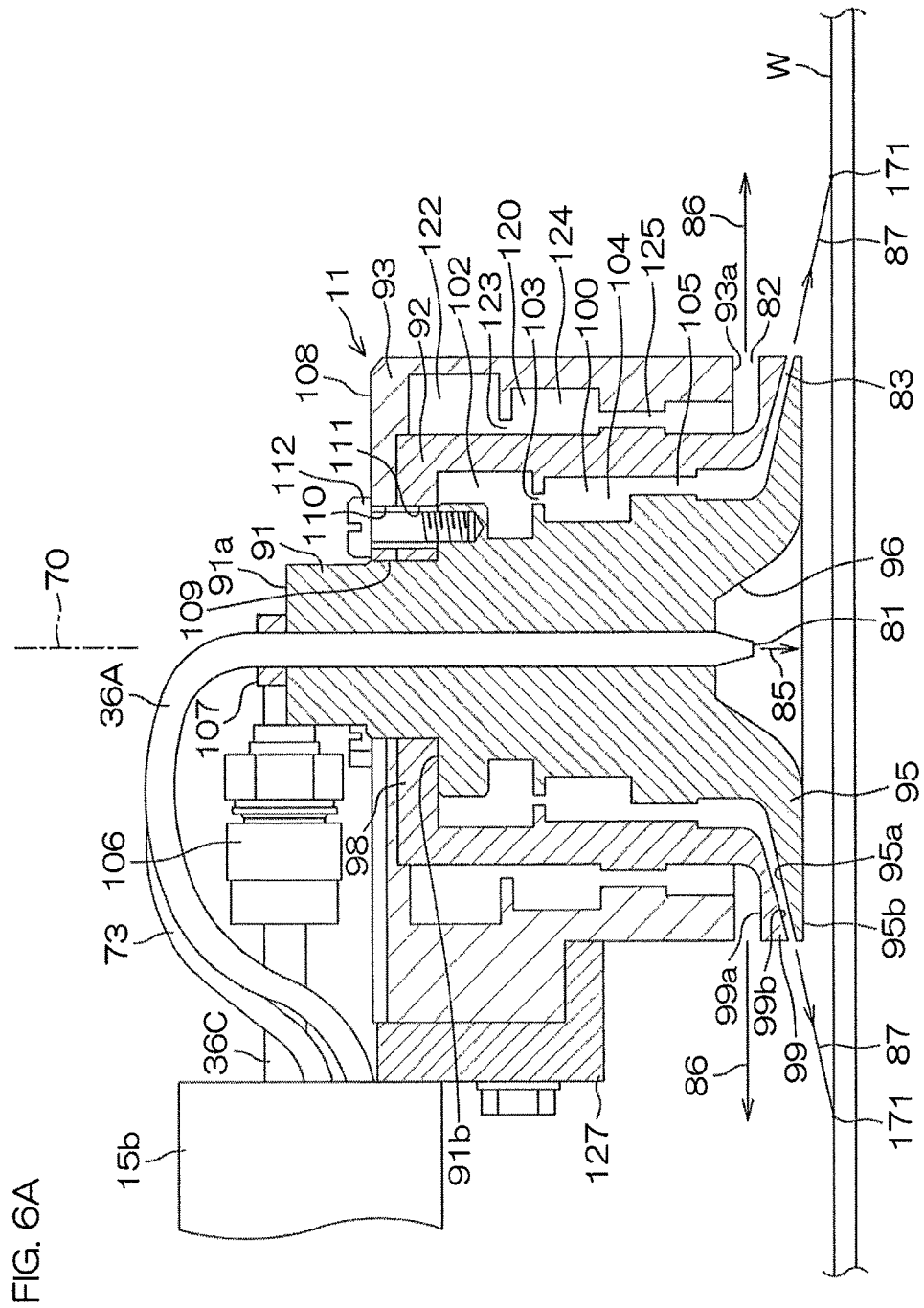
FIG. 6A is a schematic longitudinal sectional view for describing an arrangement example of a first moving nozzle included in the processing unit.
Figure 6C:
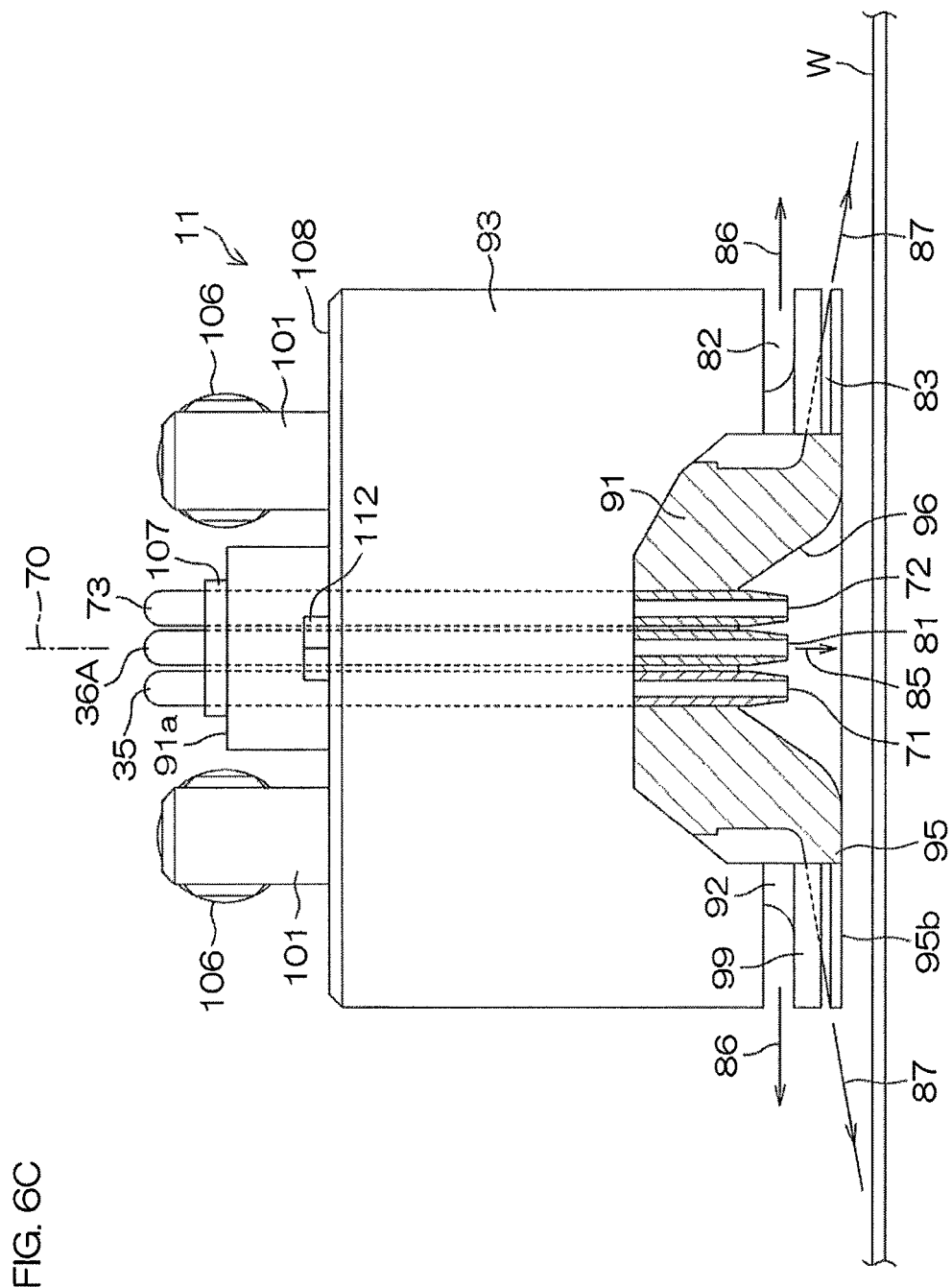
FIG. 6C is a partially cutaway side view of the arrangement example of the first moving nozzle.

FIG. 6A is a longitudinal sectional view (sectional view taken along VIA-VIA of FIG. 6B) for describing an arrangement example of the first moving nozzle 11. FIG. 6B is a plan view thereof. FIG. 6C is a side view thereof, and FIG. 6D is a bottom view thereof. In FIG. 6C, the arrangement viewed in the direction of an arrow VIC in FIG. 6B is shown in a partially cutaway manner.

The first moving nozzle 11 is a fluid nozzle having a plurality of discharge ports. The first moving nozzle 11 has a linear stream discharge port 81 that discharges a fluid (an inert gas in the present preferred embodiment) in a straight line perpendicular to the major surface of the substrate W along a central axis 70 disposed perpendicular to the major surface of the substrate W. Further, the first moving nozzle 11 has a parallel stream discharge port 82 radially discharging a fluid (an inert gas in the present preferred embodiment) to a periphery of the central axis 70 along a plane perpendicular to the central axis 70. Also, the first moving nozzle 11 has an inclined stream discharge port 83 radially discharging a fluid (an inert gas in the present preferred embodiment) to a periphery of the central axis 70 along a conical plane inclined with respect to the central axis 70. The inert gas discharged from the linear stream discharge port 81 forms a linear gas stream 85 that is perpendicularly incident on the major surface of the substrate W. The inert gas discharged from the parallel stream discharge port 82 forms a parallel gas stream 86 parallel to the upper surface of the substrate W and covering the upper surface of the substrate W. The inert gas discharged from the inclined stream discharge port 83 forms an inclined gas stream 87 with a conical profile that is made incident obliquely on the upper surface of the substrate W.

As shown most clearly in FIG. 6A, the first moving nozzle 11 includes an inner constituent member 91, an intermediate constituent member 92 disposed outside the member 91, and an outer constituent member 93 disposed outside the member 92.

The inner constituent member 91 is arranged to a substantially circular columnar shape and has an outward flange portion 95 at its lower end portion. The flange portion 95 has an upper surface 95a of conical surface shape that is inclined outwardly obliquely downward with respect to the central axis 70. Further, the flange portion 95 has a bottom portion 95b perpendicular to the central axis 70 (that is, parallel to the upper surface of the substrate W). At the inner side of the flange portion 95, a recess 96, which is recessed in a direction away from the upper surface of the substrate W, is formed in a lower end surface of the inner constituent member 91. The recess 96 is formed to a substantially truncated conical shape that is rotationally symmetrical around the central axis 70.

Three pipes 36A, 35, and 73 are passed parallel to the central axis 70 through a central portion of the inner constituent member 91 from the upper surface 91a to the recess 96. Specifically, the inert gas supply pipe 36A, the organic solvent supply pipe 35, and a chemical liquid supply pipe 73 (omitted from illustration in FIG. 2) are passed through. Lower end portions of the supply pipes 36A, 35, and 73 are disposed inside the recess 96. The lower end portion of the inert gas supply pipe 36A constitutes the linear stream discharge port 81. The lower end portion of the organic solvent supply pipe 35 constitutes a central discharge port 71 discharging a fluid (in the present preferred embodiment, an organic solvent as an example of a processing liquid) toward the upper surface of the substrate W at a vicinity of the central axis 70. The lower end portion of the chemical liquid supply pipe 73 constitutes a chemical liquid discharge port 72 discharging a fluid (in the present preferred embodiment, a chemical liquid as an example of a processing liquid) toward the upper surface of the substrate W at a vicinity of the central axis 70.

The inert gas supply pipe 36A provides a fluid passage (first fluid passage) having a vicinity of an upper end of the inner constituent member 91 as a fluid inlet (first fluid inlet)

and putting the fluid inlet and the linear stream discharge port 81 in communication. Similarly, the organic solvent supply pipe 35 provides a fluid passage (fifth fluid passage) having a vicinity of the upper end of the inner constituent member 91 as a fluid inlet (fifth fluid inlet) and putting the fluid inlet and the central discharge port 71 in communication. The chemical liquid supply pipe 73 provides a fluid passage having a vicinity of the upper end of the inner constituent member 91 as a fluid inlet and putting the fluid inlet and the chemical liquid discharge port 72 in communication.

On an outer peripheral surface of the inner constituent member 91, a shoulder portion 91*b* is formed to an annular shape that is rotationally symmetrical around the central axis 70. The intermediate constituent member 92 is engaged with the shoulder portion 91*b*. More specifically, the intermediate constituent member 92 is formed to a circular cylindrical shape and has an inward flange portion 98 formed at its upper end. The flange portion 98 engages with the shoulder portion 91*b*. Also, an outward flange portion 99 is formed at a lower end portion of the intermediate constituent member 92. The flange portion 99 has an upper surface 99*a* perpendicular to the central axis 70 (that is, parallel to the upper surface of the substrate W). Also, the flange portion 99 has a bottom surface 99*b* that is inclined outwardly obliquely downward with respect to the central axis 70. The bottom surface 99*b* faces the upper surface 95*a* of the flange portion 95 formed at the lower end portion of the inner constituent member 91. The inclined stream discharge port 83 of conical surface shape, which is inclined outwardly obliquely downward with respect to the central axis 70, is thereby defined between the bottom surface 99*b* and the upper surface 95*a*.

A fluid passage 100 (third fluid passage) is defined to have a tubular shape between the outer peripheral surface of the inner constituent member 91 and an inner peripheral surface of the intermediate constituent member 92. The fluid passage 100 communicates with a fluid inlet 101 (third fluid inlet; see FIG. 6B and FIG. 6C), coupled to the inert gas supply pipe 36C, and with the inclined stream discharge port 83 and thereby puts these in communication. Projections and recesses are formed on the outer peripheral surface of the inner constituent member 91 and the inner peripheral surface of the intermediate constituent member 92, and a first buffer portion 102, a first constricted passage 103, a second buffer portion 104, and a second constricted passage 105 are thereby defined in the fluid passage 100. The inert gas from the fluid inlet 101 is introduced into the first buffer portion 102, where it stays and thus diffuses in a circumferential direction, and then further passes through the first constricted passage 103 and is then introduced into the second buffer portion 104, where it stays and thus diffuses in the circumferential direction again. The inert gas in the second buffer portion 104 then passes through the second constricted passage 105 and reaches the inclined stream discharge port 83. By the inert gas being made uniform in pressure in the first and second buffer portions 102 and 104, the inclined stream discharge port 83 can blow out the inert gas radially at a flow rate and flow speed that are uniform across its entire circumference.

The intermediate constituent member 92 is covered from its upper surface side by the outer constituent member 93. The outer constituent member 93 has a top surface portion 108 that is orthogonal to the central axis 70. A lower surface of the top surface portion 108 is supported by an upper end surface of the intermediate constituent member 92. A penetrating hole 109, allowing the inner constituent member 91 to penetrate through upward, is formed in the top surface portion 108. The outer constituent member 93 is coupled to the inner constituent member 91 by a bolt 112 that is inserted from above the top surface portion 108 and through an insertion hole 110, formed in the top surface portion 108, and an insertion hole 111, formed in the flange portion 98 of the intermediate constituent member 92, and is engaged with the inner constituent member 91. At the same time, the intermediate constituent member 92 is thereby clamped by the inner constituent member 91 and the outer constituent member 93, and the inner constituent member 91, the intermediate constituent member 92, and the outer constituent member 93 are thereby coupled integrally.

The outer constituent member 93 has a space formed at an inner side that has a substantially circular cylindrical shape, which is rotationally symmetrical with respect to the central axis 70. The intermediate constituent member 92 is housed inside the space. A bottom surface 93*a* of the outer constituent member 93 is oriented along a plane perpendicular to the central axis 70 (that is, parallel to the upper surface of the substrate W) and faces the upper surface 99*a* of the flange portion 99 of the intermediate constituent member 92. The parallel stream discharge port 82, which is perpendicular to the central axis 70 (that is, parallel to the upper surface of the substrate W), is thereby defined between the bottom surface 93*b* and the upper surface 99*a*.

A fluid passage 120 (second fluid passage) is defined to have a tubular shape between the outer peripheral surface of the intermediate constituent member 92 and an inner peripheral surface of the outer constituent member 93. The fluid passage 120 communicates with a fluid inlet 121 (second fluid inlet; see FIG. 6B and FIG. 6D), coupled to the inert gas supply pipe 36B, and with the parallel stream discharge port 82 and thereby puts these in communication. Projections and recesses are formed on the outer peripheral surface of the intermediate constituent member 92 and the inner peripheral surface of the outer constituent member 93 (mainly on the inner peripheral surface of the outer constituent member 93 in the present preferred embodiment), and a first buffer portion 122, a first constricted passage 123, a second buffer portion 124, and a second constricted passage 125 are thereby defined in the fluid passage 120. The inert gas from the fluid inlet 121 is introduced into the first buffer portion 122, where it stays and thus diffuses in the circumferential direction, and then further passes through the first constricted passage 123 and is then introduced into the second buffer portion 124, where it stays and thus diffuses in the circumferential direction again. The inert gas in the second buffer portion 124 then passes through the second constricted passage 125 and reaches the parallel stream discharge port 82. By the inert gas being made uniform in pressure in the first and second buffer portions 122 and 124, the parallel stream discharge port 82 can blow out the inert gas radially at a flow rate and flow speed that are uniform across its entire circumference.

The outer constituent member 93 is coupled via a bracket 127 to the arm 15*b* of the first nozzle moving unit 15.

A pair of the fluid inlets 101 are disposed at the top surface portion 108 of the outer constituent member 93. The pair of fluid inlets 101 are disposed at positions facing each other across the central axis 70 in a plan view. A pair of the inert gas supply pipes 36C are coupled via pipe joints 106 to the pair of fluid inlets 101. The inert gas is thereby introduced into the tubular flow passage 100 from two locations at a 180-degree angular interval centered at the central axis 70.

An upper portion of the inner constituent member 91 projects above the outer constituent member 93 and, from an upper surface 91*a* thereof, the inert gas supply pipe 36A, the organic solvent supply pipe 35, and the chemical liquid supply pipe 73 are inserted along the central axis 70. A pipe holding member 107 holding the supply pipes 36A, 35, and 40 is disposed on the upper surface of the inner constituent member 91.

The fluid inlet 121 is disposed at a side surface of the outer constituent member 93. The inert gas supply pipe 36B is coupled via a pipe joint 115 to the fluid inlet 121. The inert gas from the inert gas supply pipe 36B can thereby be introduced into the fluid passage 120 via the fluid inlet 121.

Figure 7:
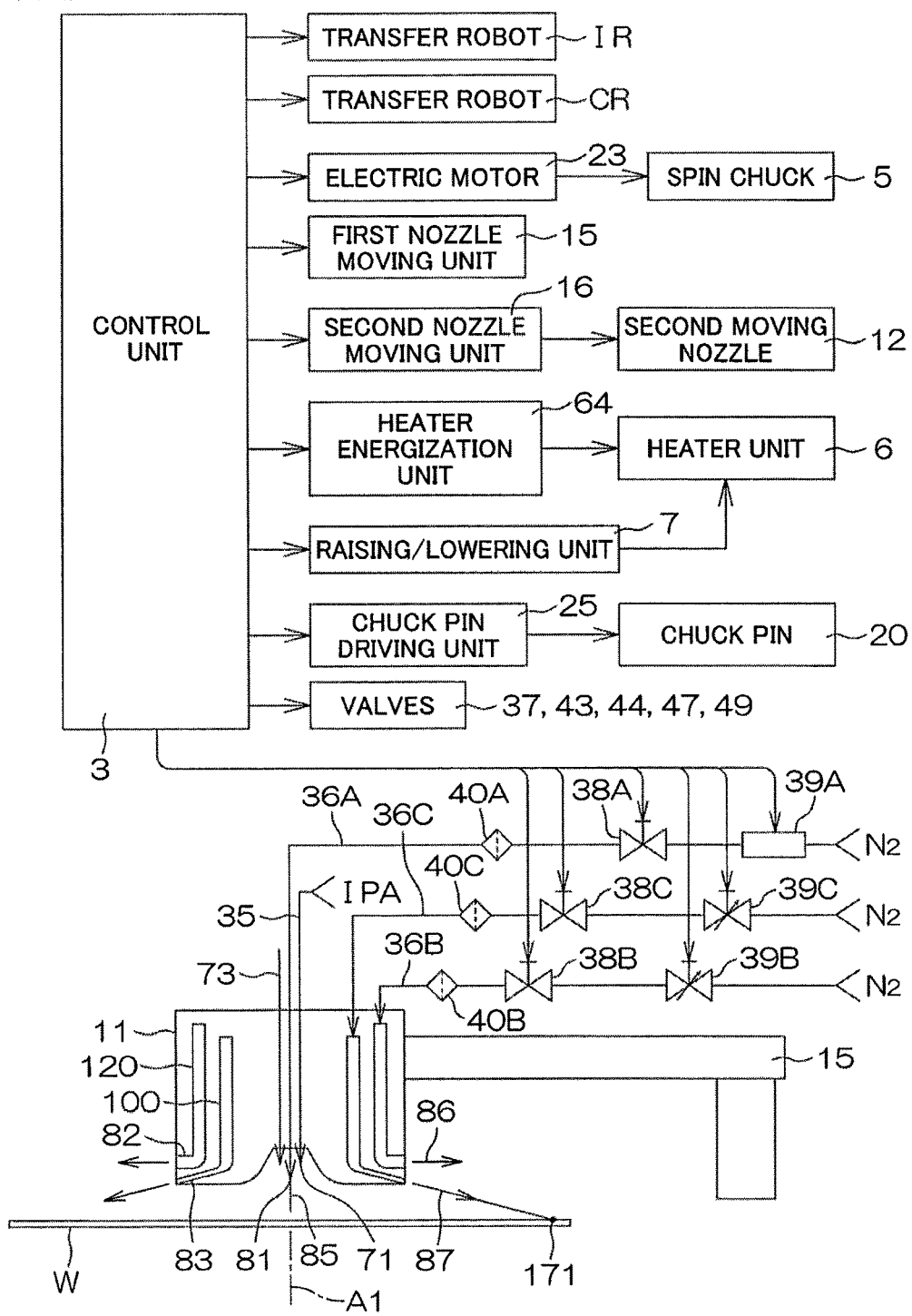
FIG. 7 is a block diagram for describing the electrical arrangement of a principal portion of the substrate processing apparatus.

FIG. 7 is a block diagram for describing the electrical arrangement of a principal portion of the substrate processing apparatus 1. The control unit 3 includes a microcomputer and controls control objects included in the substrate processing apparatus 1 in accordance with a predetermined control program. In particular, the control unit 3 controls operations of the transfer robots IR and CR, the electric motor 23 that performs rotational drive of the spin chuck 5, the first nozzle moving unit 15, the second nozzle moving unit 16, the heater energization unit 64, the raising/lowering unit 7 that raises and lowers the heater unit 6, the chuck pin driving unit 25, the valves 37, 43, 44, 47, and 49, etc. The control unit 3 also performs opening and closing control of the first to third inert gas valves 38A, 38B, and 38C. The control unit 3 further controls an opening degree of the mass flow controller 39A to control the flow rate of the inert gas passing through the inert gas supply pipe 36A. Also, the control unit 3 controls opening degrees of the variable flow valves 39B and 39C to control the flow rates of the inert gases passing through the inert gas supply pipes 36B and 36C.

Figure 8:
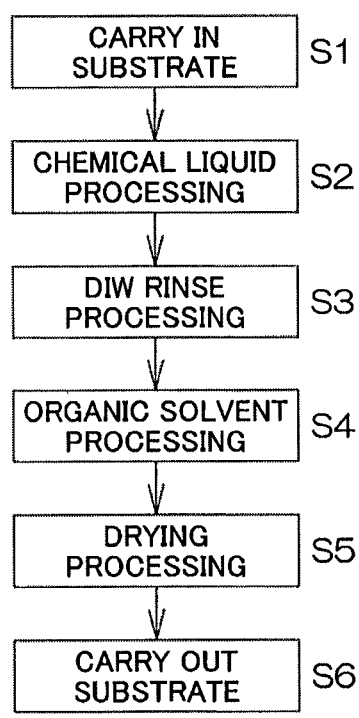
FIG. 8 is a flow diagram for describing an example of substrate processing performed by the substrate processing apparatus.

FIG. 8 is a flow diagram for describing an example of substrate processing performed by the substrate processing apparatus 1 and mainly shows a processing realized by the control unit 3 executing an operation program. An unprocessed substrate W is carried into a processing unit 2 from a carrier C and transferred to the spin chuck 5 by the transfer robots IR and CR (S1). In this process, the control unit 3 controls the raising/lowering unit 7 so that the heater unit 6 is disposed at the lower position. Also, the control unit 3 controls the chuck pin driving unit 25 so that the chuck pins 20 are put in the open state. In that state, the transfer robot CR transfers the substrate W to the spin chuck 5. Thereafter, the substrate W is held by the spin chuck 5 (substrate holding step) until it is carried out by the transfer robot CR. The substrate W is placed on the supporting portions 52 (supporting surfaces 52a) of the chuck pins 20 in the open state. Thereafter, the control unit 3 controls the chuck pin driving unit 25 to put the chuck pins 20 in the closed state. The substrate W is thereby gripped by the gripping portions 51 of the plurality of chuck pins 20.

After the transfer robot CR has retracted out of the processing unit 2, a chemical liquid processing (S2) is started. The control unit 3 drives the electric motor 23 to rotate the spin base 21 at a predetermined chemical liquid rotational speed. The control unit 3 controls the second nozzle moving unit 16 to dispose the second moving nozzle 12 at a chemical liquid processing position above the substrate W. The chemical liquid processing position may be a position at which the chemical liquid discharged from the second moving nozzle 12 lands on the rotation center of the upper surface of the substrate W. The control unit 3 then opens the chemical liquid valve 43. The chemical liquid is thereby supplied from the second moving nozzle 12 toward the upper surface of the substrate W in the rotating state. The supplied chemical liquid spreads across an entire surface of the substrate W due to a centrifugal force.

After the chemical processing of a fixed time, a DIW rinse processing (S3) of replacing the chemical liquid on the substrate W with DIW to remove the chemical liquid from the substrate W is executed. Specifically, the control unit 3 closes the chemical liquid valve 43 and opens the DIW valve 47 in its place. The DIW from the DIW nozzle 10 is thereby supplied toward the upper surface of the substrate W in the rotating state. The supplied DIW spreads across the entire surface of the substrate W due to the centrifugal force. The chemical liquid on the substrate W is rinsed off by the DIW. During this process, the control unit 3 controls the second nozzle moving unit 16 to make the second moving nozzle 12 retract from above the substrate W to a side of the cup 8.

After the DIW rinse processing of a fixed time, an organic solvent processing (S4) of replacing the DIW on the substrate W with an organic solvent, which is a processing liquid of lower surface tension (low surface tension liquid), is executed.

The control unit 3 controls the first nozzle moving unit 15 to make the first moving nozzle 11 move to an organic solvent rinse position above the substrate W. The organic solvent rinse position may be a position at which the organic solvent (for example, IPA), discharged from the central discharge port 71 (organic solvent nozzle; see FIG. 6C) included in the first moving nozzle 11, lands on the rotation center of the upper surface of the substrate W.

The control unit 3 then opens the inert gas valve 38B. From the parallel stream discharge port 82 of the first moving nozzle 11, an inert gas is thereby discharged radially and parallel to the upper surface of the substrate W from the center to the peripheral edge of the substrate W. The parallel gas stream 86, which is an inert gas stream that flows parallel to the upper surface of the substrate W, is thereby formed, and the entirety of the upper surface of the substrate W (to be accurate, a region outside the first moving nozzle 11 in a plan view) is covered by the parallel gas stream 86 (upper surface covering step).

In that state, the control unit 3 closes the DIW valve 47 and opens the organic solvent valve 37. The organic solvent (liquid) is thereby supplied from the first moving nozzle 11 (central discharge port 71) toward the upper surface of the substrate W in the rotating state. The supplied organic solvent spreads across the entire surface of the substrate W due to the centrifugal force and replaces the DIW on the substrate W. A liquid film of the organic solvent is thereby formed on the upper surface of the substrate W (liquid film forming step).

In the organic solvent processing, the control unit 3 controls the raising/lowering unit 7 to make the heater unit 6 rise toward the substrate W and thereby heats the substrate W. Also, the control unit 3 decelerates the rotation of the spin chuck 5 to stop the rotation of the substrate W and closes the organic solvent valve 37 to stop the supplying of the organic solvent. A puddle state, in which the organic solvent liquid film is supported on the substrate W in the stationary state, is thereby entered. A portion of the organic solvent in contact with the upper surface of the substrate W evaporates due to the heating of the substrate W and a gas phase layer is thereby formed between the organic solvent liquid film and the upper surface of the substrate W. The organic solvent liquid film in the state of being supported by the gas phase layer is removed.

In removing the organic solvent liquid film, the control unit 3 controls the first nozzle moving unit 15 to move the first moving nozzle 11 so that the linear stream discharge port 81 is positioned on the rotational axis A1 of the substrate W. The control unit 3 then opens the inert gas valve

38A to make the inert gas be discharged rectilinearly from the linear stream discharge port 81 toward the organic solvent liquid film on the substrate W (perpendicular gas discharging step). Thereby, at the position at which the discharge of the inert gas is received, that is, at the center of the substrate W, the organic solvent liquid film is removed by the inert gas and a hole, exposing the front surface of the substrate W, is opened in a center of the organic solvent liquid film (liquid film opening step). By spreading the hole, the organic solvent on the substrate W is expelled off the substrate W (liquid film removing step). The control unit 3 opens the inert gas valve 38C at an appropriate timing to push away the liquid film at an outer peripheral portion of the substrate W upper surface off the substrate W. An inert gas is thereby discharged radially (conically) in an outwardly oblique direction from the inclined stream discharge port 83 and the liquid film is pushed away to the outer side.

After the organic solvent processing is thus ended, the control unit 3 controls the electric motor 23 to perform high-speed rotation of the substrate W at a drying rotational speed. A drying processing (S5: spin drying) for spinning off the liquid components on the substrate W by centrifugal force is thereby performed.

Thereafter, the control unit 3 controls the first nozzle moving unit 15 to retract the first moving nozzle 11 and further controls the electric motor 23 to stop the rotation of the spin chuck 5. Also, the control unit 3 controls the raising/lowering unit 7 to control the heater unit 6 to the lower position. Further, the control unit 3 controls the chuck pin driving unit 25 to control the chuck pins 20 to the open position. The substrate W is thereby put in a state of being placed on the supporting portions 52 from the state of being gripped by the gripping portions 51 of the chuck pins 20. Thereafter, the transfer robot CR enters into the processing unit 2, scoops up the processed substrate W from the spin chuck 5, and carries it out of the processing unit 2 (S6). The substrate W is transferred from the transfer robot CR to the transfer robot IR and is housed in a carrier C by the transfer robot IR.

Figure 10A:
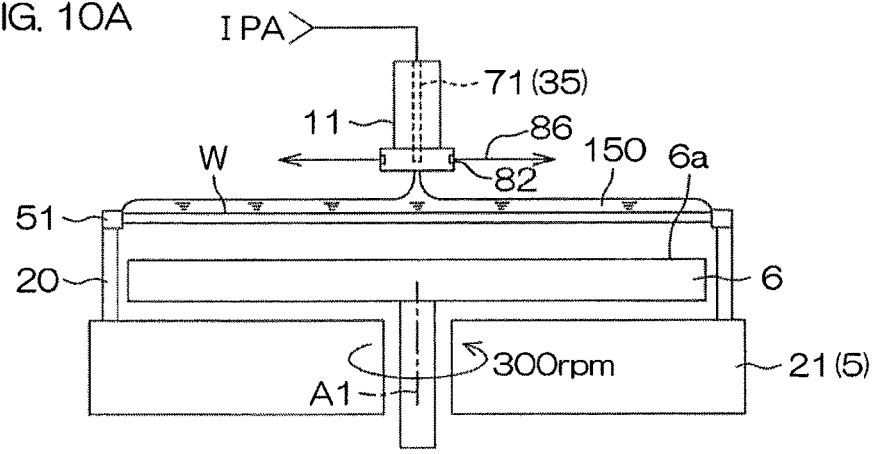
FIG. 10A to FIG. 10H are illustrative sectional views for describing conditions of the respective steps of the organic solvent processing (S4 of FIG. 8).

FIGS. 9A and 9B show a time chart for describing details of the organic solvent processing (S4 of FIG. 8). Also, FIG. 10A to FIG. 10H are illustrative sectional views for describing conditions of the respective steps of the organic solvent processing, and FIG. 10I is an illustrative sectional view for describing conditions of the drying processing (S5 of FIG. 8).

The organic solvent processing includes an organic solvent rinsing step T1, an organic solvent puddle step T2, a lifting puddle step T3, a temperature maintaining step T4, a hole opening step T5, a hole spreading step T6, and an outer periphery liquid dropping step T7 and these are executed successively.

The organic solvent rinsing step T1 is a step of supplying the organic solvent to the upper surface of the substrate W while rotating the substrate W (processing liquid supplying step, organic solvent supplying step, liquid film forming step). As shown in FIG. 10A, the organic solvent (for example, IPA) is supplied to the upper surface of the substrate W from the central discharge port 71. Also, the control unit 3 opens the inert gas valve 38B. An inert gas is thereby discharged radially from the parallel stream discharge port 82 of the first moving nozzle 11 and the upper surface of the substrate W is covered by the parallel gas stream 86 (upper surface covering step). The discharge of inert gas from the parallel stream discharge port 82 is preferably started before the organic solvent discharge from the central discharge port 71. A discharge flow rate of the inert gas from the parallel stream discharge port 82 may, for example, be approximately 100 liters/minute.

The supplied organic solvent receives the centrifugal force to be directed from the center toward the outer side of the upper surface of the substrate W and form the liquid film 150 covering the upper surface of the substrate W. By the liquid film 150 covering the entire upper surface of the substrate W, the DIW (another processing liquid) supplied to the upper surface of the substrate W in the DIW rinse processing (S3 of FIG. 8) is entirely replaced by the organic solvent. The upper surface of the substrate W is covered by the parallel gas stream 86 of inert gas and therefore liquid droplets splashed back from a processing chamber inner wall, mist in the atmosphere, etc., can be suppressed or prevented from becoming attached to the upper surface of the substrate W.

During the period of the organic solvent rinsing step T1, the substrate W is rotated at an organic solvent rinse processing speed (liquid supplying speed; for example, of approximately 300 rpm) by the spin chuck 5 (liquid supplying speed rotating step). The first moving nozzle 11 is disposed above the rotation center of the substrate W. The organic solvent valve 37 is put in the open state and therefore the organic solvent (for example, IPA) discharged from the central discharge port 71 is supplied from above toward the rotation center of the upper surface of the substrate W. The chuck pins 20 are put in the closed state so that the substrate W is gripped by the gripping portions 51 and rotates together with the spin chuck 5. The heater unit 6 is position-controlled to be at a position higher than the lower position and its heating surface 6a is disposed at a separated position separated downward by a predetermined distance (for example, 2 mm) from the lower surface of the substrate W. The substrate W is thereby preheated by radiant heat from the heating surface 6a (substrate preheating step). The temperature of the heating surface of the heater unit 6 is, for example, approximately 150° C. and is uniform within the surface. The second moving nozzle 12 is retracted at the home position at the side of the cup 8. The chemical liquid valve 43 and the inert gas valves 38A, 38C, and 44 are controlled to be in the closed states.

Figure 10B:
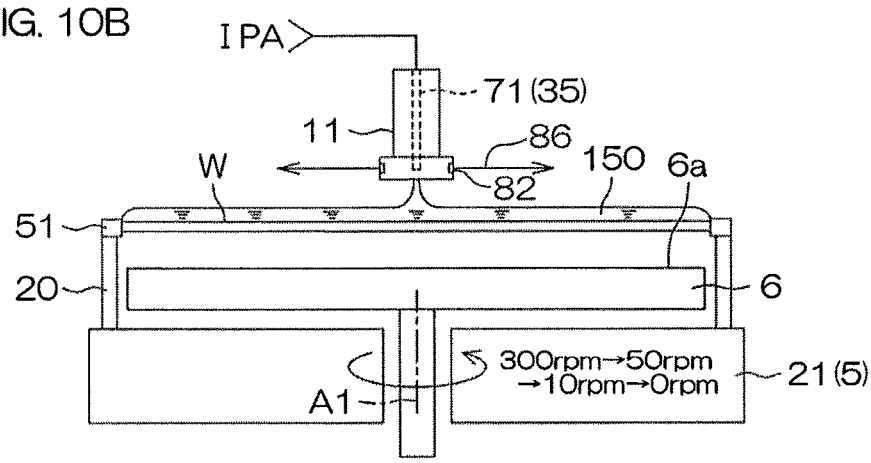

As shown in FIG. 10B, the organic solvent puddle step T2 is a step of decelerating and stopping the rotation of the substrate W to form a thick liquid film 150 of the organic solvent on the front surface of the substrate W.

In the present example, the rotation of the substrate W is decelerated stepwise from the organic solvent rinse processing speed (decelerating step, gradual decelerating step, stepwise decelerating step). More specifically, the rotational speed of the substrate W is decelerated from 300 rpm to 50 rpm and kept there for a predetermined time (for example, of 10 seconds), thereafter decelerated to 10 rpm and kept there for a predetermined time (for example, of 10 seconds), and thereafter decelerated to 0 rpm (stopped) and kept there for a predetermined time (for example, of 10 seconds). On the other hand, the first moving nozzle 11 is maintained on the rotational axis A1 and continues to discharge the organic solvent from the central discharge port 71 toward the rotation center of the upper surface of the substrate W and discharge the inert gas from the parallel stream discharge port 82 to form the parallel gas stream 86. The discharge of organic solvent from the central discharge port 71 is sustained over the entire period of the organic solvent puddle step T2. That is, the discharge of organic solvent is sustained even when the substrate W stops. By the supplying of organic solvent thus being sustained over the entire period from the deceleration to stoppage of the rotation of the substrate W, the processing liquid will not be depleted at any part of the upper surface of the substrate W. Also, by the supplying of organic solvent being sustained even after stoppage of the rotation of the substrate W, the thick liquid film 150 can be formed on the upper surface of the substrate W.

The position of the heater unit 6 is the same as the position during the organic solvent rinsing step and is the separated position at which the heating surface 6a is separated downward by the predetermined distance (for example, 2 mm) from the lower surface of the substrate W. The substrate W is thereby preheated by radiant heat from the heating surface 6a (substrate preheating step). After the rotation of the substrate W is stopped, the chuck pins 20 are switched from the closed state to the open state while the stopped state is maintained. A state is thereby entered where a peripheral edge portion lower surface of the substrate W is supported from below by the supporting portions 52 of the chuck pins 20 and the gripping portions 51 are separated from upper surface peripheral edge portions of the substrate W so that the entire upper surface of the substrate W is released. The second moving nozzle 12 remains at the home position.

Figure 10C:
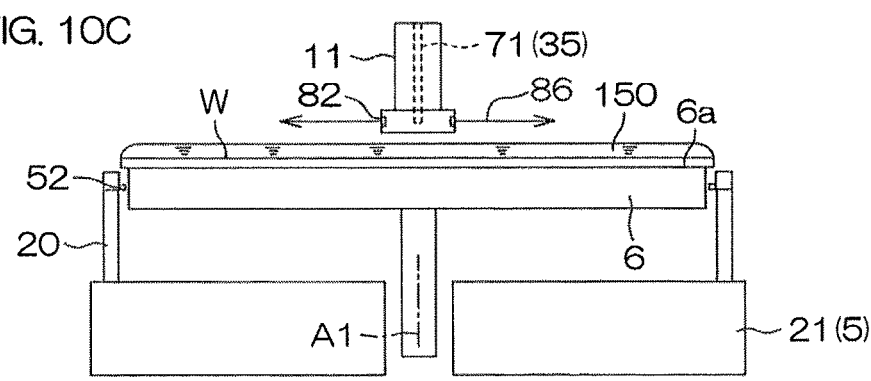

As shown in FIG. 10C, the lifting puddle step T3 is a step in which, in a state where the substrate W is lifted by the heater unit 6, that is, in a state where the heating surface 6a is put in contact with the lower surface of the substrate W, the organic solvent liquid film. 150 is maintained on the upper surface of the substrate W while heating the substrate W.

The heater unit 6 is raised from the separated position to the upper position and held there for a predetermined time (for example, of 10 seconds). In the process of raising the heater unit 6 to the upper position, the substrate W is transferred from the supporting portions 52 of the chuck pins 20 to the heating surface 6a and the substrate W becomes supported by heating surface 6a (more specifically, by the supporting pins 61; see FIG. 2) (heater unit approaching step, heater unit contacting step). The discharge of organic solvent from the first moving nozzle 11 (central discharge port 71) is sustained to a middle of the lifting puddle step T3. The supplying of organic solvent is thus sustained when the heating surface 6a of the heater unit 6 contacts the lower surface of the substrate W and rapid heating of the substrate W by heat conduction from the heating surface 6a is started to increase the heat amount applied to the substrate W (heat amount increasing step). Opening of holes at unspecified positions in the organic solvent liquid film 150 due to evaporation of the organic solvent in accompaniment with rapid temperature rise of the substrate W is thereby avoided. The supplying of organic solvent is stopped after a predetermined time elapses after the heating surface 6a of the heater unit 6 contacts the lower surface of the substrate W (after the heat amount increasing step) (supply stopping step). That is, the control unit 3 closes the organic solvent valve 37 to stop the discharge of organic solvent from the central discharge port 71.

The rotation of the spin chuck 5 is in the stopped state, the second moving nozzle 12 is at the home position, and the inert gas valve 44 is in the closed state. The first moving nozzle 11 (central discharge port 71) is positioned above the rotation center of the substrate W.

After the supplying of organic solvent has been stopped, the heater unit 6 is maintained at the upper position until a predetermined time elapses. The organic solvent supplied to the substrate W is pushed away to the outer peripheral side by the fresh organic solvent supplied to the center and, in this process, is heated and raised in temperature by the heat from the upper surface of the substrate W that is heated by the heater unit 6. In the period in which the supplying of organic solvent is sustained, the temperature of the organic solvent at a central region of the substrate W is comparatively low. Thus by maintaining the contacting state of the heater unit 6 for the short predetermined time after stoppage of the supplying of organic solvent, the organic solvent at the central region of the substrate W can be raised in temperature. The temperature of the organic solvent liquid film 150 supported on the upper surface of the substrate W can thereby be made uniform.

At the organic solvent liquid film 150 that receives heat from the upper surface of the substrate W, evaporation occurs at an interface with the upper surface of the substrate W. A gas phase layer, constituted of the gas of the organic solvent, is thereby formed between the upper surface of the substrate W and the organic solvent liquid film 150. The organic solvent liquid film 150 is thus put in a state of being supported by the gas phase layer across the entirety of the upper surface of the substrate W (gas phase layer forming step).

Figure 10D:
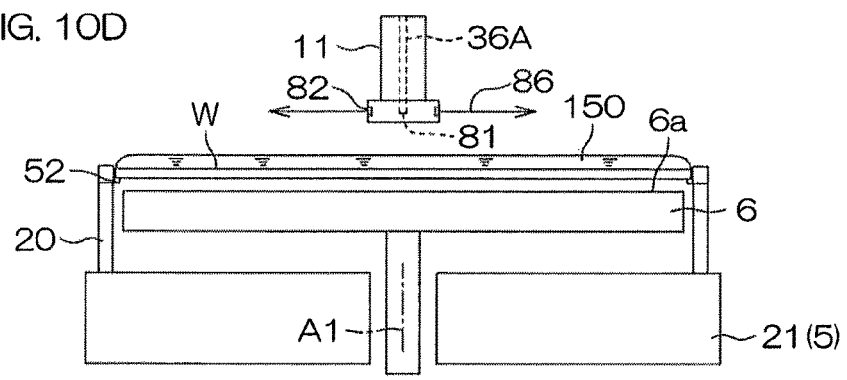

The temperature maintaining step T4 is a step of maintaining the temperature of the substrate W to maintain the gas phase layer and the organic solvent liquid film 150 while avoiding over heating of the substrate W. Specifically, the heater unit 6 is lowered slightly below from the upper position as shown in FIG. 10D. The substrate W is thereby transferred from the heater unit 6 to the supporting portions 52 of the chuck pins 20 and the heating surface 6a faces the lower surface of the substrate W in a non-contacting state of being spaced by an interval of a predetermined minute distance from the lower surface of the substrate W. The heating of the substrate W is thereby switched to heating by radiant heat from the heating surface 6a and the heat amount applied to the substrate W is decreased (heat amount decreasing step). Overheating of the substrate W is thereby avoided and formation of a crack in the organic solvent liquid film 150 (especially a crack in an outer peripheral region of the substrate W) due to evaporation is avoided.

Figure 10E:
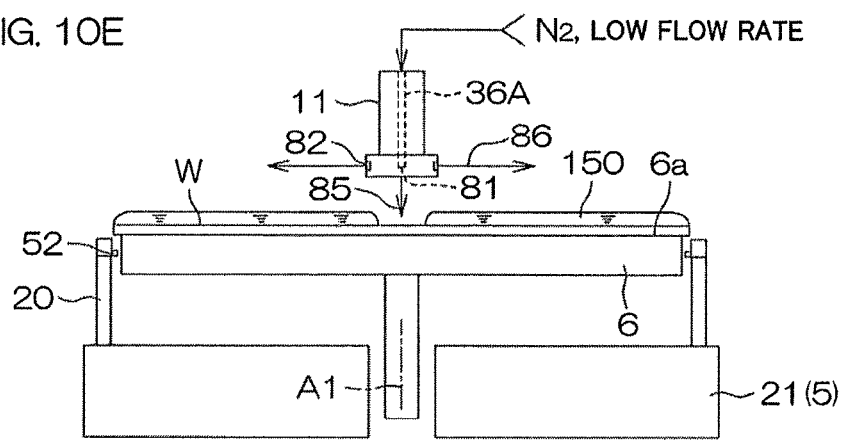
Figure 11A:
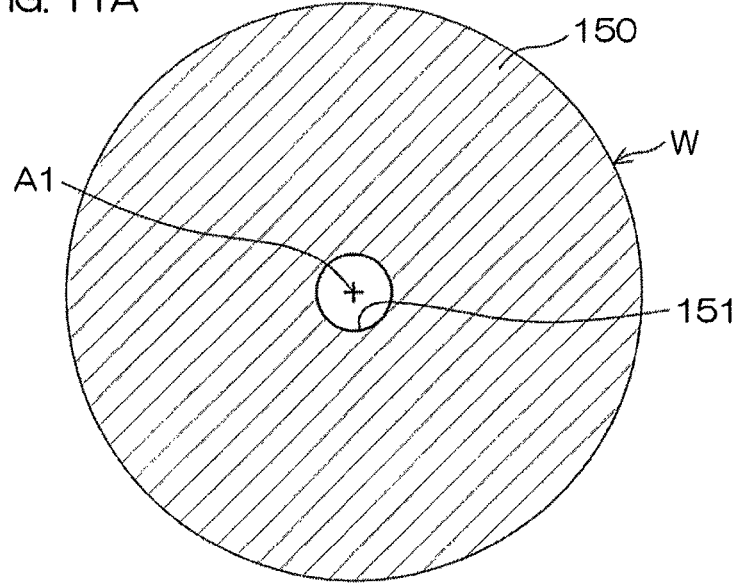
FIG. 11A is a plan view of the state of a liquid film in a hole opening step.

As shown in FIG. 10E, the hole opening step T5 is a step of blowing the linear gas stream 85 of an inert gas (for example, nitrogen gas) at a low flow rate (first flow rate, for example, of 3 liters/minute) perpendicularly toward the center of the substrate W from the linear stream discharge port 81 of the first moving nozzle 11 to open a small hole 151 in a central portion of the organic solvent liquid film 150 to thereby expose a central portion of the upper surface of the substrate W (perpendicular gas discharging step, hole opening step). The linear gas stream 85 is low in flow rate and therefore liquid splashing at the organic solvent liquid film 150 can be prevented or suppressed in opening the small hole 151 in the organic solvent liquid film 150. The rotation of the substrate W is kept in the stopped state and therefore the hole opening step is performed on the liquid film 150 on the substrate W in the stationary state. A plan view of a state where a hole is opened in the central portion of the organic solvent liquid film 150 is shown in FIG. 11A. For the sake of clarification, the organic solvent liquid film 150 is provided with hatching in FIG. 11A.

More specifically, the control unit 3 controls the first nozzle moving unit 15 to lower the first moving nozzle 11 to a central lower position and bring the first moving nozzle 11 close to the substrate W while sustaining the discharge of inert gas from the parallel stream discharge port 82. The parallel gas stream 86 formed by the inert gas discharged from the parallel stream discharge port 82 is thereby brought close to the upper surface of the substrate W. Also, the control unit 3 opens the inert gas valve 38A and controls the mass flow controller 39A to make an inert gas be discharged at a low flow rate from the linear stream discharge port 81. At substantially the same time as the discharge of inert gas, the heater unit 6 is raised. The heating surface 6a is thereby put in contact with the lower surface of the substrate W and the substrate W is lifted by the heater unit 6 at a delay of a minute amount of time (for example, 1 second) from the timing at which the small hole 151 is opened in the central portion of the organic solvent liquid film 150 by the inert gas.

Therefore, at the point at which the inert gas reaches the upper surface of the substrate W, the heat amount applied to the substrate W from the heater unit 6 is low, and a temperature difference between the upper and lower surfaces of the substrate W due to cooling of the substrate W by the inert gas and heating by the heater unit 6 can thereby be made small. Warping of the substrate W due to the temperature difference between the upper and lower surfaces of the substrate W can thereby be avoided. If when the inert gas is supplied, the heater unit 6 is put in contact with the lower surface of the substrate W, the temperature at the upper surface side of the substrate W will become lower than the temperature at the lower surface side and the substrate W may become warped in a manner such that the upper surface side is made concave. In this case, with the upper surface of the substrate W, the central portion becomes low and the peripheral edge portion becomes high so that movement of the organic solvent liquid film 150 to the outer side is obstructed. Thus in the present preferred embodiment, the inert gas is supplied to the upper surface center of the substrate W in the state where the heater unit 6 is separated from the lower surface of the substrate W to mitigate the temperature difference between the upper and lower surfaces of the substrate W.

On the other hand, rapid heating of the substrate W is started from immediately after (that is, at substantially the same time as) the opening of the hole in the organic solvent liquid film 150 (heat amount re-increasing step). The heating of the substrate W is thereby started promptly (at substantially the same time as) when the movement of the liquid film 150 to the outer side due to the opening of the hole by the inert gas is started, and the liquid film 150 is thereby made to move to the outer side of the substrate W without stopping.

Figure 10F:
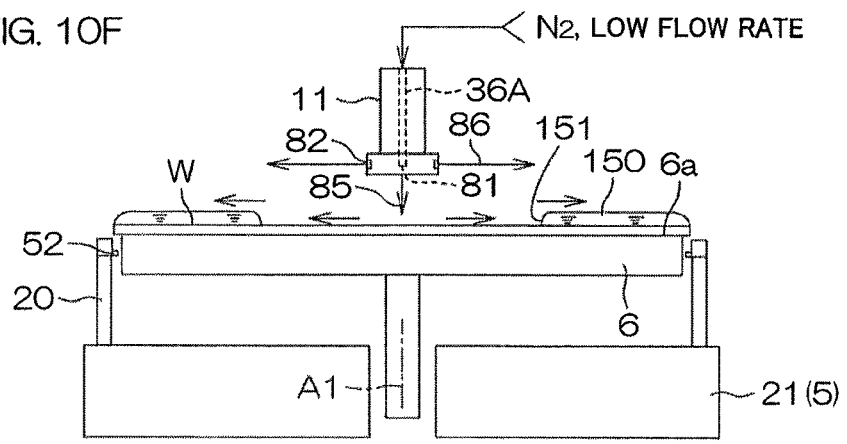

More specifically, in the central region in which the hole is opened and the liquid film 150 is gone, the temperature of the substrate W rises promptly in comparison to the surrounding region in which the liquid film 150 is present. A large temperature gradient thus arises within the substrate W at a peripheral edge of the hole 151. That is, the temperature becomes high at an inner side and becomes low at an outer side of the peripheral edge of the hole 151. As shown in FIG. 10F, the temperature gradient causes the organic solvent liquid film 150, supported on the gas phase layer, to begin moving toward the low temperature side, that is, toward the outer side and the hole 151 at the center of the organic solvent liquid film 150 thereby becomes enlarged.

The organic solvent liquid film 150 on the substrate W can thereby be removed off the substrate W using the temperature gradient that arises due to the heating of the substrate W (liquid film removing step, heating removing step, liquid film moving step). More specifically, at the upper surface of the substrate W, the liquid film 150 within a region in which a pattern is formed can be removed by movement of the organic solvent due to the temperature gradient.

If the heater unit 6 is put in contact with the substrate W after a long delay after the hole 151 has been formed at the rotation center of the substrate W by the blowing on of inert gas, the enlargement of the hole 151 stops in the middle. In this state, an inner peripheral edge of the liquid film 150 is put in an equilibrium state of being directed toward the inner side and directed toward the outer side. In this state, a liquid surface of the organic solvent may enter into a pattern formed on the front surface of the substrate W and may become a cause of pattern collapse due to surface tension. Thus in the present preferred embodiment, the heater unit 6 is put in contact with the lower surface of the substrate W at substantially the same time as the opening of the hole by the inert gas to instantaneously increase the heat amount applied to the substrate W.

Figure 10G:
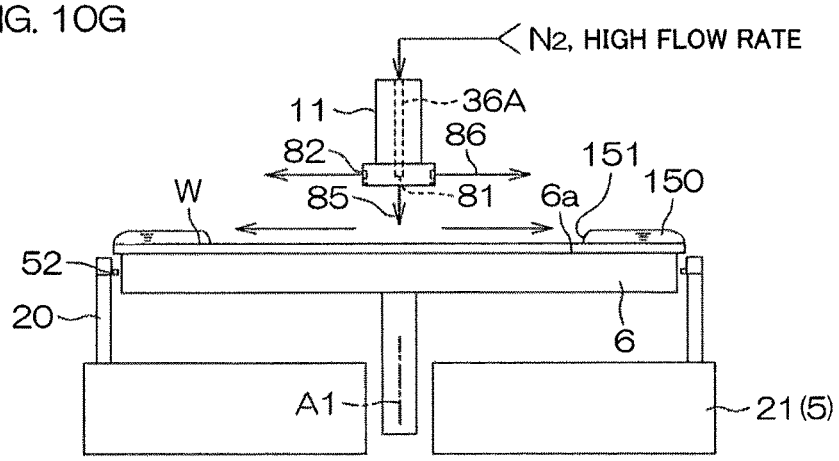

As shown in FIG. 10G, the hole spreading step T6 is a step of increasing the flow rate of the inert gas discharged from the linear stream discharge port 81 to blow the inert gas at a high flow rate (second flow rate; for example, of 30 liters/minute) onto the center of the substrate W to further spread the hole 151 at the center of the organic solvent liquid film 150 by means of the inert gas (liquid film removing step, perpendicular gas flow rate increasing step, gas removing step, liquid film moving step). That is, the control unit 3 controls the mass flow controller 39A to increase the flow rate of the inert gas supplied to the second moving nozzle 12. In accordance with the increase of flow rate, the flow speed also increases. By the increase of the inert gas flow rate, the liquid film 150, which has moved to the outer peripheral region of the upper surface of the substrate W, is pushed away further and off the substrate W. The rotation of the substrate W is maintained in the stopped state.

Specifically, by further increasing the flow rate of the inert gas while the hole 151 is being spread by the temperature gradient, stopping of the movement of the liquid film 150 can be avoided and the movement of the liquid film 150 to the outer side of the substrate W can be sustained. As shown in the plan view of FIG. 11B, with just the movement of the organic solvent liquid film 150 using the temperature gradient, the movement of the liquid film 150 may stop at a peripheral edge region of the upper surface of the substrate W. Thus by increasing the flow rate of the inert gas, the movement of the liquid film 150 can be assisted and the organic solvent liquid film 150 can thereby be removed from the entirety of the upper surface of the substrate W.

After the flow rate of the inert gas has been increased, the heater unit 6 is lowered and the substrate W is transferred from the heating surface 6a to the supporting portions 52 of the chuck pins 20. Thereafter, the chuck pins 20 are put in the closed state and the substrate W is gripped by the gripping portions 51 until the inert gas discharge at the high flow rate ends. In the example shown in FIGS. 9A and 9B, after the substrate W has been transferred to the chuck pins 20, the heater unit 6 is maintained for a short time at a non-contacting heating position of facing the lower surface of the substrate W across a minute distance and is thereafter lowered further and disposed at the separated position of facing the lower surface of the substrate W across the predetermined distance.

Figure 10H:
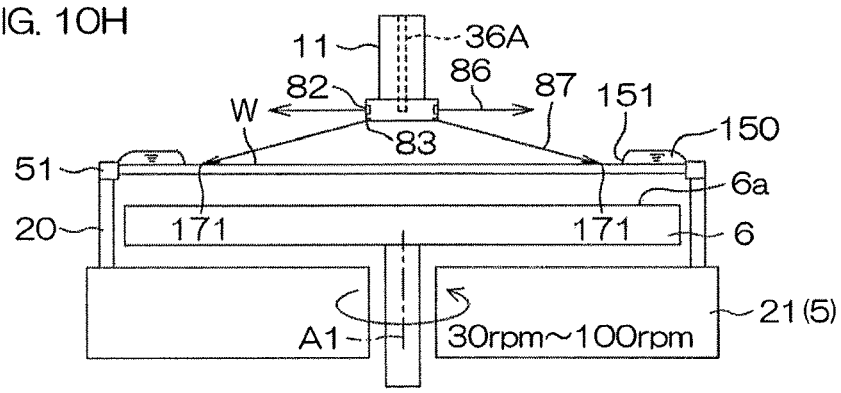
Figure 10:
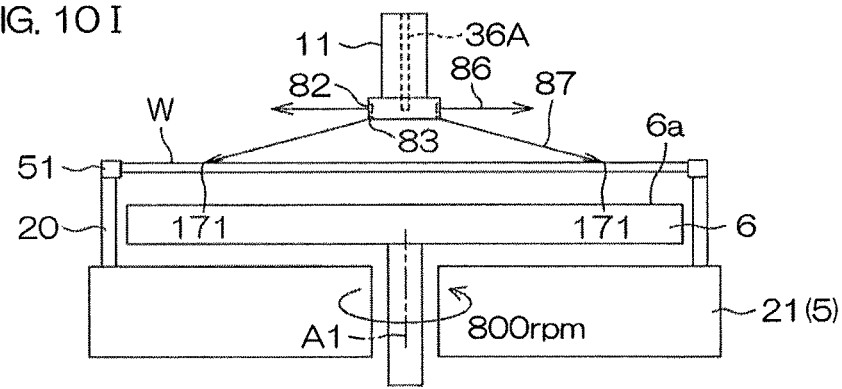
FIG. 10I is an illustrative sectional view for describing conditions of a drying processing (S5 of FIG. 8).

As shown in FIG. 10H, the outer periphery liquid dropping step T7 is a step of radially discharging an inert gas in an outwardly oblique direction from the inclined stream discharge port 83 (oblique gas discharging step) and rotating the substrate W to spin off the organic solvent liquid film remaining on the outer peripheral portion of the substrate W. After the substrate W has been gripped by the chuck pins 20, the spin chuck 5 is rotated at an outer periphery spinning-off speed that is a low speed. Specifically, the substrate W is rotated, along with the spin chuck 5, at, for example, 30 to 100 rpm. Meanwhile, the control unit 3 opens the inert gas valve 38C to make an inert gas be discharged from the inclined stream discharge port 83. The discharge flow rate may, for example, be approximately 100 liters/minute. The discharge of inert gas from the inclined stream discharge port 83 may be performed from before the rotation of the substrate W is started or may be started from before the substrate W is gripped by the chuck pins 20. The inert gas discharged from the inclined stream discharge port 83 forms a radial inclined gas stream 87 with a conical profile. The inclined gas stream 87 is directed toward a discharge target position 171 set at an intermediate position between the center and the peripheral edge of the substrate W (a position defined on a circumference centered at the rotational axis A1), collides against the substrate W at the discharge target position 171, and is then directed to the outside in parallel to the upper surface of the substrate W. The hole 151 in the liquid film 150 can thereby be spread to push away the liquid film 150 to the outer side of the substrate W.

The control unit 3 maintains the inert gas valve 38B in the open state and therefore the upper surface of the substrate W is covered by the parallel gas stream 86 formed by the inert gas discharged from the parallel stream discharge port 82. The liquid film 150 on the substrate W can thus be removed while suppressing or preventing foreign matter, such as liquid droplets, mist, etc., from becoming attached to the upper surface of the substrate W.

The discharge of inert gas from the inclined stream discharge port 83 is preferably started at a timing at which the peripheral edge of the hole 151 in the liquid film 150 reaches the discharge target position 171. That is, the control unit 3 opens the inert gas valve 38C at a timing adjusted to match the timing at which the peripheral edge of the hole 151 in the liquid film 150 reaches the discharge target position 171.

In succession to the outer periphery liquid dropping step T7, the spin drying step T8 (drying processing; S5 of FIG. 8) is executed as shown in FIG. 10I. The discharges of inert gases from the parallel stream discharge port 82 and the discharge of inert gas from the inclined stream discharge port 83 are sustained. The inclined gas stream 87 formed by the inert gas discharged from the inclined stream discharge port 83 collides against the upper surface of the substrate W and changes to a direction directed toward the outer side and parallel to the upper surface of the substrate W. The upper surface of the substrate W is thereby covered by two layers of inert gas streams that are parallel to the upper surface of the substrate W. In that state, the control unit 3 accelerates the rotation of the spin chuck 5 to a drying rotational speed (for example, of 800 rpm), which is a high speed. Liquid components on the front surface of the substrate W can thereby be spun off completely by the centrifugal force. The upper surface of the substrate W is covered by the inert gas streams, and liquid droplets, which have scattered to the surroundings and have splashed back, and mist in the surroundings can thereby be prevented from becoming attached to the upper surface of the substrate W.

After the spin drying step T8, the rotation of the spin chuck 5 is stopped and the heater unit 6 is lowered to the lower position. Also, the inert gas valves 38B and 38C are closed and the discharges of inert gases from the parallel stream discharge port 82 and the inclined stream discharge port 83 are stopped. The first moving nozzle 11 is moved to the home position. Thereafter, the control unit 3 puts the chuck pins 20 in the open state and makes the processed substrate W be carried out from the processing unit 2 by means of the transfer robot CR.

Figure 12A:
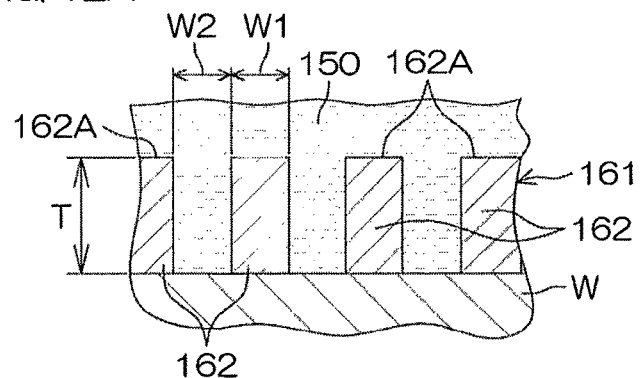
FIG. 12A and FIG. 12B are illustrative sectional views for describing the forming of a gas phase layer on a front surface of a substrate.
Figure 12B:
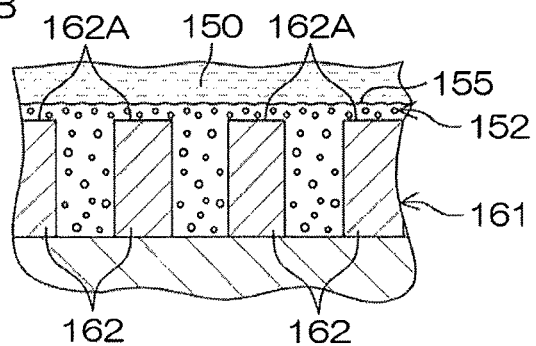

FIG. 12A and FIG. 12B are illustrative sectional views for describing the forming of the gas phase layer on the front surface of the substrate W. A fine pattern 161 is formed on the front surface of the substrate W. The pattern 161 includes fine projecting structures 162 formed on the front surface of the substrate W. The structures 162 may include an insulator film or may include a conductor film. Also, the structures 162 may be laminated films formed by laminating a plurality of films. If line-shaped structures 162 are adjacent to each other, a groove (groove) is formed in between. In this case, a width W1 of each structure 162 may be approximately 10 nm to 45 nm and an interval W2 between structures 162 may be approximately 10 nm to several µm. A height of each structure 162 may, for example, be approximately 50 nm to 5 µm. If a structure 162 is tubular, a hole is formed at the inner side thereof.

As shown in FIG. 12A, in the organic solvent puddle step T2, the organic solvent liquid film 150 formed on the front surface of the substrate W fills an interior (a space between adjacent structures 162 or an internal space of a tubular structure 162) of the pattern 161.

In the lifting puddle step T3, the substrate W is heated and its temperature becomes higher than a boiling point of the organic solvent (82.4° C. in the case of IPA) by a predetermined temperature (for example, 10 to 50° C.). The organic solvent in contact with the front surface of the substrate W thus evaporates and a gas of the organic solvent is formed to form the gas phase layer 152 as shown in FIG. 12B. The gas phase layer 152 fills the interior of the pattern 161 and further reaches the outside of the pattern 161 to form an interface 155 with the organic solvent liquid film 150 at a position higher than upper surfaces 162A of the structures 162. The organic solvent liquid film 150 is supported on the interface 155. In this state, a liquid surface of the organic solvent is not in contact with the pattern 161 and therefore pattern collapse due to surface tension of the organic solvent liquid film 150 does not occur.

When the organic solvent evaporates due to heating of the substrate W, the organic solvent of the liquid phase is expelled instantaneously from inside the pattern 161. The organic solvent of the liquid phase is then supported on the formed gas phase layer 152 and is separated from the pattern 161. The gas phase layer 152 of the organic solvent is thus interposed between the upper surface of the pattern 161 (the upper surfaces 162A of the structures 162) and the organic solvent liquid film 150 and supports the organic solvent liquid film 150.

Figure 12C:
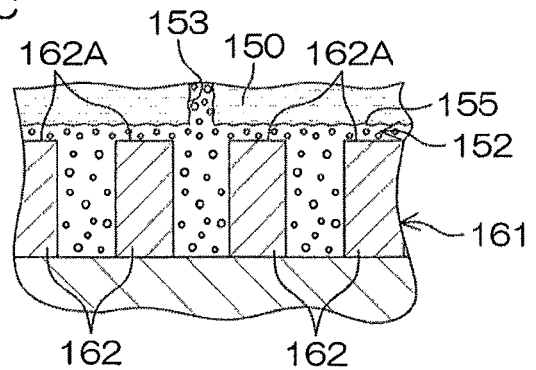
FIG. 12C is a sectional view for describing the splitting of a liquid film.

As shown in FIG. 12C, when a crack 153 forms in the organic solvent liquid film 150 that is floated from the upper surface of the substrate W, this becomes a cause of a defect, such as a watermark, etc., after drying. Therefore in the present preferred embodiment, the supplying of the organic solvent is stopped after stopping the rotation of the substrate W to form a thick organic solvent liquid film 150 on the substrate W and avoid the formation of a crack. When the heater unit 6 is made to contact the substrate W, the rotation of the substrate W is stopped so that the liquid film 150 will not become split due to the centrifugal force and the formation of a crack in the liquid film 150 can thus be avoided. Further, the output of the heater unit 6 and the time of contact with the substrate W are adjusted so that a vapor of the organic solvent will not break and blow out through the liquid film 150 and the formation of a crack is thereby avoided. More specifically, in the temperature maintaining step T4, overheating of the substrate W is avoided by separating the heater unit 6 from the substrate W and the formation of a crack in the organic solvent liquid film 150 is thereby avoided.

In the state where the organic solvent liquid film 150 is supported on the gas phase layer 152, a frictional resistance acting on the organic solvent liquid film 150 is small enough to be treated as zero. The organic solvent liquid film 150 is thus easily moved when a force in a direction parallel to the upper surface of the substrate W is applied to the organic solvent liquid film 150. In the present preferred embodiment, a hole is opened in the center of the organic solvent liquid film 150 and a flow of the organic solvent is thereby made to be caused by the temperature difference at the edge portion of the hole 151 to move and remove the organic solvent liquid film 150 supported on the gas phase layer 152.

Figure 13B:
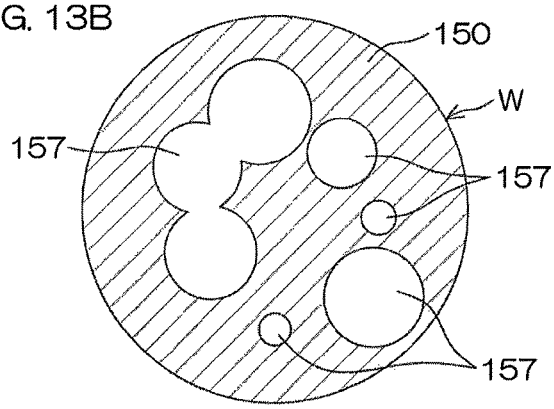
Figure 13C:
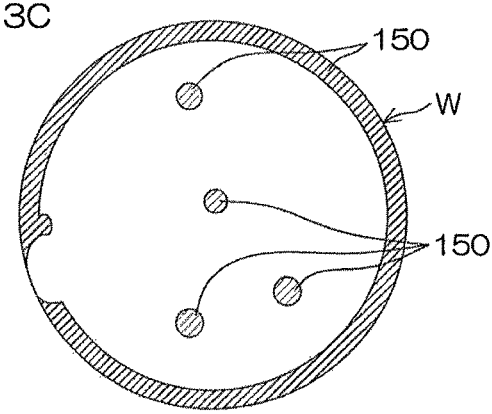

FIG. 13A, FIG. 13B, and FIG. 13C are illustrative plan views for describing an issues in a case (comparative example) where the hole opening step T5 and the hole spreading step T6 are omitted. For the sake of clarification, the organic solvent liquid film 150 is provided with hatching in FIG. 13A to FIG. 13C.

When, from the state where the organic solvent liquid film 150 covering the entire upper surface of the substrate W in the stationary state is formed, the heater unit 6 is put in contact with the substrate W and the heating of the substrate W is sustained, evaporation of the liquid phase organic solvent progresses and eventually, the liquid phase layer becomes depleted at some position on the substrate W. If the hole opening step T5 is omitted, the liquid phase layer becomes depleted at a plurality of unspecified positions on the substrate W and a plurality of holes 157 are thereby formed as shown in FIG. 13A. At the positions at which the liquid phase layer has become depleted, the temperature of the substrate W rises and therefore each of the plurality of holes 157 spreads due to temperature difference as shown in FIG. 13B. However, when drying thus begins from a plurality of unspecified positions, a plurality of separated liquid films 150 become dispersed and remain at a plurality of positions on the substrate W as shown in FIG. 13C. The remaining liquid films 150 become a cause of particles and pattern collapse.

Thus in the present preferred embodiment, an inert gas is blown onto the center of the substrate W in the state where the liquid film 150 on the gas phase layer 152 covers the entirety of the substrate W upper surface to open a single hole 151 in the liquid film 150 (hole opening step T5). Removal of the organic solvent liquid film 150 is thereby made to start from the single hole 151 to enable the organic solvent liquid film 150 to be removed off the substrate W without causing the remaining of liquid. Moreover, the organic solvent liquid film 150 is removed by spreading the hole 151 in the state where the rotation of the substrate W is stopped and therefore the splitting of the organic solvent liquid film 150 due to centrifugal force can be avoided.

As described above, with the present preferred embodiment, after the DIW rinse processing, the DIW on the front surface of the substrate W is replaced by the organic solvent to form the organic solvent liquid film 150 that covers the entire upper surface of the substrate W. The rotation of the substrate W is decelerated and stopped while maintaining the state where organic solvent liquid film 150 covers the entire upper surface of the substrate W. The supplying of the organic solvent is sustained until the rotation of the substrate W stops and further until the heater unit 6 contacts the lower surface of the substrate W, and the supplying of the organic solvent is stopped thereafter. The thick liquid film 150 of the organic solvent is thereby formed on the upper surface of the substrate W and a crack does not form in the liquid film 150 even upon rapid temperature rise of the substrate W due to contacting of the heater unit 6. The gas phase layer 152 of the organic solvent is thus formed between the upper surface of the substrate W and the liquid film 150 across the entire upper surface of the substrate W by heating of the substrate W by means of the heater unit 6 while constantly maintaining the state where the organic solvent liquid film 150 covers the upper surface of the substrate W. The gas phase layer 152 fills the interior of the pattern on the front surface of the substrate W and has an interface with the liquid film 150 at a position higher than the upper surface of the pattern. A liquid surface of the organic solvent is thus not present inside the pattern and therefore surface tension is not applied to the pattern. Therefore by the liquid film 150, in the state of being supported by the gas phase layer 152, being removed off the substrate W, pattern collapse can be suppressed or prevented.

In the present preferred embodiment, in removing the liquid film 150, the linear gas stream 85 of inert gas is discharged in the direction perpendicular to the upper surface of the substrate W toward the center of the film and the single hole 151 is thereby formed. The single hole 151 is pushed and spread toward the outer side by the movement of the liquid film 150 due to the temperature gradient and the high flow rate supplying of inert gas. In this process, the rotation of the substrate W is stopped and therefore the liquid film 150 moves on the gas phase layer 152 to the outer side of the substrate W and becomes removed off the substrate W while maintaining a large thickness and without splitting. In addition to the temperature gradient, the movement of the liquid film 150 is assisted by the high flow rate supplying of inert gas and therefore the movement of the liquid film 150 does not stop in the middle and the organic solvent does not return to the inner side of the substrate W to form its liquid surface inside a pattern. Pattern collapse in the process of removing the organic solvent liquid film 150 can thereby be avoided. Further, the liquid film 150 that has been pushed away to the outer peripheral region is pushed away further to the outer side by the inclined gas stream 87 with the conical profile and is spun off by the low-speed rotation of the substrate W. The liquid film 150 is thereby removed completely from the front surface of the substrate W.

The organic solvent liquid film 150 is thus maintained in the state of covering the entire upper surface of the substrate W until the gas phase layer 152 is formed and thereafter, when removal from the substrate W is started, is guided to the outer side of the substrate W without splitting or stopping. The liquid components on the substrate W can thereby be removed while effectively suppressing or preventing the collapse of a pattern on the substrate W.

Also, an inert gas is discharged from the parallel stream discharge port 82 from before the start of discharge of the organic solvent and the parallel gas stream 86 covering the upper surface of the substrate W is formed thereby. The formation and removal of the liquid film 150 of the organic solvent can thereby be performed while avoiding the attachment of splashed-back liquid and mist in the atmosphere onto the front surface of the substrate W. Substrate processing of high quality can thereby be realized.

The first moving nozzle 11 has the inert gas supply pipe 36A as a fluid passage corresponding to the linear discharge port 81, the fluid passage 120 corresponding to the parallel stream discharge port 82, and the fluid passage 100 corresponding to the inclined stream discharge port 83, and these are respectively independent fluid passages. The discharges of inert gases from the discharge ports 81, 82, and 83 can thus be controlled individually. The hole opening step, hole spreading step, outer periphery liquid dropping step, and the spin drying step can thus be performed with the first moving nozzle 11 being kept disposed on the rotational axis A1.

Also with the present preferred embodiment, the first moving nozzle 11 includes the central discharge port 71 (organic solvent supply pipe 35) that discharges the organic solvent. The step of forming the liquid film of the organic solvent (organic solvent rinsing step, organic solvent puddle step) and the step of forming the gas phase layer that supports the organic solvent liquid film (lifting puddle step, temperature maintaining step) can also be performed with the first moving nozzle 11 being kept disposed on the rotational axis A1. These steps can thus be executed in the state where a space above the substrate W is protected by the parallel gas stream 86 formed by the inert gas discharged from the parallel stream discharge port 82.

FIGS. 14A and 14B show a time chart, illustrated in the same manner as FIGS. 9A and 9B, for describing a modification example related to the discharge of inert gas from the inclined stream discharge port 83.

In the present modification example, the flow rate of the inert gas discharged from the inclined stream discharge port 83 is increased gradually (stepwise in the example of FIGS. 14A and 14B) in the outer periphery liquid dropping step T7, as indicated by reference symbol 181 (oblique gas flow rate increasing step). More specifically, the control unit 3 increases the opening degree of the variable flow valve 39C gradually to increase the flow rate of the inert gas discharged from the inclined stream discharge port 83. The flow speed also increases in accordance with the flow rate. The gradual increase of the flow rate may be a stepwise increase or may be a continuous increase. An example where the flow rate is increased stepwise is shown in FIGS. 14A and 14B.

By thus increasing the flow rate of the inert gas discharged from the inclined stream discharge port 83 gradually, a force directed further toward the outer side can be made to act reliably on the liquid film that is pushed away to the outer side of the substrate W. The liquid film on the substrate W can thereby be removed more reliably.

FIGS. 15A and 15B show a time chart, illustrated in the same manner as FIGS. 14A and 14B, of a modification example where the up/down direction position of the first moving nozzle is varied in the period in which an inert gas is discharged from the inclined stream discharge port 83.

In the present modification example, the first moving nozzle 11 is raised gradually along the rotational axis A1 (that is, along the central axis 70) from the central lower position in the outer periphery liquid dropping step T7 as indicated by reference symbol 182. That is, the control unit 3 controls the first nozzle moving unit 15 (example of a distance adjusting unit) to raise the first moving nozzle 11 gradually. The inclined stream discharge port 83 is thereby raised so that the discharge target position 171 on the substrate W upper surface of the inert gas discharged from the inclined stream discharge port 83 is gradually moved to the peripheral edge side of the substrate W (discharge target position moving step). The discharge target position 171 is thus moved to the peripheral edge side of the substrate W so as to follow the peripheral edge of the hole formed in the organic solvent liquid film as the peripheral edge spreads to the outer side. The inclined gas stream 87 formed by the inert gas discharged from the inclined stream discharge port 83 thus scans the outer peripheral region of the substrate W toward the outer side. The inclined gas stream 87 thus applies a force that reliably pushes away the liquid film on the substrate W to the outer side. The liquid film on the substrate W can thereby be removed more reliably.

Although with the example of FIGS. 15A and 15B, the gradual rise of the first moving nozzle 11 is a continuous rise of fixed rising speed, the first moving nozzle 11 may be raised stepwise instead.

Also with the modification example of FIGS. 15A and 15B, the flow rate of the inert gas discharged from the inclined stream discharge port 83 is increased gradually, in accordance with the rise of the first moving nozzle 11, as indicated by reference symbol 183. That is, the control unit 3 controls the variable flow valve 39C to gradually increase the flow rate of the inert gas supplied to the inclined stream discharge port 83. The flow rate of discharge from the inclined stream discharge port 83 can thereby be increased so as to compensate for the increase of distance from the inclined stream discharge port 83 to the discharge target position 171 with the rising of the first moving nozzle 11. The liquid film can thereby be removed off the substrate W more reliably.

Although an example where the flow rate of discharge from the inclined stream discharge port 83 is increased continuously is shown in FIGS. 15A and 15B, the gradual increase of discharge flow rate may be a stepwise increase as in the example shown in FIGS. 14A and 14B. Also, the flow rate of discharge from the inclined stream discharge port 83 may be kept fixed in the process of raising the first moving nozzle 11 to move the discharge target position.

Figure 16:
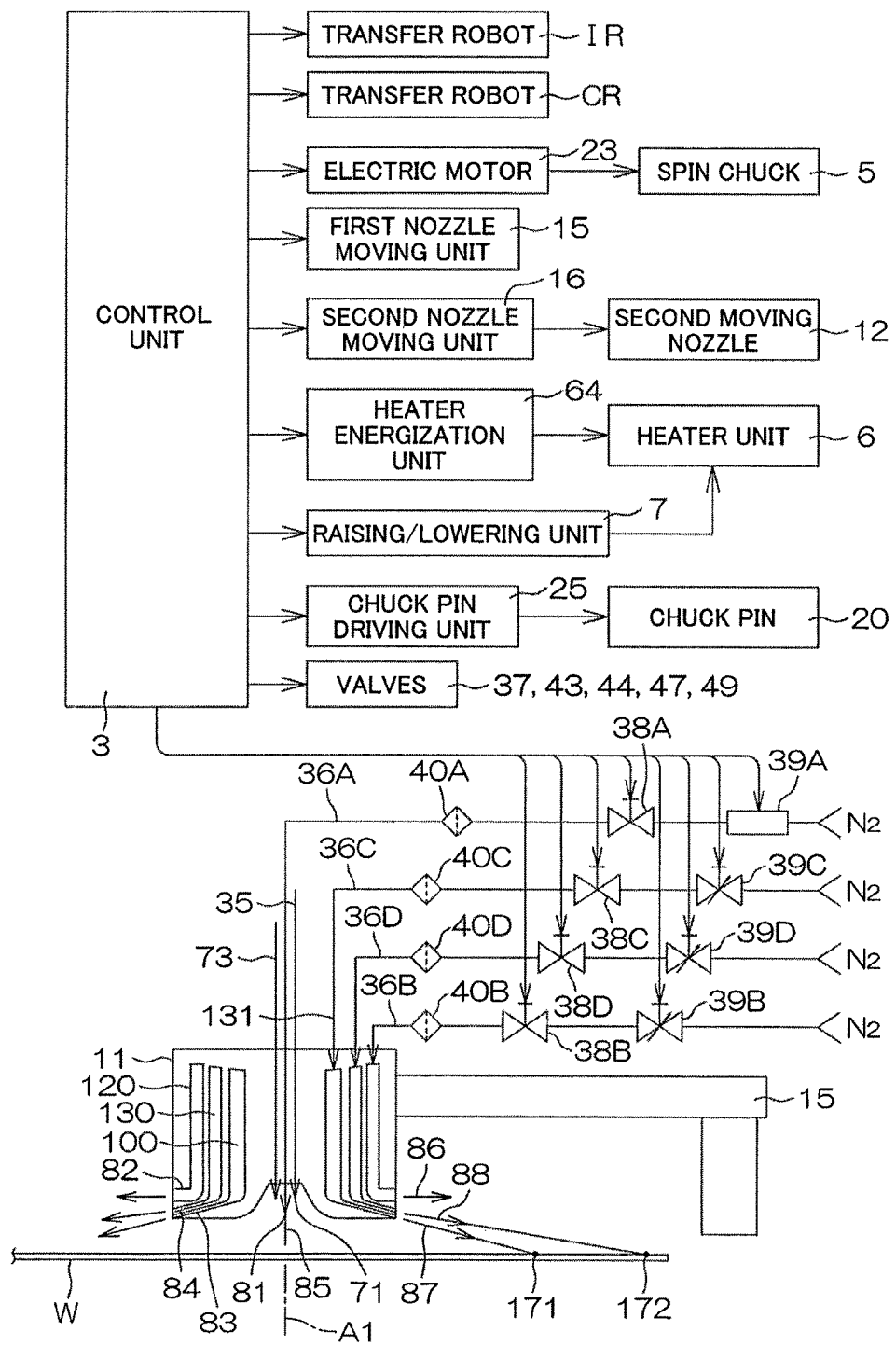
FIG. 16 is a conceptual diagram for describing another preferred embodiment of the present invention and shows another arrangement example of the first moving nozzle.

FIG. 16 is a conceptual diagram for describing a second preferred embodiment of the present invention and shows another arrangement example of the first moving nozzle 11. In the present preferred embodiment, the first moving nozzle 11 has an inclined stream discharge port 84 that is separate from the inclined stream discharge port 83. More specifically, a first inclined stream discharge port 83 is disposed below the parallel stream discharge port 82 and further, a second inclined stream discharge port 84 is disposed between the parallel stream discharge port 82 and the first inclined stream discharge port 83. The first inclined stream discharge port 83 and the second inclined stream discharge port 84 discharge inert gases radially to first and second discharge target positions 171 and 172 that are set at intermediate positions on the upper surface of the substrate W between the center and the peripheral edge of the substrate W.

More specifically, the inert gas discharged from the first inclined stream discharge port 83 forms a first inclined gas stream 87 with a conical profile toward the first discharge target position 171, which is a position on a circumference centered at the rotational axis A1. Similarly, the inert gas discharged from the second inclined stream discharge port 84 forms a second inclined gas stream 88 with a conical profile toward the second discharge target position 172, which is a position on a circumference centered at the rotational axis A1. The second discharge target position 172 is disposed at a position further to the outside, that is, further from the rotational axis A1 than the first discharge target position 171.

The second inclined stream discharge port 84 is in communication with a fluid passage 130 (fourth fluid passage) formed inside the first moving nozzle 11. The fluid passage 130 is in communication with a fluid inlet 131 (fourth fluid inlet) of the first moving nozzle 11 and thereby puts the fluid inlet 131 and the second inclined stream discharge port 84 in communication. The fluid passage 130 is an independent fluid passage that is not in communication with either of the fluid passages 100 and 120 inside the first moving nozzle 11 and is also not in communication with the flow passage of the first inert gas supply pipe 36A.

A fourth inert gas supply pipe 36D is connected to the fluid inlet 131. The fourth inert gas supply pipe 36D supplies an inert gas (for example, nitrogen gas) from an inert gas supply source to the fluid inlet 131. In the fourth inert gas supply pipe 36D are interposed an inert gas valve 38D that opens and closes a flow passage of the pipe, a variable flow valve 39D that adjusts an opening degree of the flow passage to vary a flow rate, and a filter 40D arranged to remove foreign matter. The inert gas valve 38D and the variable flow valve 39D are controlled by the control unit 3.

FIGS. 17A and 17B show a time chart, illustrated in the same manner as FIGS. 9A and 9B, for describing processing contents.

With the present preferred embodiment, inert gas discharge from the first inclined stream discharge port 83 is started as indicated by reference symbol 185 from a middle of the hole opening step T6, and the discharge is sustained until the end of the spin drying step T8. On the other hand, in the outer periphery liquid dropping step T7, inert gas discharge from the second inclined stream discharge port 84 is started as indicated by reference symbol 186 and the discharge is sustained until the end of the spin drying step T8. Such discharges of inert gases are achieved by the control unit 3 controlling the inert gas valves 38C and 38D.

The discharge of inert gas from the first inclined stream discharge port 83 is preferably started at a timing at which (more preferably, at a timing immediately after) the peripheral edge of the hole formed in the liquid film on the substrate W reaches the first discharge target position 171. Similarly, the discharge of inert gas from the second inclined stream discharge port 84 is preferably started at a timing at which (more preferably, at a timing immediately after) the peripheral edge of the hole formed in the liquid film on the substrate W reaches the second discharge target position 172.

By thus starting the discharges of inert gases from the first inclined stream discharge port 83 and the second inclined stream discharge port 84 successively, the liquid film can be pushed away to the outer side of the substrate W and be removed reliably in accordance with the position of the liquid film on the substrate W.

In the present preferred embodiment, the control unit 3 may control the variable flow valve 39C to perform gradual (stepwise or continuous) increase of the flow rate of the inert gas discharged from the first inclined stream discharge port 83. Similarly, the control unit 3 may control the variable flow valve 39D to perform gradual (stepwise or continuous) increase of the flow rate of the inert gas discharged from the second inclined stream discharge port 84.

Further, the control unit 3 may, for example, control the first nozzle moving unit 15 to perform gradual (stepwise or continuous) raising of the first moving nozzle 11 to move it away from the front surface of the substrate W after starting the discharge of inert gas from the second inclined stream discharge port 84. The first discharge target position 171 and the second discharge target position 172 are thereby moved to the outer side of the substrate W and the upper surface of the substrate W can be scanned toward the outer side of the substrate W by the first inclined gas stream 87 and the second inclined gas stream 88. The liquid film on the substrate W can thereby be removed more reliably and efficiently.

The first inclined gas stream 87 and the second inclined gas stream 88 collide against the upper surface of the substrate W and are changed in direction to outward directions parallel to the upper surface of the substrate W. Therefore, in the spin drying process, together with the parallel gas stream 86, three layers of parallel gas streams are formed on the substrate W. The substrate W can thereby be dried while avoiding the attachment of liquid droplets and mist onto the upper surface of the substrate W.

FIG. 18 is a block diagram for describing the arrangement related to control of a substrate processing apparatus according to a third preferred embodiment of the present invention. In FIG. 18, portions corresponding to portions shown in FIG. 16 of the above description shall be provided with the same reference symbols.

In the present preferred embodiment, an image taking unit 140 that takes an image of the upper surface of the substrate W held by the spin chuck 5 is included. Image data output by the image taking unit 140 are input into the control unit 3.

Figure 19:
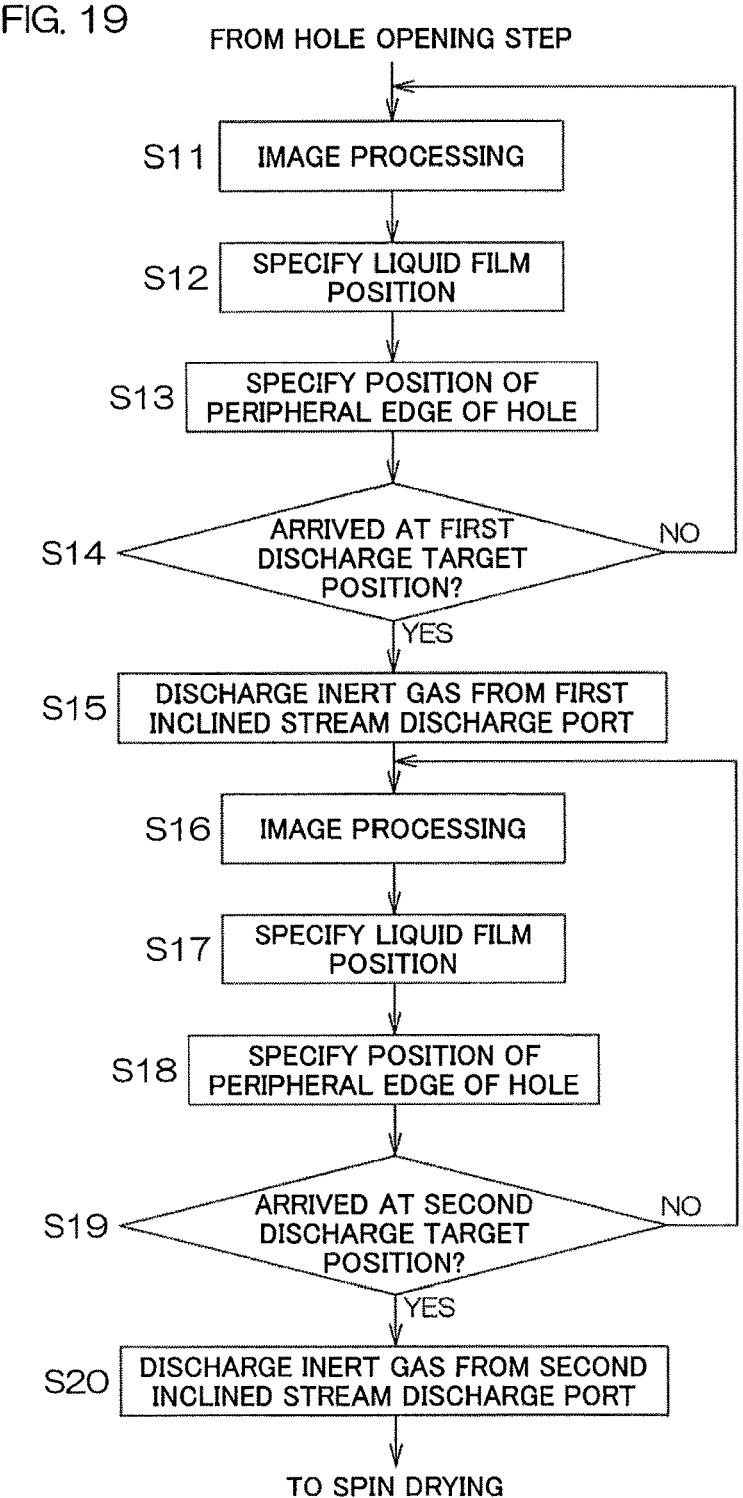
FIG. 19 is a flowchart for describing control contents of the preferred embodiment of FIG. 18.

FIG. 19 is a flowchart for describing a processing executed by the control unit 3 using the image data output by the image taking unit 140 after the hole opening step T5. The control unit 3 processes an image output by the image taking unit 140 (step S11) and uses the processing result to specify the position of the liquid film on the substrate W (step S12). Further, the control unit 3 specifies the position of the peripheral edge of the hole formed in the liquid film on the substrate W (step S13, peripheral edge detecting step).

Further, the control unit 3 judges whether or not the specified peripheral edge position has reached the first discharge target position 171 corresponding to the first inclined stream discharge port 83 and more specifically judges whether or not the peripheral edge is positioned at or further to the outer side than the first discharge target position 171 (step S14). Even more specifically, it is judged whether or not the portion of the peripheral edge of the hole that is closest to the rotational axis A1 is positioned at or further to the outer side than the first discharge target position 171. Until a positive judgment is made, the control unit 3 repeats the processing from step S11. When the peripheral edge of the hole formed in the liquid film reaches the first discharge target position 171 (step S14: YES), the control unit 3 starts the discharge of inert gas from the first inclined stream discharge port 83 (step S15).

After the discharge of inert gas from the first inclined stream discharge port 83 has been started, the control unit 3 further acquires the image data output by the image taking unit 140 and performs image processing (step S16). The control unit 3 uses the processing result to specify the position of the liquid film on the substrate W (step S17). Further, the control unit 3 specifies the position of the peripheral edge of the hole formed in the liquid film on the substrate W (step S18, peripheral edge detecting step).

Further, the control unit 3 judges whether or not the specified peripheral edge position has reached the second discharge target position 172 corresponding to the second inclined stream discharge port 84 and more specifically judges whether or not the peripheral edge is positioned at or further to the outer side than the second discharge target position 172 (step S19). Even more specifically, it is judged whether or not the portion of the peripheral edge of the hole that is closest to the rotational axis A1 is positioned at or further to the outer side than the second discharge target position 172. Until a positive judgment is made, the control unit 3 repeats the processing from step S16. When the peripheral edge of the hole formed in the liquid film reaches the second discharge target position 172 (step S19: YES), the control unit 3 starts the discharge of inert gas from the second inclined stream discharge port 84 (step S20). After the elapse of a predetermined time thereafter, the spin drying step is started.

Thus with the present preferred embodiment, a liquid film position detecting unit, which detects the position of the liquid film on the substrate W, is arranged by functions of the image taking unit 140 and the control unit 3. The control unit 3 also has a function of a position specifying unit that specifies the position of the peripheral edge of the hole based on the image data output by the image taking unit 140.

With the present preferred embodiment, the position of the liquid film on the substrate W is detected and the discharges of inert gases from the inclined stream discharge ports 83 and 84 are controlled based on the detection results. The inclined gas streams 87 and 88 can thereby be formed at the optimal timings and therefore the liquid film can be removed off the substrate W even more efficiently.

The present preferred embodiment may also be applied to a case of using the moving nozzle 11 of the first preferred embodiment that has the single inclined stream discharge port 83. In this case, the processing of steps S16 to S20 of FIG. 19 is omitted.

Figure 20:
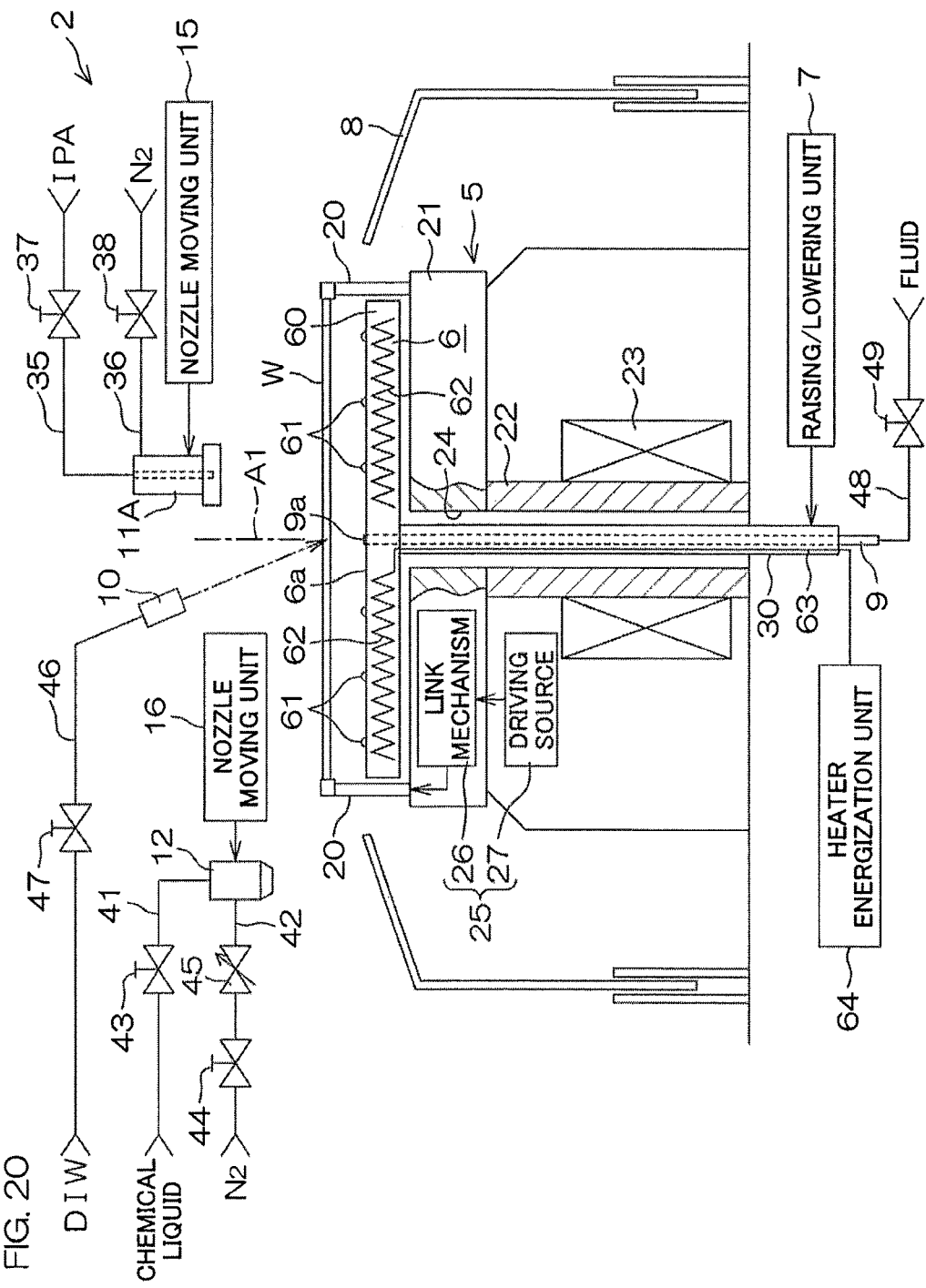
FIG. 20 is an illustrative sectional view for describing an arrangement example of a processing unit included in a substrate processing apparatus according to yet another preferred embodiment of the present invention.

FIG. 20 is a diagram for describing a fourth preferred embodiment of the present invention and is an illustrative sectional view for describing an arrangement example of a processing unit 2A, which, for example, may be used in place of the processing unit 2 in the substrate processing apparatus 1 with the arrangement of FIG. 1. In FIG. 20, portions corresponding to portions shown in FIG. 2 of the above description shall be provided with the same reference symbols as in FIG. 2 and redundant description shall be omitted.

The processing unit 2A includes the spin chuck 5 rotating a single substrate W around the vertical rotational axis A1 passing through a central portion of the substrate W while holding the substrate W in a horizontal orientation, the heater unit 6 heating the substrate W from the lower surface side, the raising/lowering unit 7 that moves the heater unit 6 up and down below the substrate W, the tubular cup 8 surrounding the spin chuck 5, the lower surface nozzle 9 supplying a processing fluid to the lower surface of the substrate W, the DIW nozzle 10 supplying deionized water (DIW) as the rinse liquid to the upper surface of the substrate W, a first moving nozzle 11A capable of moving above the substrate W, and the second moving nozzle 12 capable of moving above the substrate W. The processing unit 2 further includes the chamber 13 (see FIG. 1) that houses the cup 8. Although unillustrated, the chamber 13 has formed therein the carry-in/carry-out port for carrying in and carrying out of the substrate W and includes the shutter unit that opens and closes the carry-in/carry-out port.

In the present preferred embodiment, the first moving nozzle 11A has a function of an organic solvent nozzle that discharges an organic solvent and a function of a gas nozzle that discharges an inert gas, such as nitrogen gas, etc. The organic solvent supply pipe 35 and an inert gas supply pipe 36 are coupled to the first moving nozzle 11A. The organic solvent supply pipe 35 has interposed therein the organic solvent valve 37 that opens and closes the flow passage thereof. The inert gas supply pipe 3 has interposed therein an inert gas valve 38 that opens and closes a flow passage thereof. An organic solvent, such as isopropyl alcohol (IPA), etc., from an organic solvent supply source is supplied to the organic solvent supply pipe 35. An inert gas, such as nitrogen gas ($N_2$), etc., is supplied from an inert gas supply source to the inert gas supply pipe 36.

In the present preferred embodiment, the second moving nozzle 12 has a function of a chemical liquid nozzle supplying a chemical liquid, such as an acid, alkali, etc., and a function of a gas nozzle that discharges an inert gas, such as nitrogen gas, etc. More specifically, the second moving nozzle 12 may have a form of a double-fluid nozzle capable of mixingly discharging a liquid and a gas. The double-fluid nozzle may be used as a liquid nozzle when it is made to discharge the liquid with the supply of the gas being stopped and may be used as a gas nozzle when it is made to discharge the gas with the supply of the liquid being stopped. The chemical liquid supply pipe 41 and the inert gas supply pipe 42 are coupled to the second moving nozzle 12. The chemical liquid supply pipe 41 has interposed therein the chemical liquid valve 43 that opens and closes the flow passage thereof. The inert gas supply pipe 42 has interposed therein the inert gas valve 44 that opens and closes the flow passage thereof and a variable flow valve 45 that varies a flow rate of the inert gas. A chemical liquid, such as an acid, alkali, etc., from a chemical liquid supply source is supplied to the chemical liquid supply pipe 41. An inert gas, such as nitrogen gas ($N_2$), etc., from an inert gas supply source is supplied to the inert gas supply pipe 42.

Figure 21:
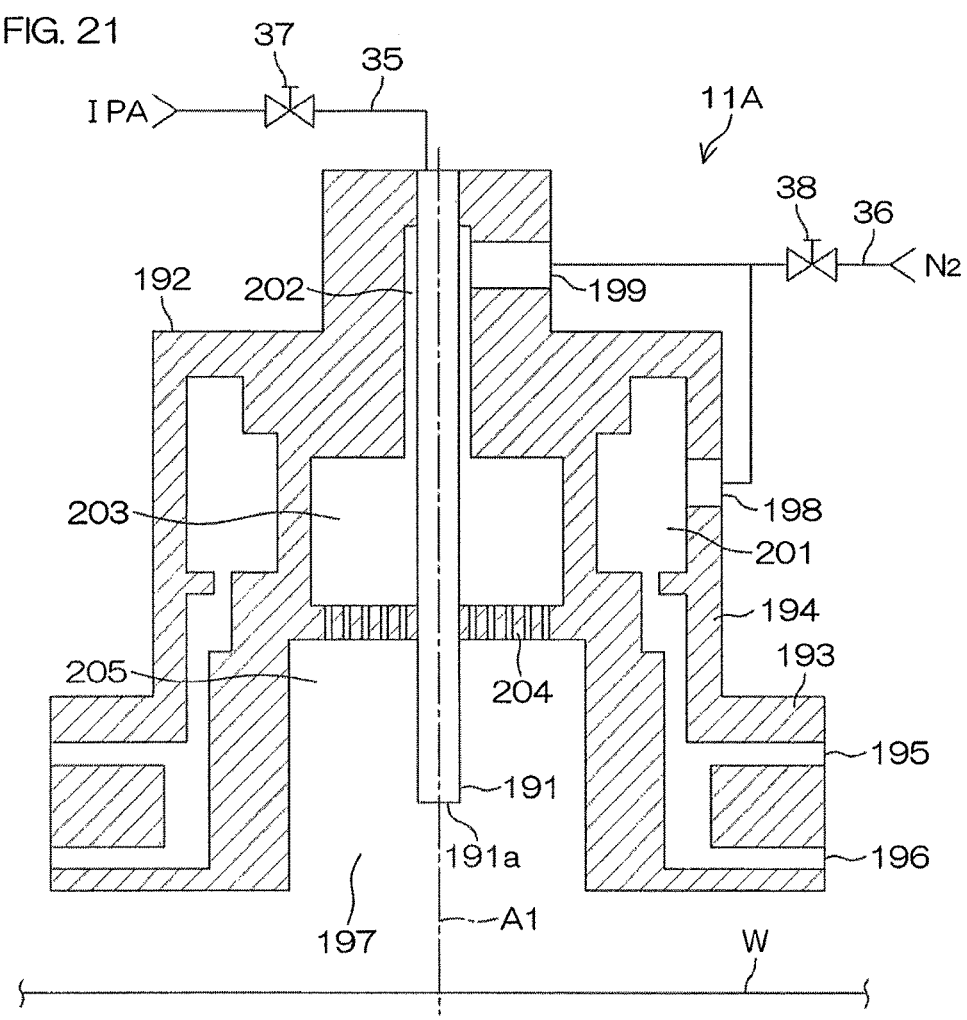
FIG. 21 is a schematic longitudinal sectional view for describing an arrangement example of the first moving nozzle included in the processing unit of FIG. 20.

FIG. 21 is a schematic longitudinal sectional view for describing an arrangement example of the first moving nozzle 11A. The first moving nozzle 11A includes an organic solvent nozzle 191. The organic solvent nozzle 191 is arranged from a straight pipe extending along the vertical direction. The organic solvent supply pipe 35 is coupled to the organic solvent nozzle 191.

A gas nozzle 192 for covering a space above the substrate W with an inert gas atmosphere is coupled to the organic solvent nozzle 191. The gas nozzle 192 has a main nozzle body 194 with a circular cylindrical shape and having a flange portion 193 at its lower end. An upper gas discharge port 195 and a lower gas discharge port 196 are respectively opened in annular shapes toward the outer side at an outer peripheral surface that is aside surface of the flange portion 193. The upper gas discharge port 195 and the lower gas discharge port 196 are disposed across an interval in the up/down direction. A central gas discharge port 197 is disposed at a lower surface of the main nozzle body 194.

The main nozzle body 194 has formed therein gas inlets 198 and 199 to which the inert gas from the inert gas supply pipe 36 is supplied. Individual inert gas supply pipes may be coupled to the gas inlets 198 and 199. A tubular gas flow passage 201, connecting the gas inlet 198 with the upper gas discharge port 195 and the lower gas discharge port 196 is defined inside the main nozzle body 194. Also inside the main nozzle body 194, a tubular gas flow passage 202, in communication with the gas inlet 199, is defined around the organic solvent nozzle 191. A buffer space 203 is put in communication below the gas flow passage 202. The buffer space 203 is further put in communication with a space 205 below it via a punching plate 204. The space 205 is opened to the central gas discharge port 197.

The inert gas introduced from the gas inlet 198 is supplied to the upper gas discharge port 195 and the lower gas discharge port 196 via the gas flow passage 201 and is discharged radially from the gas discharge ports 195 and 196. Two radial gas streams that are overlapped in the up/down direction are thereby formed above the substrate W. On the other hand, the inert gas introduced from the gas inlet 199 is accumulated in the buffer space 203 via the gas flow passage 202, is then diffused by passing through the punching plate 204, and thereafter passes through the space 205 and is discharged downward from the central gas discharge port 197 toward the upper surface of the substrate W. The insert gas here changes direction upon colliding against the upper surface of the substrate W to form a radial direction inert gas stream above the substrate W.

A total of three radial gas streams are thus formed above the substrate W by the radial gas stream formed by the inert gas discharged from the central gas discharge port 197 and the two layers of radial gas streams discharged from the gas discharge ports 195 and 196. The upper surface of the substrate W is protected by the three layers of radial gas streams. Attachment of liquid droplets and mist to the front surface of the substrate W can be avoided by the upper surface of the substrate W being protected by the three layers of radial gas streams, especially when the substrate W is rotated at high speed as shall be described below.

The organic solvent nozzle 191 penetrates through the gas flow passage 202, the buffer space 203 and the punching plate 204 and extends in the up/down direction. A discharge port 191a at a lower end of the organic solvent nozzle 191 is positioned below the punching plate 204 and discharges the organic solvent toward the upper surface of the substrate W from vertically above.

Figure 22:
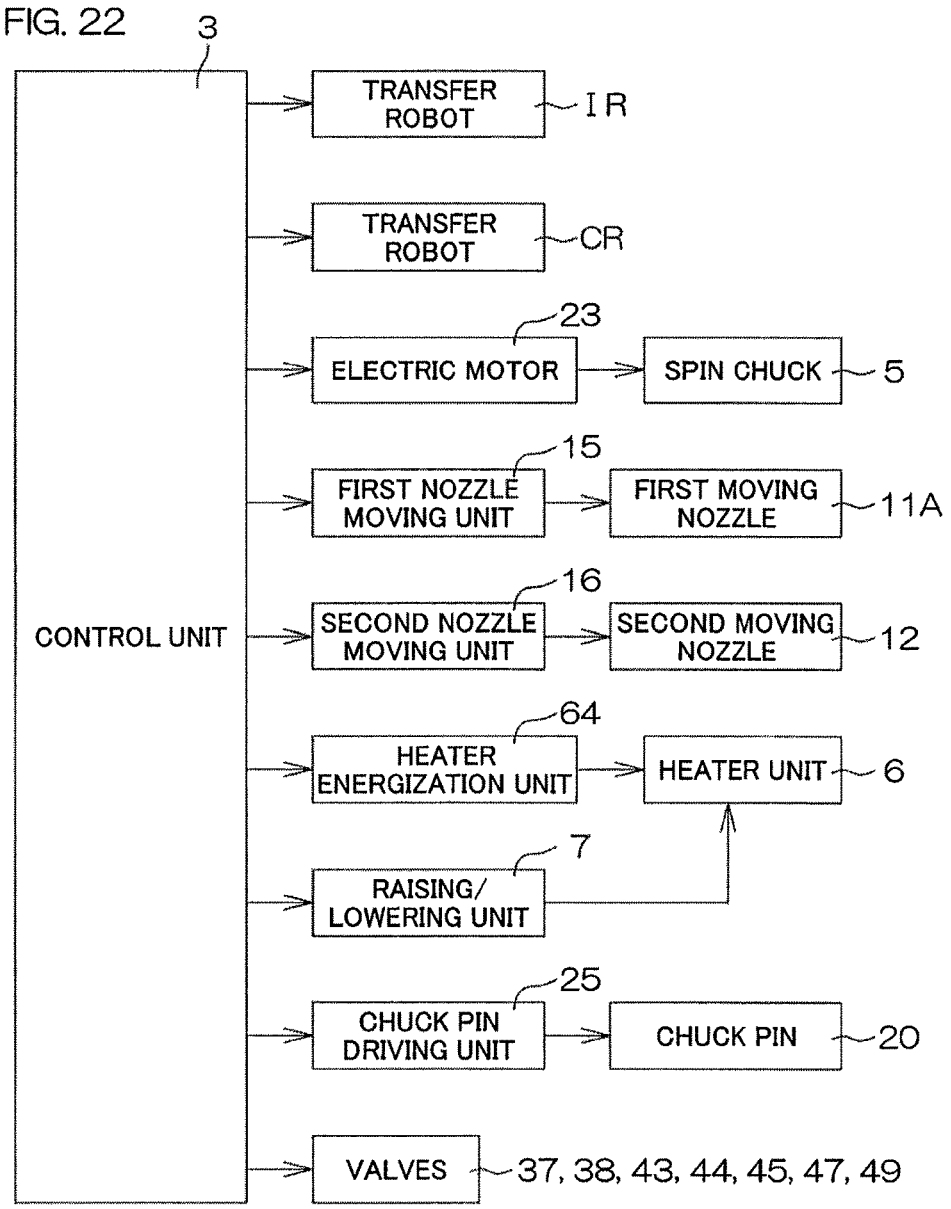
FIG. 22 is a block diagram for describing the electrical arrangement of a principal portion of the substrate processing apparatus that includes the processing unit of FIG. 20.

FIG. 22 is a block diagram for describing the electrical arrangement of a principal portion of the substrate processing apparatus 1 of the present preferred embodiment. The control unit 3 includes a microcomputer and controls control objects included in the substrate processing apparatus 1 in accordance with a predetermined control program. In particular, the control unit 3 controls operations of the transfer robots IR and CR, the electric motor 23 that performs rotational drive of the spin chuck 5, the first nozzle moving unit 15, the second nozzle moving unit 16, the heater energization unit 64, the raising/lowering unit 7 that raises and lowers the heater unit 6, the chuck pin driving unit 25, the valves 37, 38, 43, 44, 45, 47, and 49, etc.

Figure 23:
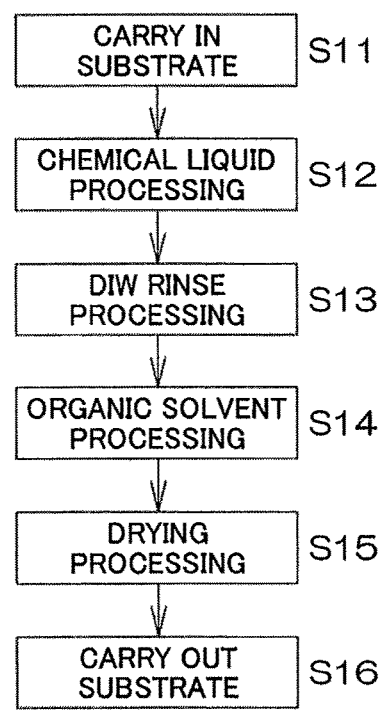
FIG. 23 is a flow diagram for describing an example of substrate processing performed by the substrate processing apparatus that includes the processing unit of FIG. 20.

FIG. 23 is a flow diagram for describing an example of substrate processing performed by the substrate processing apparatus 1 of the present preferred embodiment. An unprocessed substrate W is carried into a processing unit 2 from a carrier C and transferred to the spin chuck 5 by the transfer robots IR and CR (S11). In this process, the control unit 3 controls the raising/lowering unit 7 so that the heater unit 6 is disposed at the lower position. Also, the control unit 3 controls the chuck pin driving unit 25 so that the chuck pins 20 are put in the open state. In that state, the transfer robot CR transfers the substrate W to the spin chuck 5. The substrate W is placed on the supporting portions 52 (supporting surfaces 52a) of the chuck pins 20 in the open state. Thereafter, the control unit 3 controls the chuck pin driving unit 25 to put the chuck pins 20 in the closed state. The substrate W is thereby gripped by the gripping portions 51 of the plurality of chuck pins 20.

After the transfer robot CR has retracted out of the processing unit 2, a chemical liquid processing (S12) is started. The control unit 3 drives the electric motor 23 to rotate the spin base 21 at a predetermined chemical liquid rotational speed. The control unit 3 controls the second nozzle moving unit 16 to dispose the second moving nozzle 12 at a chemical liquid processing position above the substrate W. The chemical liquid processing position may be a position at which the chemical liquid discharged from the second moving nozzle 12 lands on the rotation center of the upper surface of the substrate W. The control unit 3 then opens the chemical liquid valve 43. The chemical liquid is thereby supplied from the second moving nozzle 12 toward the upper surface of the substrate W in the rotating state. The supplied chemical liquid spreads across an entire surface of the substrate W due to a centrifugal force.

After the chemical processing of a fixed time, a DIW rinse processing (S13) of replacing the chemical liquid on the substrate W with DIW to remove the chemical liquid from the substrate W is executed. Specifically, the control unit 3 closes the chemical liquid valve 43 and opens the DIW valve 47 in its place. The DIW from the DIW nozzle 10 is thereby supplied toward the upper surface of the substrate W in the rotating state. The supplied DIW spreads across the entire surface of the substrate W due to the centrifugal force. The chemical liquid on the substrate W is rinsed off by the DIW. During this process, the control unit 3 controls the second nozzle moving unit 16 to make the second moving nozzle 12 retract from above the substrate W to a side of the cup 8.

After the DIW rinse processing of a fixed time, an organic solvent processing (S14) of replacing the DIW on the substrate W with the organic solvent, which is a processing liquid of lower surface tension (low surface tension liquid), is executed. The control unit 3 controls the first nozzle moving unit 15 to make the first moving nozzle 11A move to an organic solvent rinse position above the substrate W. The organic solvent rinse position may be a position at which the organic solvent (for example, IPA), discharged from the organic solvent nozzle 191 (see FIG. 21) included in the first moving nozzle 11A, lands on the rotation center of the upper surface of the substrate W. The control unit 3 then closes the DIW valve 47 and opens the organic solvent valve 37. The organic solvent (liquid) is thereby supplied from the first moving nozzle 11A (organic solvent nozzle 191) toward the upper surface of the substrate W in the rotating state. The supplied organic solvent spreads across the entire surface of the substrate W due to the centrifugal force and replaces the DIW on the substrate W.

In the organic solvent processing, the control unit 3 controls the raising/lowering unit 7 to make the heater unit 6 rise toward the substrate W and thereby heats the substrate W. Also, the control unit 3 decelerates the rotation of the spin chuck 5 to stop the rotation of the substrate W and closes the organic solvent valve 37 to stop the supplying of the organic solvent. A puddle state, in which the organic solvent liquid film is supported on the substrate W in the stationary state, is thereby entered. A portion of the organic solvent in contact with the upper surface of the substrate W evaporates due to the heating of the substrate W and a gas phase layer is thereby formed between the organic solvent liquid film and the upper surface of the substrate W. The organic solvent liquid film in the state of being supported by the gas phase layer is removed.

In removing the organic solvent liquid film, the control unit 3 controls the first nozzle moving unit 15 to make the first moving nozzle 11A retract from above the substrate W to a side of the cup 8. The control unit 3 then controls the second nozzle moving unit 16 to move the second moving nozzle 12 to a gas discharging position above the substrate W. The gas discharge position may be a position at which the inert gas stream discharged from the second moving nozzle 12 is directed to the rotation center of the upper surface of the substrate W. The control unit 3 then opens the inert gas valve 44 to make the inert gas be discharged toward the organic solvent liquid film on the substrate W. Thereby, at the position at which the discharge of the inert gas is received, that is, at the center of the substrate W, the organic solvent liquid film is removed by the inert gas and a hole, exposing the front surface of the substrate W, is opened in a center of the organic solvent liquid film. By spreading the hole, the organic solvent on the substrate W is expelled off the substrate W.

After the organic solvent processing is thus ended, the control unit 3 closes the inert gas valve 44, makes the second moving nozzle 12 retract, and thereafter controls the electric motor 23 to perform high-speed rotation of the substrate W at a drying rotational speed. A drying processing (S15: spin drying) for spinning off the liquid components on the substrate W by centrifugal force is thereby performed.

Thereafter, the control unit 3 controls the electric motor 23 to stop the rotation of the spin chuck 5. Also, the raising/lowering unit 7 is controlled to control the heater unit 6 to the lower position. Further, the control unit 3 controls the chuck pin driving unit 25 to control the chuck pins 20 to the open position. The substrate W is thereby put in a state of being placed on the supporting portions 52 from the state of being gripped by the gripping portions 51 of the chuck pins 20. Thereafter, the transfer robot CR enters into the processing unit 2, scoops up the processed substrate W from the spin chuck 5, and carries it out of the processing unit 2 (S16). The substrate W is transferred from the transfer robot CR to the transfer robot IR and is housed in a carrier C by the transfer robot IR.

Figure 24B:
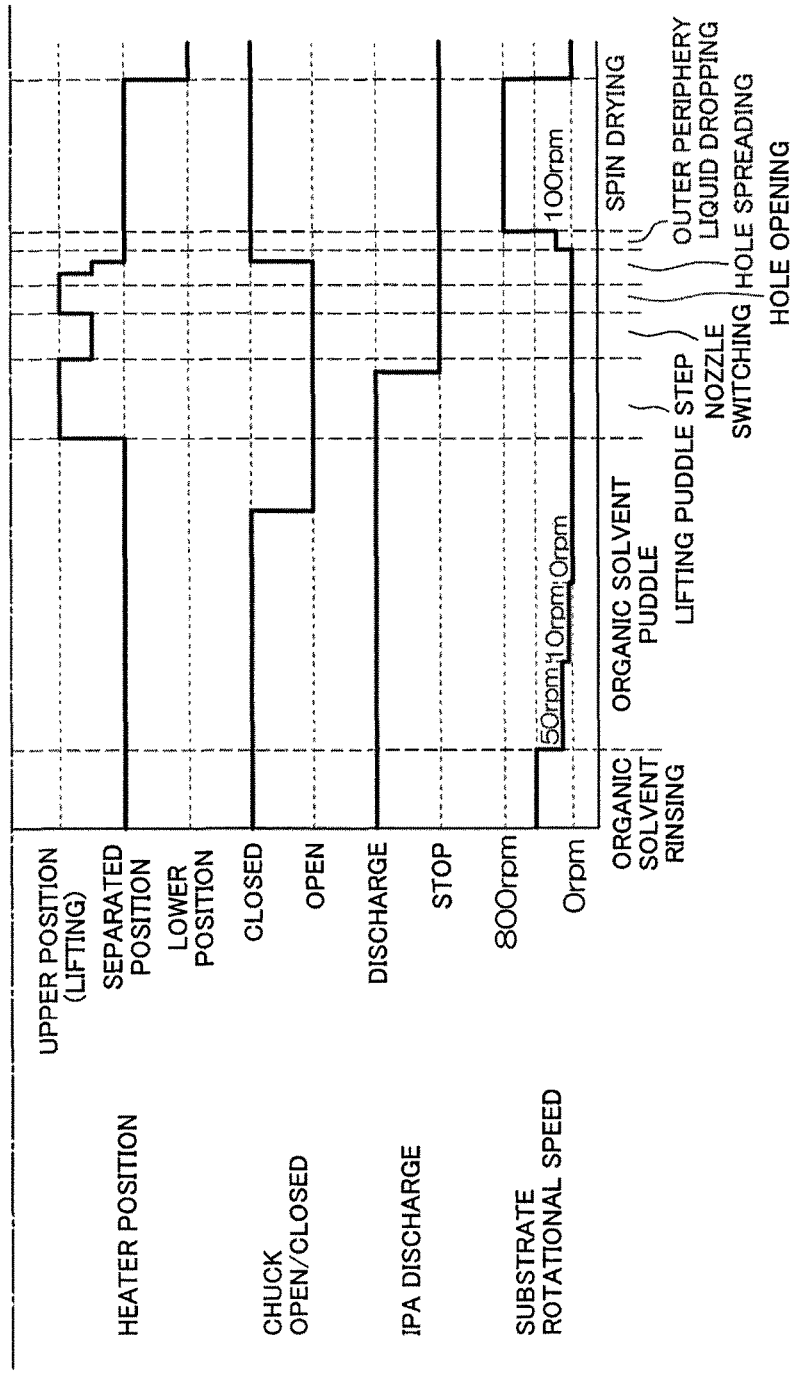

FIGS. 24A and 24B show a time chart for describing details of the organic solvent processing (S14 of FIG. 23). Also, FIG. 25A to FIG. 25H are illustrative sectional views for describing conditions of the respective steps of the organic solvent processing, and FIG. 25I is an illustrative sectional view for describing conditions of the drying processing (S15 of FIG. 23).

The organic solvent processing includes an organic solvent rinsing step T11, an organic solvent puddle step T12, a lifting puddle step T13, a nozzle switching step T14, a hole opening step T15, a hole spreading step T16, and an outer periphery liquid dropping step T17 and these are executed successively.

The organic solvent rinsing step T11 is a step of supplying the organic solvent to the upper surface of the substrate W while rotating the substrate W (processing liquid supplying step, organic solvent supplying step). As shown in FIG. 25A, the organic solvent is supplied to the upper surface of the substrate W from the organic solvent nozzle 191. The supplied organic solvent receives the centrifugal force to be directed from the center toward the outer side of the upper surface of the substrate W and form the liquid film 150 covering the upper surface of the substrate W. By the liquid film 150 covering the entire upper surface of the substrate W, the DIW (another processing liquid) supplied to the upper surface of the substrate W in the DIW rinse processing (S13 of FIG. 23) is entirely replaced by the organic solvent.

During the period of the organic solvent rinsing step T11, the substrate W is rotated at an organic solvent rinse processing speed (liquid supplying speed; for example, of approximately 300 rpm) by the spin chuck 5 (liquid supplying speed rotating step). The first moving nozzle 11 (organic solvent nozzle 191) is disposed above the rotation center of the substrate W. The organic solvent valve 37 is put in the open state and therefore the organic solvent (for example, IPA) discharged from the organic solvent nozzle 191 is supplied from above toward the rotation center of the upper surface of the substrate W. The chuck pins 20 are put in the closed state so that the substrate W is gripped by the gripping portions 51 and rotates together with the spin chuck 5. The heater unit 6 is position-controlled to be at a position higher than the lower position and its heating surface 6a is disposed at a separated position separated downward by a predetermined distance (for example, 2 mm) from the lower surface of the substrate W. The substrate W is thereby preheated by radiant heat from the heating surface 6a (substrate preheating step). The temperature of the heating surface of the heater unit 6 is, for example, approximately 150° C. and is uniform within the surface. The second moving nozzle 12 is retracted at the home position at the side of the cup 8. The chemical liquid valve 43 and the inert gas valves 38 and 44 are controlled to be in the closed states. The second moving nozzle 12 thus does not discharge an inert gas (for example, nitrogen gas).

As shown in FIG. 25B, the organic solvent puddle step T12 is a step of decelerating and stopping the rotation of the substrate W to form a thick liquid film 150 of the organic solvent on the front surface of the substrate W.

In the present example, the rotation of the substrate W is decelerated stepwise from the organic solvent rinse processing speed (decelerating step, gradual decelerating step, stepwise decelerating step). More specifically, the rotational speed of the substrate W is decelerated from 300 rpm to 50 rpm and kept there for a predetermined time (for example, of 10 seconds), thereafter decelerated to 10 rpm and kept there for a predetermined time (for example, of 10 seconds), and thereafter decelerated to 0 rpm (stopped) and kept there for a predetermined time (for example, of 10 seconds). On the other hand, the organic solvent nozzle 191 is maintained on the rotational axis A1 and continues to discharge the organic solvent toward the rotation center of the upper surface of the substrate W. The discharge of organic solvent from the organic solvent nozzle 191 is sustained over the entire period of the organic solvent puddle step T12. That is, the discharge of organic solvent is sustained even when the substrate W stops. By the supplying of organic solvent thus being sustained over the entire period from the deceleration to stoppage of the rotation of the substrate W, the processing liquid will not be depleted at any part of the upper surface of the substrate W. Also, by the supplying of organic solvent being sustained even after stoppage of the rotation of the substrate W, the thick liquid film 150 can be formed on the upper surface of the substrate W.

The position of the heater unit 6 is the same as the position during the organic solvent rinsing step and is the separated position at which the heating surface 6a is separated downward by the predetermined distance (for example, 2 mm) from the lower surface of the substrate W. The substrate W is thereby preheated by radiant heat from the heating surface 6a (substrate preheating step). After the rotation of the substrate W is stopped, the chuck pins 20 are switched from the closed state to the open state while the stopped state is maintained. A state is thereby entered where a peripheral edge portion lower surface of the substrate W is supported from below by the supporting portions 52 of the chuck pins 20 and the gripping portions 51 are separated from upper surface peripheral edge portions of the substrate W so that the entire upper surface of the substrate W is released. The second moving nozzle 12 remains at the home position.

As shown in FIG. 25C, the lifting puddle step T13 is a step in which, in a state where the substrate W is lifted by the heater unit 6, that is, in a state where the heating surface 6a is put in contact with the lower surface of the substrate W, the organic solvent liquid film 150 is maintained on the upper surface of the substrate W while heating the substrate W.

The heater unit 6 is raised from the separated position to the upper position and held there for a predetermined time (for example, of 10 seconds). In the process of raising the heater unit 6 to the upper position, the substrate W is transferred from the supporting portions 52 of the chuck pins 20 to the heating surface 6a and the substrate W becomes supported by heating surface 6a (more specifically, by the supporting pins 61; see FIG. 20) (heater unit approaching step, heater unit contacting step). The discharge of organic solvent from the first moving nozzle 11A (organic solvent nozzle 191) is sustained to a middle of the lifting puddle step T13. The supplying of organic solvent is thus sustained when the heating surface 6a of the heater unit 6 contacts the lower surface of the substrate W and rapid heating of the substrate W by heat conduction from the heating surface 6a is started to increase the heat amount applied to the substrate W (heat amount increasing step). Opening of holes at unspecified positions in the organic solvent liquid film 150 due to evaporation of the organic solvent in accompaniment with rapid temperature rise of the substrate W is thereby avoided. The supplying of organic solvent is stopped after a predetermined time elapses after the heating surface 6a of the heater unit 6 contacts the lower surface of the substrate W (after the heat amount increasing step) (supply stopping step). That is, the control unit 3 closes the organic solvent valve 37 to stop the discharge of organic solvent from the organic solvent nozzle 191.

The rotation of the spin chuck 5 is in the stopped state, the second moving nozzle 12 is at the home position, and the inert gas valve 44 is in the closed state. The first moving nozzle 11 (organic solvent nozzle 191) is positioned above the rotation center of the substrate W.

After the supplying of organic solvent has been stopped, the heater unit 6 is maintained at the upper position until a predetermined time elapses. The organic solvent supplied to the substrate W is pushed away to the outer peripheral side by the fresh organic solvent supplied to the center and, in this process, is heated and raised in temperature by the heat from the upper surface of the substrate W that is heated by the heater unit 6. In the period in which the supplying of organic solvent is sustained, the temperature of the organic solvent at a central region of the substrate W is comparatively low. Thus by maintaining the contacting state of the heater unit 6 for the short predetermined time after stoppage of the supplying of organic solvent, the organic solvent at the central region of the substrate W can be raised in temperature. The temperature of the organic solvent liquid film 150 supported on the upper surface of the substrate W can thereby be made uniform.

At the organic solvent liquid film 150 that receives heat from the upper surface of the substrate W, evaporation occurs at an interface with the upper surface of the substrate W. A gas phase layer, constituted of the gas of the organic solvent, is thereby formed between the upper surface of the substrate W and the organic solvent liquid film 150. The organic solvent liquid film 150 is thus put in a state of being supported by the gas phase layer across the entirety of the upper surface of the substrate W (gas phase layer forming step).

As shown in FIG. 25D, the nozzle switching step T14 is a step of making the first moving nozzle 11A retract from the position on the rotational axis A1 and disposing the second moving nozzle 12 on the rotation center in its place. Specifically, after the supplying of organic solvent has been stopped, the first moving nozzle 11A is made to retract to the home position set at the side of the cup 8. Thereafter, the second moving nozzle 12 is moved from the home position to a central position on the rotational axis A1. During the period of the nozzle switching step T14, the heater unit 6 is lowered slightly below from the upper position. The substrate W is thereby transferred from the heater unit 6 to the supporting portions 52 of the chuck pins 20 and the heating surface 6a faces the lower surface of the substrate W in a non-contacting state of being spaced by an interval of a predetermined minute distance from the lower surface of the substrate W. The heating of the substrate W is thereby switched to heating by radiant heat from the heating surface 6a and the heat amount applied to the substrate W is decreased (heat amount decreasing step). Overheating of the substrate W during the switching of the nozzles is thereby avoided and formation of a crack in the organic solvent liquid film 150 (especially a crack in an outer peripheral region of the substrate W) due to evaporation is avoided.

As shown in FIG. 25E, the hole opening step T15 is a step in which an inert gas (for example, nitrogen gas) is blown at a low flow rate (first flow rate, for example, of 3 liters/minute) from the second moving nozzle 12 toward the center of the substrate W to open a small hole 151 in a central portion of the organic solvent liquid film 150 to thereby expose a central portion of the upper surface of the substrate W (hole opening step). The rotation of the substrate W is kept in the stopped state and therefore the hole opening step is performed on the liquid film 150 on the substrate W in the stationary state. An example of a state where a hole is opened in the central portion of the organic solvent liquid film 150 is as shown in FIG. 11A of the above description.

The control unit 3 opens the inert gas valve 44 and controls the opening degree of the variable flow valve 45 to make the inert gas be discharged at the low flow rate from the second moving nozzle 12. At substantially the same time as the discharge of inert gas, the heater unit 6 is raised. The heating surface 6a is thereby put in contact with the lower surface of the substrate W and the substrate W is lifted by the heater unit 6 at a delay of a minute amount of time (for example, 1 second) from the timing at which the small hole 151 is opened in the central portion of the organic solvent liquid film 150 by the inert gas.

Therefore, at the point at which the inert gas reaches the upper surface of the substrate W, the heat amount applied to the substrate W from the heater unit 6 is low, and a temperature difference between the upper and lower surfaces of the substrate W due to cooling of the substrate W by the inert gas and heating by the heater unit 6 can thereby be made small. Warping of the substrate W due to the temperature difference between the upper and lower surfaces of the substrate W can thereby be avoided. If when the inert gas is supplied, the heater unit 6 is put in contact with the lower surface of the substrate W, the temperature at the upper surface side of the substrate W will become lower than the temperature at the lower surface side and the substrate W may become warped in a manner such that the upper surface side is made concave. In this case, with the upper surface of the substrate W, the central portion becomes low and the peripheral edge portion becomes high so that movement of the organic solvent liquid film 150 to the outer side is obstructed. Thus in the present preferred embodiment, the inert gas is supplied to the upper surface center of the substrate W in the state where the heater unit 6 is separated from the lower surface of the substrate W to mitigate the temperature difference between the upper and lower surfaces of the substrate W.

On the other hand, rapid heating of the substrate W is started from immediately after (that is, at substantially the same time as) the opening of the hole in the organic solvent liquid film 150 (heat amount re-increasing step). The heating of the substrate W is thereby started promptly (at substantially the same time as) when the movement of the liquid film 150 to the outer side due to the opening of the hole by the inert gas is started, and the liquid film 150 is thereby made to move to the outer side of the substrate W without stopping.

More specifically, in the central region in which the hole is opened and the liquid film 150 is gone, the temperature of the substrate W rises promptly in comparison to the surrounding region in which the liquid film 150 is present. A large temperature gradient thus arises within the substrate W at a peripheral edge of the hole 151. That is, the temperature becomes high at an inner side and becomes low at an outer side of the peripheral edge of the hole 151. As shown in FIG. 25F, the temperature gradient causes the organic solvent liquid film 150, supported on the gas phase layer, to begin moving toward the low temperature side, that is, toward the outer side and the hole 151 at the center of the organic solvent liquid film 150 thereby becomes enlarged.

The organic solvent liquid film 150 on the substrate W can thereby be removed off the substrate W using the temperature gradient that arises due to the heating of the substrate W (heating removing step, liquid film moving step). More specifically, at the upper surface of the substrate W, the liquid film 150 within a region in which a pattern is formed can be removed by movement of the organic solvent due to the temperature gradient.

If the heater unit 6 is put in contact with the substrate W after a long delay after the hole 151 has been formed at the rotation center of the substrate W by the blowing on of inert gas, the enlargement of the hole 151 stops in the middle. In this state, an inner peripheral edge of the liquid film 150 is put in an equilibrium state of being directed toward the inner side and directed toward the outer side. In this state, a liquid surface of the organic solvent may enter into a pattern formed on the front surface of the substrate W and may become a cause of pattern collapse due to surface tension. Thus in the present preferred embodiment, the heater unit 6 is put in contact with the lower surface of the substrate W at substantially the same time as the opening of the hole by the inert gas to instantaneously increase the heat amount applied to the substrate W.

Figure 25G:
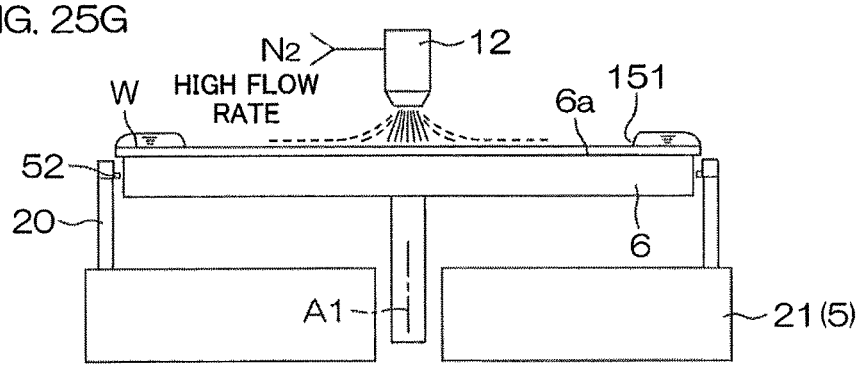

As shown in FIG. 25G, the hole spreading step T16 is a step of increasing the flow rate of the inert gas discharged from the second moving nozzle 12 to blow the inert gas at a high flow rate (second flow rate; for example, of 30 liters/minute) onto the center of the substrate W to further spread the hole 151 at the center of the organic solvent liquid film 150 by means of the inert gas (gas removing step, liquid film moving step). That is, the control unit 3 controls the variable flow valve 45 to increase the flow rate of the inert gas supplied to the second moving nozzle 12. The liquid film 150, which has moved to the outer peripheral region of the upper surface of the substrate W, is thereby pushed away further and off the substrate W. The rotation of the substrate W is maintained in the stopped state.

Figure 11B:
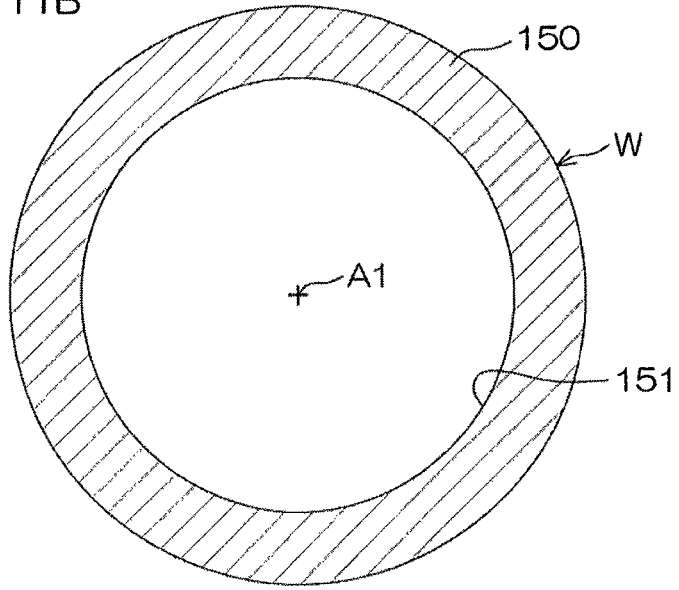
FIG. 11B is a plan view of a state of the liquid film in a case where an attempt is made to move the liquid film by just heating.

Specifically, by further increasing the flow rate of the inert gas while the hole 151 is being spread by the temperature gradient, stopping of the movement of the liquid film 150 can be avoided and the movement of the liquid film 150 to the outer side of the substrate W can be sustained. As shown in FIG. 11B, with just the movement of the organic solvent liquid film 150 using the temperature gradient, the movement of the liquid film 150 may stop at a peripheral edge region of the upper surface of the substrate W. Thus by increasing the flow rate of the inert gas, the movement of the liquid film 150 can be assisted and the organic solvent liquid film 150 can thereby be removed from the entirety of the upper surface of the substrate W.

After the flow rate of the inert gas has been increased, the heater unit 6 is lowered and the substrate W is transferred from the heating surface 6a to the supporting portions 52 of the chuck pins 20. Thereafter, the chuck pins 20 are put in the closed state and the substrate W is gripped by the gripping portions 51 until the inert gas discharge at the high flow rate ends. In the example shown in FIGS. 24A and 24B, after the substrate W has been transferred to the chuck pins 20, the heater unit 6 is maintained for a short time at a non-contacting heating position of facing the lower surface of the substrate W across a minute distance and is thereafter lowered further and disposed at the separated position of facing the lower surface of the substrate W across the predetermined distance.

Figure 25H:
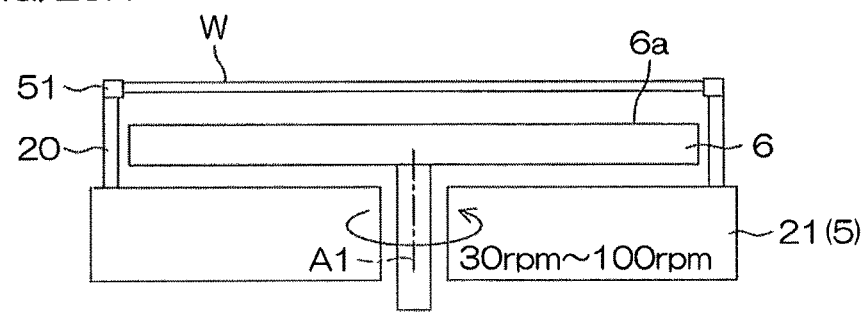
Figure 25I:
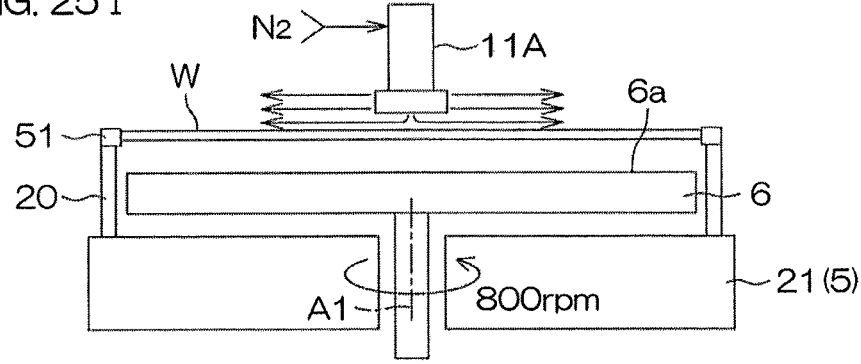
FIG. 25I is an illustrative sectional view for describing conditions of a drying processing (S15 of FIG. 23) of the processing unit of FIG. 20.

As shown in FIG. 25H, the outer periphery liquid dropping step T17 is a step of rotating the substrate W to spin off the organic solvent liquid film remaining on the outer peripheral portion of the substrate W. After the substrate W has been gripped by the chuck pins 20, the supplying of inert gas to the second moving nozzle 12 is stopped and the second moving nozzle 12 retracts to the home position. At the same time, the spin chuck 5 is rotated at an outer periphery spinning-off speed that is a low speed. Specifically, the substrate W is rotated, along with the spin chuck 5, at, for example, 30 to 100 rpm. The organic solvent that cannot be removed completely, even by the supplying of inert gas at the high flow rate, and remains on the outer peripheral portion (especially on a peripheral end surface) of the substrate W is thereby spun off.

By the centrifugal force, the liquid film 150 is spun off the substrate W in a liquid mass state without splitting into minute liquid droplets because the above is performed after the liquid film 150 has moved to the outer peripheral portion due to the temperature difference and the blowing-on of inert gas at the high flow rate and moreover because the rotation is that at the outer periphery spinning-off speed, which is a low speed. Also in most cases, a pattern effective for use in a product is not formed in the peripheral edge portion of the substrate W and therefore a major problem will not occur even if some splitting of the liquid film 150 occurs.

In succession to the outer periphery liquid dropping step T17, the spin drying step T18 (drying processing; S15 of FIG. 23) is executed as shown in FIG. 25I. Specifically, the control unit 3 moves the first moving nozzle 11A from the home position to a position on the rotational axis A1. Further, the control unit 3 moves the first moving nozzle 11A to a lower position close to the upper surface of the substrate W. The control unit 3 then opens the inert gas valve 38. The first moving nozzle 11A (gas nozzle 192) thus forms three layers of radial inert gas streams above the substrate W. In that state, the control unit 3 accelerates the rotation of the spin chuck 5 to a drying rotational speed (for example, of 800 rpm), which is a high speed. Liquid components on the front surface of the substrate W can thereby be spun off completely by the centrifugal force. The upper surface of the substrate W is covered by the radial inert gas streams, and liquid droplets, which have scattered to the surroundings and have splashed back, and mist in the surroundings can thereby be prevented from becoming attached to the upper surface of the substrate W.

After the spin drying step T18, the rotation of the spin chuck 5 is stopped and the heater unit 6 is lowered to the lower position. Also, the inert gas valve 38 is closed and the discharge of inert gases from the gas nozzle 72 is stopped. The first moving nozzle 11A is moved to the home position. Thereafter, the control unit 3 puts the chuck pins 20 in the open state and makes the processed substrate W be carried out from the processing unit 2 by means of the transfer robot CR.

Figure 26A:
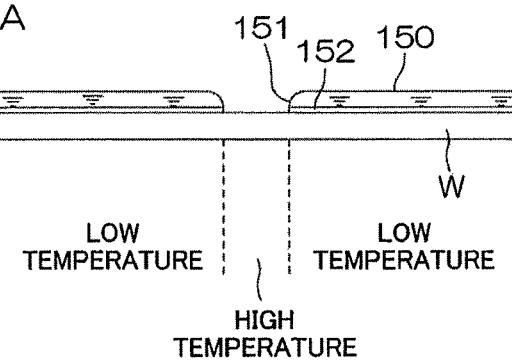
FIG. 26A and FIG. 26B are diagrams for describing movement of an organic solvent liquid film by temperature difference of a substrate.
Figure 26B:
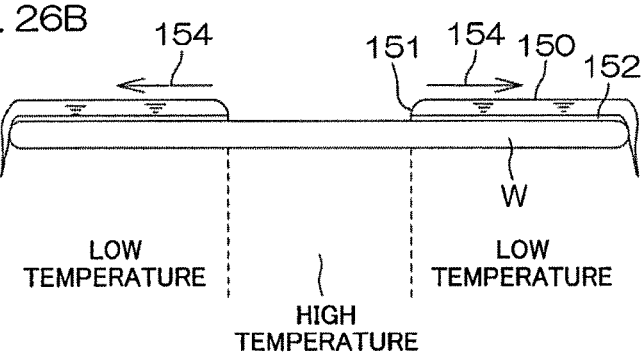

FIG. 26A and FIG. 26B are diagrams for describing the movement of the organic solvent liquid film 150 due to the temperature difference of the substrate W. The organic solvent in the organic solvent liquid film 150 tends to move toward a position of lower temperature. As shown in FIG. 26A, in the hole opening step T15, the temperature of the substrate W of a region within the hole 151 becomes comparatively high due to the formation of the hole 151 at the center of the organic solvent liquid film. Accordingly, at a vicinity of the hole 151, the temperature of the organic solvent liquid film 150 becomes higher than that of its surroundings. A temperature difference thereby arises within the organic solvent liquid film 150 and the organic solvent at the peripheral edge portion of the hole 151 moves radially toward the outer side of the substrate W. A stream 154 directed toward the peripheral edge of the substrate W is thereby generated on the gas phase layer 152 and the hole 151 at the central portion of the organic solvent liquid film 150 spreads concentrically as shown in FIG. 26B.

The hole-spreading step T16 by increase of the flow rate of inert gas is executed in parallel with the hole-spreading that makes use of the organic solvent stream 154 due to the temperature difference, and therefore the hole 151 spreads to the outer peripheral edge of the substrate W without stopping in the middle. The liquid film 150 can thereby be removed off the substrate W without stagnating in the middle.

As mentioned above, with just the movement of the organic solvent liquid film 150 using the temperature gradient, the movement of the liquid film 150 may stop at the peripheral edge region of the upper surface of the substrate W. When the movement of the liquid film 150 stops, an equilibrium state, in which the organic solvent repeats movement toward the inner side and movement toward the outer side of the substrate W, is entered at the inner peripheral edge of the liquid film 150. In this case, when the organic solvent returns toward the inner side of the substrate W, the organic solvent may directly contact the front surface of the substrate W that has lost the gas phase layer 152. In this process, a liquid surface of the organic solvent may enter into an interior of a pattern and cause pattern collapse due to surface tension.

Figure 27:
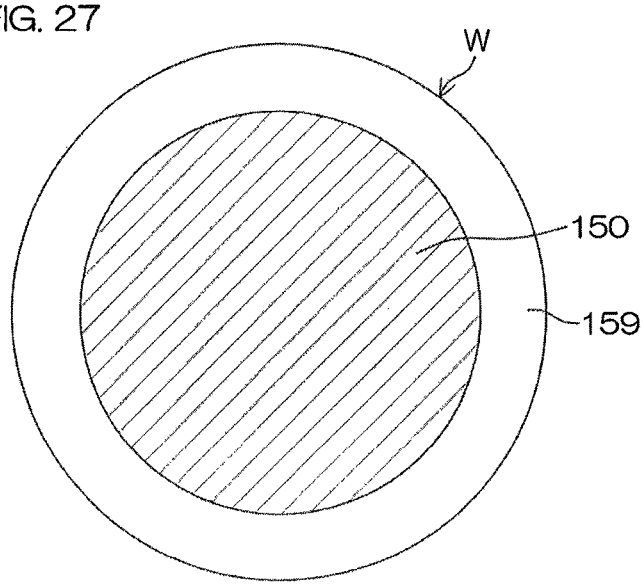
FIG. 27 is a diagram for describing an effect due to gradual deceleration of a substrate rotational speed in an initial stage of an organic solvent puddle step.
Figure 28:
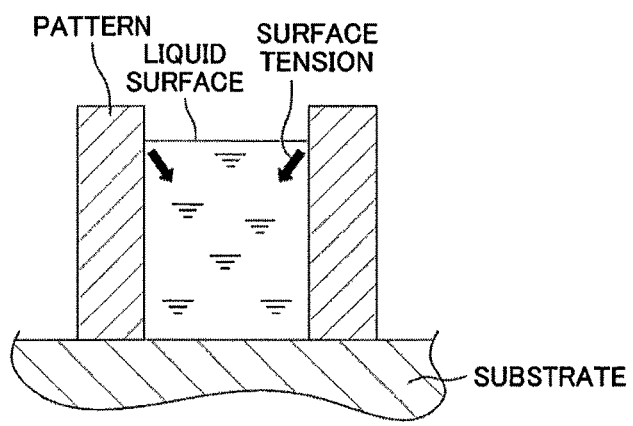
FIG. 28 is an illustrative sectional view for describing principles of pattern collapse due to surface tension.

FIG. 27 is a diagram for describing the effect due to the gradual deceleration of the substrate rotational speed in the initial stage of the organic solvent puddle step T12. For the sake of clarification, the organic solvent liquid film 150 is provided with hatching in FIG. 27.

The higher the rotational speed of the substrate W, the greater the centrifugal force that acts on a processing liquid that is supplied to the substrate W. When the rotation of the substrate W is decelerated rapidly, a state is entered in which organic solvent supplied after the rotation of the substrate W has become low in speed is present at a central region of the substrate W while organic solvent supplied when the rotation of the substrate W was high in speed is present at an outer peripheral region of the substrate W. The organic solvent at the outer peripheral region thus receives a large centrifugal force and forms a fast stream. On the other hand, the centrifugal force acting on the organic solvent at the central region is small and only a slow stream is formed at the central region. If the rotation of the substrate stops, a stream of organic solvent due to centrifugal force will not be formed. In this case, merely a slow stream of organic solvent is formed on the substrate W due to the organic solvent on the substrate W being swept away to the outer side by the organic solvent that is sustainedly supplied to the center of the substrate W.

Therefore when the rotation of the substrate W is stopped suddenly, whereas the organic solvent at the outer peripheral portion of the substrate W flows down promptly off the substrate W, the organic solvent supplied to the center of the substrate W requires a long time to reach the outer peripheral portion of the substrate W. Consequently, as shown in FIG. 27, a lack of liquid may occur at the outer peripheral region of the substrate W and a region 159, which is not covered by the organic solvent liquid film, may form in the outer peripheral region of the substrate W. In the region 159, the organic solvent is removed in a state in which a liquid surface of the organic solvent is present inside a pattern and therefore pattern collapse due to the surface tension of the organic solvent may occur.

Thus in the present preferred embodiment, in the organic solvent puddle step T12, the rotation of the substrate W is decelerated gradually (more specifically, stepwise) to stop the rotation of the substrate W while avoiding the lack of liquid at the outer peripheral portion of the substrate W and maintaining the state in which the front surface of the substrate W is covered by the organic solvent liquid film 150.

The lack of liquid at the outer periphery of the substrate W can be avoided if the deceleration (absolute value of negative acceleration) during the stoppage of rotation of the substrate W is sufficiently low. The gradual deceleration of the rotation of the substrate W thus does not have to be a stepwise deceleration and the rotational speed may be decreased continuously. It is not necessary for the deceleration until stoppage of rotation of the substrate W to be fixed.

As described above, with the present preferred embodiment, after the DIW rinse processing, the DIW on the front surface of the substrate W is replaced by the organic solvent to form the organic solvent liquid film 150 that covers the entire upper surface of the substrate W. The rotation of the substrate W is decelerated and stopped while maintaining the state where organic solvent liquid film 150 covers the entire upper surface of the substrate W. The supplying of the organic solvent is sustained until the rotation of the substrate W stops and further until the heater unit 6 contacts the lower surface of the substrate W, and the supplying of the organic solvent is stopped thereafter. The thick liquid film 150 of the organic solvent is thereby formed on the upper surface of the substrate W and a crack does not form in the liquid film 150 even upon rapid temperature rise of the substrate W due to contacting of the heater unit 6. The gas phase layer 152 of the organic solvent is thus formed between the upper surface of the substrate W and the liquid film 150 across the entire upper surface of the substrate W by heating of the substrate W by means of the heater unit 6 while constantly maintaining the state where the organic solvent liquid film 150 covers the upper surface of the substrate W. The gas phase layer 152 fills the interior of the pattern on the front surface of the substrate W and has an interface with the liquid film 150 at a position higher than the upper surface of the pattern. A liquid surface of the organic solvent is thus not present inside the pattern and therefore surface tension is not applied to the pattern. Therefore by the liquid film 150, in the state of being supported by the gas phase layer 152, being removed off the substrate W, pattern collapse can be suppressed or prevented.

In the present preferred embodiment, in removing the liquid film 150, the inert gas is discharged toward the center of the film and the single hole 151 is thereby formed. The single hole 151 is pushed and spread toward the outer side by the movement of the liquid film 150 due to the temperature gradient and the high flow rate supplying of inert gas. In this process, the rotation of the substrate W is stopped and therefore the liquid film 150 moves on the gas phase layer 152 to the outer side of the substrate W and becomes removed off the substrate W while maintaining a large thickness and without splitting. In addition to the temperature gradient, the movement of the liquid film 150 is assisted by the high flow rate supplying of inert gas and therefore the movement of the liquid film 150 does not stop in the middle and the organic solvent does not return to the inner side of the substrate W to form its liquid surface inside a pattern. Pattern collapse in the process of removing the organic solvent liquid film 150 can thereby be avoided. Further, the liquid film 150 that remains at an outer periphery further to the outer side than a pattern formation region is spun off by the low-speed rotation of the substrate W and the liquid film 150 is thereby removed completely from the front surface of the substrate W.

The organic solvent liquid film 150 is thus maintained in the state of covering the entire upper surface of the substrate W until the gas phase layer 152 is formed and thereafter, when removal from the substrate W is started, is guided to the outer side of the substrate W without splitting or stopping. The liquid components on the substrate W can thereby be removed while effectively suppressing or preventing the collapse of a pattern on the substrate W.

Although preferred embodiments of the present invention have been described above, the present invention may be implemented in yet other modes. Several modes included within the scope of the present invention shall be described below as examples.

1. With each of the preferred embodiments above, an example is described where DIW as the rinse liquid is replaced by an organic solvent and an inert gas is used to remove the organic solvent out of the substrate. However, the present invention may be applied to a process that does not have an organic solvent processing (step S4 of FIG. 8, step S24 of FIG. 23). More specifically, the present invention may be applied to a substrate processing method including a chemical liquid processing step of processing a substrate using a chemical liquid, a rinse processing step of thereafter replacing the chemical liquid on the substrate by a rinse liquid (DIW, etc.), and a rinse liquid removing step of thereafter removing the rinse liquid, on the substrate, off the substrate. In this case, in accordance with a preferred embodiment described above, the first moving nozzle 11 is used in the rinse liquid removing step to form the parallel gas stream 86 above the substrate by the inert gas that is radially discharged from the parallel stream discharge port 82, to form the linear gas stream 85 by discharge of inert gas perpendicularly toward the center of the substrate from the linear stream discharge port 81, and to form the inclined gas streams 87 and 88 by radial discharges of inert gases in outwardly oblique directions with respect to the upper surface of the substrate from inclined stream discharge ports 83 and 84. The gradual increase of the inert gas flow rate, the movement of the discharge target position by raising of the first moving nozzle 11, etc., may also be applied where suitable in accordance with the preferred embodiment described above.

2. With preferred embodiments described above, the structure of a fluid nozzle (first moving nozzle 11) that includes just a single parallel stream discharge port 82 has been illustrated. However, two or more parallel stream discharge ports may be provided instead. In this case, a plurality of independent fluid passages may be defined in the fluid nozzle in correspondence to the respective parallel stream discharge ports or a fluid passage shared by a plurality (at least two) of the parallel stream discharge ports may be defined.

3. With preferred embodiments described above, the structure of a fluid nozzle (first moving nozzle 11) that includes one or two of the inclined stream discharge ports 83 and 84 has been illustrated. However, three or more inclined stream discharge ports may be provided instead. Also, a fluid nozzle not including an inclined stream discharge port but including the linear discharge port 81 and the parallel stream discharge port 82 may be applied to the substrate processing method or substrate processing apparatus according to the present invention. Further, a fluid nozzle not including a linear discharge port but including at least one parallel stream discharge port and at least one inclined stream discharge port may be applied to the substrate processing method or substrate processing apparatus according to the present invention.

4. With preferred embodiments described above, the structure of a fluid nozzle (first moving nozzle 11) that includes the central discharge port 71 that discharges an organic solvent as a processing liquid has been illustrated. However, a fluid nozzle not having a function of discharging a processing liquid may be used and the discharge of processing liquid may be performed by another nozzle.

5. With preferred embodiments described above, the temperature maintaining step T4 of making the heating surface 6a of the heater unit 6 separate from the lower surface of the substrate W is provided before the hole opening step T5 of rectilinearly discharging an inert gas from the linear stream discharge port 81. The temperature maintaining step T4 may be omitted, and after raising the temperature of the substrate W by the lifting puddle step T3, the hole opening step T5 may be executed in succession to the lifting puddle step T3.

6. With preferred embodiment described above, the discharge of inert gas from each of the inclined stream discharge ports 83 and 84 is sustained in the spin drying step T8. However, the discharge of inert gas from each of the inclined stream discharge ports 83 and 84 may be stopped in the spin drying step T8 instead. Also with preferred embodiments described above, the discharge of inert gas from the linear stream discharge port 81 is stopped when the hole spreading step T6 is ended. However, the discharge of inert gas from the linear stream discharge port 81 may instead be sustained until the outer periphery liquid dropping step T7 or may be sustained until the spin drying step T8.

7. An example where the discharge of inert gas from the inclined stream discharge port 83 is started in the outer periphery liquid dropping step T7 is shown in FIGS. 9A and 9B. However, the discharge of inert gas from the inclined stream discharge port 83 may instead be started from the middle of the hole spreading step T6. More specifically, the discharge of inert gas from the inclined stream discharge port 83 is preferably started at a timing at which (or more preferably at a timing immediately after) the peripheral edge of the hole in the liquid film reaches the discharge target position.

8. An example where the inert gas discharge from the first inclined stream discharge port 83 is sustained even after the start of inert gas discharge from the second inclined stream discharge port 84 is illustrated in FIGS. 17A and 17B. However, the discharge of inert gas from the first inclined stream discharge port 83 may be stopped after the start of inert gas discharge from the second inclined stream discharge port 84.

9. An arrangement with which the position of the peripheral edge of the hole formed in the liquid film is specified using the image taking unit 140 is illustrated in FIG. 18. However, an arrangement may instead be adopted where, for example, an appropriate sensor, such as an ultrasonic sensor, etc., is used to directly detect the position of the liquid film formed on the substrate W, may be adopted instead of using the image taking unit 140.

10. Besides nitrogen gas, another inert gas, such as cleaned air, etc., may be used as the inert gas.

11. The substrate that is the object of processing is not required to be circular and may be a rectangular substrate.

12. As examples of an organic solvent other than IPA that may be used in the methods illustrated with the first preferred embodiment, etc., methanol, ethanol, acetone, and HEF (hydrofluoroether) can be cited. All of these are organic solvents that are lower in surface tension than water (DIW). The present invention is also applicable to processing liquids other than organic solvents. For example, the present invention may be applied to remove a rinse liquid, such as water, etc., off a substrate. As examples of a rinse liquid other than water, carbonated water, electrolyzed ion water, ozone water, aqueous hydrochloric acid solution of dilute concentration (of, for example, approximately 10 to 100 ppm), or reduced water (hydrogen water), etc., can be cited.

13. In the hole opening step T5 or T15, an inert gas that is higher in temperature than room temperature (for example, 25° C.) may be used. In this case, the temperature difference between the upper and lower surfaces of the substrate W when the inert gas reaches the substrate W can be lessened. High-temperature inert gas discharge for the hole opening step T5 or T15 may thus be performed with the heater unit 6 being kept in contact with the lower surface of the substrate W. The closer the temperature of the inert gas is to the temperature of the substrate W, the more preferable.

14. Although with each of the preferred embodiments described above, the gradual deceleration of rotation of the substrate W in the organic solvent puddle step T2 or T12 is performed in stepwise manner, the rotation may be decelerated continuously instead. For example, the state in which the liquid film 150 covers the entire upper surface of the substrate W can be maintained by decelerating the rotational speed continuously (for example, rectilinearly) from 300 rpm to 0 rpm over a period of not less than 10 seconds.

15. In decelerating the rotation of the substrate W in the organic solvent puddle step T2 or T12, the flow rate of the organic solvent discharged from the first moving nozzle 11 may be increased (flow rate increased decelerating step). In this case, the deceleration of the rotation of the substrate W may be performed in a step-like manner or may be performed gradually as in the preferred embodiments described above. By increasing the supply flow rate of the organic solvent, lack of liquid at the outer peripheral region of the upper surface of the substrate W is made unlikely to occur and therefore the rotation of the substrate W can be decelerated and stopped promptly. The rotation of the substrate W can thereby be stopped in a short time to enable productivity to be improved.

16. With each of the preferred embodiments described above, the distance between the heater unit 6 and the substrate W is changed to increase or decrease the heat amount applied from the heater unit 6 to the substrate W. However, the heat amount applied to the substrate W may be increased or decreased by changing an output of the heater unit in place of or together with changing the positional relationship between the heater unit 6 and the substrate W.

17. With each of the preferred embodiments described above, the heater unit 6 is put in contact with the lower surface of the substrate W in forming the gas phase layer 152. However, if it is possible to form the gas phase layer 152 by radiant heat from the heater unit 6, the substrate heating for forming the gas phase layer 152 may be performed with the heater unit 6 being kept separated from the lower surface of the substrate W. However, influences of external disturbance, such as a change of ambient temperature, etc., can be suppressed more and the in-surface uniformity of heating can thus be made high if the heating surface 6*a* of the heater unit 6 is put in contact with the substrate W. Also, a heat amount, by which the heat of vaporization lost by evaporation of the organic solvent can be compensated to form and maintain the gas phase layer 152, must be applied to the substrate W. The substrate W can thus be heated efficiently, stably, and promptly by making the heating surface 6*a* contact the substrate W.

18. With each of the preferred embodiments described above, the substrate W is put in a stationary state, in which its rotation is stopped completely, from the middle of the organic solvent puddle step T2 or T12. Also, the stationary state of the substrate W is maintained throughout the lifting puddle step T3 or T13, the temperature maintaining step T4 or the nozzle switching step T14, and the hole opening step T5 or T15 that follow the organic solvent puddle step T2 or T12. However, as long as the liquid film of the organic solvent can continue to be maintained on the substrate W, the substrate does not have to be put in a stationary state and may be rotated at a low speed (for example, of approximately 10 rpm) that can be regarded to be equivalent to the stationary state in an entirety or a partial period of the period from the organic solvent puddle step T2 or T12 to the hole opening step T5 or T15. For example, the substrate W may be rotated at such a speed in the hole-opening step T5 or T15.

19. A rotating unit, constituted of an electric motor, etc., and arranged to rotate the heater unit 6 around the rotational axis A1, may further be included. In this case, the heater unit 6 can be rotated in synchronization with the rotation of the substrate W.

20. In the fourth preferred embodiment described above, while the first moving nozzle 11A includes the organic solvent nozzle 191, the supplying of inert gas for hole opening, etc., is performed from the second moving nozzle 12. However, for example, the first moving nozzle 11A may include, together with the organic solvent nozzle 191, a gas nozzle capable of discharging an inert gas toward the rotation center of the substrate W and the inert gas supplying for hole opening can be performed from the gas nozzle. The central gas discharge port 197 of the gas nozzle 192 described above discharges the gas stream that has been diffused by the punching plate 204 and is therefore not necessarily suited for executing the hole opening step. For executing the hole opening step, it is preferable to use a nozzle of a form capable of discharging a gas toward a narrower region, specifically, a tube nozzle, such as a straight pipe nozzle, double-fluid nozzle, etc.

21. The nozzle switching step may be omitted if a gas nozzle for the hole opening step is included together with the organic solvent nozzle 191 in the first moving nozzle 11A. Even in this case, it is preferable for the heater unit 6 to be separated from the lower surface of the substrate W at the instant the inert gas discharged from the gas nozzle for the hole opening step arrives at the liquid film 150.

Besides the feature described in the claims, the following features can be extracted from the present specification and the attached drawings. These features may be combined in any way with the features described in the SUMMARY OF THE INVENTION section.

A1. A substrate processing method including a liquid film forming step of supplying a processing liquid to an upper surface of a horizontally-held substrate to form a liquid film of the processing liquid covering an entire upper surface of the substrate, a gas phase layer forming step of heating the substrate to make the processing liquid in contact with the upper surface of the substrate evaporate to form a gas phase layer between the upper surface of the substrate and the processing liquid and maintain the liquid film on the gas phase layer, a hole opening step of blowing a gas at a first flow rate onto the liquid film on the substrate after the forming of the gas phase layer to partially remove the processing liquid to open a hole in the liquid film, a heating removing step of heating the substrate to spread the hole to an outer periphery of the substrate and move the liquid film on the gas phase layer to remove the processing liquid, constituting the liquid film, off the substrate, and a gas removing step of blowing a gas at a second flow rate greater than the first flow rate onto a region of a front surface of the substrate within the hole after the hole opening step to spread the hole to the outer periphery of the substrate and move the liquid film on the gas phase layer to remove the processing liquid, constituting the liquid film, off the substrate.

A2. The substrate processing method according to A1, wherein the substrate is put in a stationary state in the hole opening step.

A3. The substrate processing method according to A2, further including a rotational spinning-off step of rotating the substrate at an outer periphery spinning-off speed around a rotational axis extending along a vertical direction after the heating removing step to spin the processing liquid at an outer peripheral portion of the substrate off the substrate.

A4. The substrate processing method according to A3, further including a high-speed rotation drying step of rotating the substrate around the rotational axis at a drying speed higher than the outer periphery spinning-off speed after the rotational spinning-off step.

A5. The substrate processing method according to any one of A1 to A4, wherein the liquid film forming step includes a liquid supplying speed rotating step of rotating the substrate at a liquid supplying speed around a rotational axis extending along a vertical direction, a processing liquid supplying step of starting the supplying of the processing liquid onto the upper surface of the substrate during the liquid supplying speed rotating step to form the liquid film that covers the entire upper surface of the substrate, a decelerating step of decelerating the rotation of the substrate, during execution of the processing liquid supplying step, from the liquid supplying speed to stoppage while maintaining the state where the liquid film covers the entire upper surface of the substrate, and a supply stopping step of stopping the supplying of the processing liquid to the upper surface of the substrate after the decelerating step.

A6. The substrate processing method according to A5, wherein the decelerating step includes a gradual decelerating step of gradually decreasing the rotational speed of the substrate.

A7. The substrate processing method according to A6, wherein the gradual decelerating step includes a stepwise decelerating step of decelerating the rotational speed of the substrate stepwise.

A8. The substrate processing method according to A6, wherein the gradual decelerating step includes a continuous decelerating step of decelerating the rotational speed of the substrate continuously.

A9. The substrate processing method according to any one of A5 to A8, wherein the decelerating step includes a flow rate increased decelerating step of decelerating the rotational speed of the substrate in a state where a supply flow rate of the processing liquid is increased.

A10. The substrate processing method according to any one of A5 to A9, wherein the processing liquid supplying step is an organic solvent supplying step of supplying an organic solvent as the processing liquid, the method further includes a step of supplying a processing liquid other than the organic solvent to the upper surface of the substrate before the organic solvent supplying step, and the decelerating step is started after all of the other processing liquid on the substrate is replaced by the organic solvent.

A11. The substrate processing method according to any one of A1 to A10, wherein the gas phase layer forming step includes a heat amount increasing step of increasing a heat amount applied to the substrate, and the liquid film forming step includes a processing liquid supplying step of supplying a processing liquid to the upper surface of the substrate and a supply stopping step of stopping the supplying of the processing liquid after the start of the heat amount increasing step.

A12. The substrate processing method according to A11, further including a substrate preheating step of preheating the substrate at a heat amount less than that of the gas phase layer forming step, during the liquid film forming step wherein the heat amount increasing step is a step of increasing the heat amount applied to the substrate to be more than that in the substrate preheating step.

A13. The substrate processing method according to A12, wherein the substrate preheating step includes a step of disposing a heater unit at a separated position separated by a predetermined distance from a lower surface of the substrate and heating the substrate by radiant heat from the heater unit, and the heat amount increasing step includes a step of bringing the heater unit closer to the lower surface of the substrate than the separated position in the substrate preheating step.

A14. The substrate processing method according to A13, wherein the heat amount increasing step includes a step of bringing the heater unit in contact with the lower surface of the substrate.

A15. The substrate processing method according to anyone of A1 to A14, wherein the hole opening step is executed after the supplying of the processing liquid to the upper surface of the substrate is stopped.

A16. The substrate processing method according to any one of A1 to A15, wherein the gas phase layer forming step includes a heat amount increasing step of increasing the heat amount applied to the substrate and a heat amount decreasing step of decreasing the heat amount applied to the substrate after the heat amount increasing step, the heating removing step includes a heat amount re-increasing step of increasing the heat amount applied to the substrate again after the heat amount decreasing step, and the hole opening step is started in a state where the heat amount applied to the substrate has been decreased by the heat amount decreasing step.

A17. The substrate processing method according to A16, wherein the start of the hole opening step and the start of the heat amount re-increasing step are substantially simultaneous.

A18. The substrate processing method according to any one of A1 to A17, wherein the hole opening step includes a step of blowing on a gas of higher temperature than room temperature.

A19. The substrate processing method according to anyone of A1 to A18, wherein the processing liquid is an organic solvent.

A20. A substrate processing apparatus including
a substrate holding unit (5) that holds a substrate horizontally,
a processing liquid supplying unit (35) that supplies a processing liquid to an upper surface of the substrate held by the substrate holding unit to form a liquid film of the processing liquid that covers an entire upper surface of the substrate,
a heating unit (6) that heats the substrate, held by the substrate holding unit, at a temperature not less than a boiling point of the processing liquid in a state where the entire upper surface of the substrate is covered by the liquid film of the processing liquid to make the processing liquid evaporate and forma gas phase layer between the liquid film of the processing liquid and the upper surface of the substrate,
a gas blowing-on unit (36A) that blows a gas onto the processing liquid on the substrate, and
a control unit (3) that is programmed to execute a hole opening step of blowing the gas at a first flow rate from the gas blowing-on unit onto the liquid film of the processing liquid supported by the gas phase layer on the substrate to open a hole in the liquid film, a heating removing step of heating the substrate by means of the heating unit to spread the hole to an outer periphery of the substrate to move the liquid film on the gas phase layer and remove the processing liquid off the substrate, and a gas removing step of blowing the gas at a second flow rate, greater than the first flow rate, from the gas blowing-on unit onto a region inside the hole to spread the hole to the outer periphery of the substrate and thereby remove the processing liquid off the substrate. The numbers within parenthesis express the reference symbols of the corresponding components in the preferred embodiments described above. The same applies hereinafter.

A21. The substrate processing apparatus according to A20, further including a substrate rotating unit (23) that rotates the substrate, held by the substrate holding unit, around a rotational axis extending along a vertical direction,
wherein the control unit is further programmed to execute a rotational spinning-off step of rotating the substrate at an outer periphery spinning-off speed by means of the substrate rotating unit after the heating removing step to spin the processing liquid at an outer peripheral portion of the substrate off the substrate.

B1. A substrate processing method including
a liquid film forming step of forming a liquid film of a processing liquid covering an entire upper surface of a horizontally-held substrate,
a gas phase layer forming step of heating the substrate to make the processing liquid in contact with the upper surface of the substrate evaporate to form a gas phase layer between the upper surface of the substrate and the processing liquid and maintain the liquid film on the gas phase layer,
a liquid film moving step of making the liquid film move to an outer periphery of the substrate while maintaining the substrate in a stationary state after the gas phase layer is formed,
a rotational spinning-off step of rotating the substrate at a spinning-off speed around a vertical rotational axis after the liquid film moving step to spin off the liquid film, remaining on an outer peripheral portion of the substrate, by a centrifugal force, and
a drying step of rotating the substrate around the rotational axis at a drying rotational speed higher than the spinning-off speed after the rotational spinning-off step to dry the substrate.

B2. A substrate processing apparatus including
a substrate holding unit (5) that holds a substrate horizontally,
a substrate rotating unit (23) that rotates the substrate, held by the substrate holding unit, around a rotational axis extending along a vertical direction,
a processing liquid supplying unit (35) that supplies a processing liquid to an upper surface of the substrate held by the substrate holding unit to form a liquid film of the processing liquid that covers an entire upper surface of the substrate,
a heating unit (6) that heats the substrate, held by the substrate holding unit, at a temperature not less than a boiling point of the processing liquid in a state where the entire upper surface of the substrate is covered by the liquid film of the processing liquid to make the processing liquid evaporate and form a gas phase layer between the liquid film of the processing liquid and the upper surface of the substrate, and
a control unit (3) that is programmed to control the substrate holding unit, the substrate rotating unit, the processing liquid supplying unit, and the heating unit to execute the substrate processing method according to B1.

C1. A substrate processing method including
a liquid supplying speed rotating step of rotating a substrate in a horizontal orientation at a liquid supplying speed around a rotational axis extending along a vertical direction,
a liquid film forming step of starting a supplying of a processing liquid to an upper surface of the substrate during the supplying speed rotating step to form a liquid film of the processing liquid covering an entire upper surface of the substrate,
a decelerating step of decelerating the rotation of the substrate, during execution of the liquid film forming step, from the liquid supplying speed to stoppage while maintaining the liquid film of the processing liquid,
a supply stopping step of stopping the supplying of the processing liquid to the upper surface of the substrate after the decelerating step,
a gas phase layer forming step of heating the substrate after the supplying stopping step to make the processing liquid in contact with the upper surface of the substrate evaporate to form a gas phase layer between the upper surface of the substrate and the processing liquid and maintain the liquid film on the gas phase layer, and
a liquid film moving step of making the liquid film move to an outer periphery of the substrate after the gas phase layer is formed.

C2. The substrate processing method according to C1, wherein the decelerating step includes a gradual decelerating step of gradually decreasing the rotational speed of the substrate.

C3. The substrate processing method according to C2, wherein the gradual decelerating step includes a stepwise decelerating step of decelerating the rotational speed of the substrate stepwise.

C4. The substrate processing method according to C2, wherein the gradual decelerating step includes a continuous decelerating step of decelerating the rotational speed of the substrate continuously.

C5. The substrate processing method according to any one of C1 to C4, wherein the decelerating step includes a flow rate increased decelerating step of decelerating the rotation speed of the substrate in a state where a supply flow rate of the processing liquid is increased.

C6. The substrate processing method according to any one of C1 to C5, wherein the liquid film forming step is an organic solvent supplying step of supplying an organic solvent as the processing liquid, the method further includes a step of supplying a processing liquid other than the organic solvent to the upper surface of the substrate before the organic solvent supplying step, and the decelerating step is started after all of the other processing liquid on the substrate is replaced by the organic solvent.

C7. The substrate processing method according to any one of C1 to C6, further including a substrate preheating step of preheating the substrate at a heat amount less than that of the gas phase layer forming step during the liquid film forming step, wherein the gas phase layer forming step includes a heat amount increasing step of increasing the heat amount applied to the substrate to be more than that in the substrate preheating step.

C8. The substrate processing method according to C7, wherein the substrate preheating step includes a step of disposing a heater unit at a separated position separated by a predetermined distance from a lower surface of the substrate and heating the substrate by radiant heat from the heater unit, and the heat amount increasing step includes a step of bringing the heater unit closer to the lower surface of the substrate than the separated position in the substrate preheating step.

C9. The substrate processing method according to C8, wherein the heat amount increasing step includes a step of bringing the heater unit into contact with the lower surface of the substrate.

C10. A substrate processing apparatus including a substrate holding unit that holds a substrate horizontally, a substrate rotating unit that rotates the substrate, held by the substrate holding unit, around a rotational axis extending along a vertical direction, a processing liquid supplying unit that supplies a processing liquid to an upper surface of the substrate held by the substrate holding unit to form a liquid film of the processing liquid that covers an entire upper surface of the substrate, a heating unit that heats the substrate, held by the substrate holding unit, at a temperature not less than a boiling point of the processing liquid in a state where the entire upper surface of the substrate is covered by the liquid film of the processing liquid to make the processing liquid evaporate and form a gas phase layer between the liquid film of the processing liquid and the upper surface of the substrate, and a control unit that is programmed to control the substrate holding unit, the substrate rotating unit, the processing liquid supplying unit, and the heating unit to execute the substrate processing method according to any one of C1 to C9.

D1. A substrate processing method including a liquid film forming step of supplying a processing liquid to an upper surface of a horizontally-held substrate to form a liquid film of the processing liquid covering an entire upper surface of the substrate, a gas phase layer forming step of heating the substrate to make the processing liquid in contact with the upper surface of the substrate evaporate to form a gas phase layer between the upper surface of the substrate and the processing liquid and maintain the liquid film on the gas phase layer, the gas phase layer forming step including a heat amount increasing step of increasing a heat amount applied to the substrate while maintaining the supplying of the processing liquid after the liquid film of the processing liquid is formed on the upper surface of the substrate and a supply stopping step of stopping the supplying of the processing liquid after the start of the heat amount increasing step, and a liquid film moving step of moving the liquid film to an outer periphery of the substrate after the gas phase layer is formed.

D2. The substrate processing method according to D1, further including a substrate preheating step of preheating the substrate at a heat amount less than that of the gas phase layer forming step during the liquid film forming step, wherein the heat amount increasing step is a step of increasing the heat amount applied to the substrate to be more than that in the substrate preheating step.

D3. The substrate processing method according to D2, wherein the substrate preheating step includes a step of disposing a heater unit at a separated position separated by a predetermined distance from a lower surface of the substrate and heating the substrate by radiant heat from the heater unit, and the heat amount increasing step includes a step of bringing the heater unit closer to the lower surface of the substrate than the separated position in the substrate preheating step.

D4. The substrate processing method according to D3, wherein the heat amount increasing step includes a step of bringing the heater unit into contact with the lower surface of the substrate.

D5. The substrate processing method according to D3 or D4, wherein the gas phase layer forming step includes a step of making the heater unit contact the lower surface of the substrate for a predetermined time.

D6. A substrate processing apparatus including a substrate holding unit that holds a substrate horizontally, a processing liquid supplying unit that supplies a processing liquid to an upper surface of the substrate held by the substrate holding unit to form a liquid film of the processing liquid that covers an entire upper surface of the substrate, a heating unit that heats the substrate, held by the substrate holding unit, at a temperature not less than a boiling point of the processing liquid in a state where the entire upper surface of the substrate is covered by the liquid film of the processing liquid to make the processing liquid evaporate and form a gas phase layer between the liquid film of the processing liquid and the upper surface of the substrate, and a control unit that is programmed to control the substrate holding unit, the processing liquid supplying unit, and the heating unit to execute the substrate processing method according to any one of D1 to D5.

E1. A substrate processing method including a liquid film forming step of forming a liquid film of a processing liquid covering an entire upper surface of a horizontally-held substrate, a gas phase layer forming step of heating the substrate to make the processing liquid in contact with the upper surface of the substrate evaporate to form a gas phase layer between the upper surface of the substrate and the processing liquid and maintain the liquid film on the gas phase layer, a liquid film moving step of making the liquid film move to an outer periphery of the substrate while maintaining the substrate in a stationary state after the gas phase layer is formed, a rotational spinning-off step of rotating the substrate at a spinning-off speed around a vertical rotational axis after the liquid film moving step to spin off the liquid film, remaining on an outer peripheral portion of the substrate, by a centrifugal force, and a drying step of rotating the substrate around the rotational axis at a drying rotational speed higher than the spinning-off speed after the rotational spinning-off step to dry the substrate.

E2. A substrate processing apparatus including a substrate holding unit that holds a substrate horizontally, a substrate rotating unit that rotates the substrate, held by the substrate holding unit, around a rotational axis extending along a vertical direction, a processing liquid supplying unit that supplies a processing liquid to an upper surface of the substrate held by the substrate holding unit to form a liquid film of the processing liquid that covers an entire upper surface of the substrate, a heating unit that heats the substrate, held by the substrate holding unit, at a temperature not less than a boiling point of the processing liquid in a state where the entire upper surface of the substrate is covered by the liquid film of the processing liquid to make the processing liquid evaporate and forma gas phase layer between the liquid film of the processing liquid and the upper surface of the substrate, and a control unit that is programmed to control the substrate holding unit, the substrate rotating unit, the processing liquid supplying unit, and the heating unit to execute the substrate processing method according to E1.

F1. A substrate processing apparatus including a spin base rotatable around a vertical rotational axis, a chuck member disposed on the spin base, displaceable to a closed state of holding a substrate and to an open state of releasing the substrate, and configured to hold the substrate in a horizontal orientation, a chuck member driving unit that drives the chuck member to the closed state and to the open state, a heater unit disposed above the spin base in a manner enabling being raised and lowered, having a heating surface facing substantially an entirety of a lower surface of the substrate including a central region and a peripheral edge region, and configured to heat the substrate from the lower surface side, and a raising/lowering unit that raises and lowers the heater unit, wherein the chuck member includes a gripping portion, which contacts a peripheral end surface of the surface to grip the substrate in the closed state and separates from the peripheral end surface of the substrate in the open state, and a supporting portion that, faces a lower surface of a peripheral edge portion of the substrate to support the substrate from the lower surface at least in the open state, and in a plan view as viewed along the rotational axis, the supporting portion has a side surface that is separated toward an outer side from a peripheral edge of the heating surface of the heater unit in both the closed state and the open state, and the chuck member is arranged so that the heater unit can be raised and lowered with the heating surface being passed by an inner side of the side surface in both the closed state and the open state.

F2. The substrate processing apparatus according to F1, wherein in a plan view as viewed along the rotational axis, the chuck member is arranged so that the heater unit can be raised and lowered with the heating surface being passed by an inner side of the gripping portion in both the open state and the closed state.

The present application corresponds to Japanese Patent Application No. 2015-011710 filed on Jan. 23, 2015 in the Japan Patent Office and Japanese Patent Application No. 2015-039025 filed on Feb. 27, 2015 in the Japan Patent Office, and the entire disclosures of these applications are incorporated herein by reference.

While preferred embodiments of the present invention have been described in detail above, these are merely specific examples used to clarify the technical contents of the present invention, and the present invention should not be interpreted as being limited only to these specific examples, and the spirit and scope of the present invention shall be limited only by the appended claims.

What is claimed is:

1. A substrate processing method comprising:
   a substrate holding step of holding a substrate in a horizontal orientation by means of a substrate holding unit;
   a liquid film forming step of supplying a processing liquid to an upper surface of the substrate held by the substrate holding unit to form a liquid film;
   an upper surface covering step of discharging, above the liquid film formed on the upper surface of the substrate held by the substrate holding unit, an inert gas radially and parallel to the upper surface of the substrate from a center toward a peripheral edge of the substrate to form an inert gas stream flowing parallel to the upper surface of the substrate and covering the upper surface of the substrate; and
   a liquid film removing step of discharging an inert gas toward the upper surface of the substrate to remove the liquid film, formed by the liquid film forming step, from the upper surface of the substrate during a time period in which the upper surface covering step is performed;
   wherein the liquid film removing step includes
   a perpendicular gas discharging step of rectilinearly discharging the inert gas perpendicular to the upper surface toward the center of the substrate so as to form a hole at a center of the liquid film and to spread the hole, and
   an oblique gas discharging step of radially discharging the inert gas in an outwardly-directed oblique direction with respect to the upper surface of the substrate toward an intermediate position between the center and the peripheral edge of the substrate upper surface as a discharge target position, thereby generating an outwardly-directed oblique direction inert gas flow that further spreads the hole of the liquid film to push away the liquid film to the outer side of the substrate,
   wherein, in the oblique gas discharging step, the inert gas is discharged toward a periphery of a central axis which extends perpendicular to the upper surface of the substrate, along a conical surface that is inclined with respect to the axis, to form the outwardly-directed oblique direction inert gas discharge having a conical profile that is obliquely incident on the upper surface of the substrate.

2. The substrate processing method according to claim 1, wherein the perpendicular gas discharging step includes a perpendicular gas flow rate increasing step of gradually increasing a flow rate of the inert gas that is discharged perpendicular to the upper surface toward the center of the substrate.

3. The substrate processing method according to claim 1, wherein the oblique gas discharging step is started at a timing at which a peripheral edge of the hole formed by the perpendicular gas discharging step at the center of the liquid film reaches the discharge target position.

4. The substrate processing method according to claim 1, wherein the oblique gas discharging step includes an oblique gas flow rate increasing step of gradually increasing the flow rate of the inert gas discharged obliquely toward the discharge target position.

5. The substrate processing method according to claim 4, wherein the oblique gas discharging step includes a discharge target position moving step of gradually moving the discharge target position to the peripheral edge of the upper surface of the substrate.

6. The substrate processing method according to claim 5, wherein the discharge target position moving step includes a step of making an inclined stream discharge port, discharging the inert gas in an outwardly-directed oblique direction with respect to the upper surface of the substrate, rise with respect to the upper surface of the substrate.

7. The substrate processing method according to claim 1, wherein the oblique gas discharging step includes a step of radially discharging the inert gas from a first inclined stream discharge port in an outwardly-directed oblique direction with respect to the upper surface of the substrate toward a first discharge target position between the center of the substrate and the peripheral edge of the upper surface of the substrate and a step of discharging the inert gas from a second inclined stream discharge port in an outwardly-directed oblique direction with respect to the upper surface of the substrate toward a second discharge target position between the first discharge target position and the peripheral edge.

8. The substrate processing method according to claim 1, further comprising: a peripheral edge position detecting step of detecting a position of a peripheral edge of the hole of the liquid film,
wherein the liquid film removing step includes a step of controlling the discharge of inert gas in accordance with a result of detection by the peripheral edge detecting step.

9. The substrate processing method according to claim 1, wherein the upper surface covering step is started before the start of the liquid film forming step.

10. The substrate processing method according to claim 1, further comprising a gas phase layer forming step of heating, in parallel with the upper surface covering step, the substrate to make a portion of the processing liquid in contact with the upper surface of the substrate evaporate to form a gas phase layer between the upper surface of the substrate and the processing liquid and to maintain the liquid film on the gas phase layer,
wherein the perpendicular gas discharging step includes
a hole opening step of blowing a gas at a first flow rate onto the liquid film on the substrate after the forming of the gas phase layer to partially remove the processing liquid to open the hole in the liquid film,
one removing step of heating the substrate so as to spread the hole to an outer periphery of the substrate and move the liquid film on the gas phase layer to remove the processing liquid constituting the liquid film off the substrate, and
another removing step of blowing a gas at a second flow rate greater than the first flow rate onto a region of a front surface of the substrate within the hole after the hole opening step so as to spread the hole to the outer periphery of the substrate and move the liquid film on the gas phase layer to remove the processing liquid constituting the liquid film off the substrate.

11. The substrate processing method according to claim 10, wherein the substrate is put in a stationary state in the hole opening step.

12. The substrate processing method according to claim 11, further comprising: a rotational spinning-off step of rotating the substrate at an outer periphery spinning-off speed around a rotational axis extending along a vertical direction after the one removing step so as to spin the processing liquid at an outer peripheral portion of the substrate off the substrate.

13. The substrate processing method according to claim 12, further comprising: a high-speed rotation drying step of rotating the substrate around the rotational axis at a drying speed higher than the outer periphery spinning-off speed after the rotational spinning-off step.

14. The substrate processing method according to claim 10, wherein the gas phase layer forming step includes a heat amount increasing step of increasing a heat amount applied to the substrate, and
the liquid film forming step includes a processing liquid supplying step of supplying the processing liquid to the upper surface of the substrate and a supply stopping step of stopping the supplying of the processing liquid after the start of the heat amount increasing step.

15. The substrate processing method according to claim 14, further comprising a substrate preheating step of preheating the substrate at a heat amount less than that of the gas phase layer forming step during the liquid film forming step, wherein
the heat amount increasing step is a step of increasing the heat amount applied to the substrate to be more than that in the substrate preheating step.

16. The substrate processing method according to claim 15, wherein the substrate preheating step includes a step of disposing a heater unit at a separated position separated by a predetermined distance from a lower surface of the substrate and heating the substrate by radiant heat from the heater unit, and
the heat amount increasing step includes a step of bringing the heater unit closer to the lower surface of the substrate than the separated position in the substrate preheating step.

17. The substrate processing method according to claim 16, wherein the heat amount increasing step includes a step of bringing the heater unit into contact with the lower surface of the substrate.

18. The substrate processing method according to claim 10, wherein the hole opening step is executed after the supplying of the processing liquid to the upper surface of the substrate is stopped.

19. The substrate processing method according to claim 10, wherein the gas phase layer forming step includes a heat amount increasing step of increasing the heat amount applied to the substrate and a heat amount decreasing step of decreasing the heat amount applied to the substrate after the heat amount increasing step, the one removing step includes a heat amount re-increasing step of increasing the heat amount applied to the substrate again after the heat amount decreasing step, and the hole opening step is started in a state where the heat amount applied to the substrate has been decreased by the heat amount decreasing step.

20. The substrate processing method according to claim 1, further comprising the step of holding a nozzle fixed with respect to the central axis during the liquid film removing step.

21. The substrate processing method according to claim 20, wherein the nozzle is spaced by a predetermined distance away from the central axis during the liquid film removing step.

22. The substrate processing method according to claim 20, wherein the nozzle has a discharge port extending 360° around the nozzle.

23. The substrate processing method according to claim 1, wherein the perpendicular gas discharging step is performed while the substrate is put in a stationary state, the oblique gas discharging step is performed while the substrate is rotated at an outer periphery spinning-off speed around a rotational axis extending along a vertical direction so as to spin the processing liquid at an outer peripheral portion of the substrate off the substrate, and the method further comprises a high-speed rotation drying step of accelerating the rotation speed of the substrate from the outer periphery spinning-off speed to a drying speed which is higher than the outer periphery spinning-off speed after the processing liquid at the outer peripheral portion of the substrate is spun off by the rotation of the substrate at the outer periphery spinning-off speed.

24. The substrate processing method according to claim 1, further comprising a gas phase layer forming step of heating, in parallel with the upper surface covering step, the substrate to make a portion of the processing liquid in contact with the upper surface of the substrate evaporate to form a gas phase layer between the upper surface of the substrate and the processing liquid and to maintain the liquid film on the gas phase layer, wherein the perpendicular gas discharging step rectilinearly discharges the inert gas perpendicular to the upper surface toward the center of the substrate so as to form the hole at the center of the liquid film maintained on the gas phase layer and covering the upper surface of the substrate entirely, and to spread the hole of the liquid film maintained on the gas phase layer.

\* \* \* \* \*